(12) United States Patent
Yamazaki et al.

(10) Patent No.: US 6,369,410 B1
(45) Date of Patent: Apr. 9, 2002

(54) SEMICONDUCTOR DEVICE AND METHOD OF MANUFACTURING THE SEMICONDUCTOR DEVICE

(75) Inventors: Shunpei Yamazaki, Tokyo; Hisashi Ohtani, Kanagawa; Etsuko Fujimoto, Kanagawa; Takeshi Fukunaga, Kanagawa; Hiroki Adachi, Kanagawa; Hideto Ohnuma, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/210,781

(22) Filed: Dec. 15, 1998

(30) Foreign Application Priority Data

Dec. 15, 1997 (JP) ............................... 9-363444
Mar. 13, 1998 (JP) ............................. 10-082947
Mar. 13, 1998 (JP) ............................. 10-082948
Mar. 13, 1998 (JP) ............................. 10-082949

(51) Int. Cl.[7] ........................ H01L 29/49; H01L 29/786
(52) U.S. Cl. .................... 257/72; 257/751; 257/412; 345/92
(58) Field of Search ..................... 257/72, 751, 412, 257/761, 765, 766, 767; 345/92

(56) References Cited

U.S. PATENT DOCUMENTS 5,430,320 A * 7/1995 Lee ..................... 257/900
5,973,378 A    10/1999 Ohtani
6,144,082 A    11/2000 Yamazaki et al.
6,160,270 A *  12/2000 Holmberg ................ 257/72

FOREIGN PATENT DOCUMENTS

| JP | 06-232059 | 8/1994 |
| JP | 07-130652 | 5/1995 |
| JP | 07-135318 | 5/1995 |
| JP | 07-321339 | 12/1995 |
| JP | 08-15686  | 1/1996 |
| JP | 08-78329  | 3/1996 |
| JP | 08-330602 | 12/1996 |
| JP | 08-335152 | 12/1996 |

* cited by examiner

Primary Examiner—Jerome Jackson, Jr.
(74) Attorney, Agent, or Firm—Eric J. Robinson; Nixon Peabody LLP

(57) ABSTRACT

A TFT using an aluminum material for a gate electrode is manufactured at a high yield factor. The gate electrode provided over an active layer and a gate insulating film is constituted by a lamination film of a tantalum layer and an aluminum layer. In this structure, the tantalum layer functions as a stopper, so that it is possible to prevent a constituent material of the aluminum layer from intruding into the gate insulating film. An end portion of the tantalum layer is transformed into tantalum oxide, which has an effect to lower damage at ion implantation to the gate insulating film in the formation of an LDD region.

34 Claims, 31 Drawing Sheets

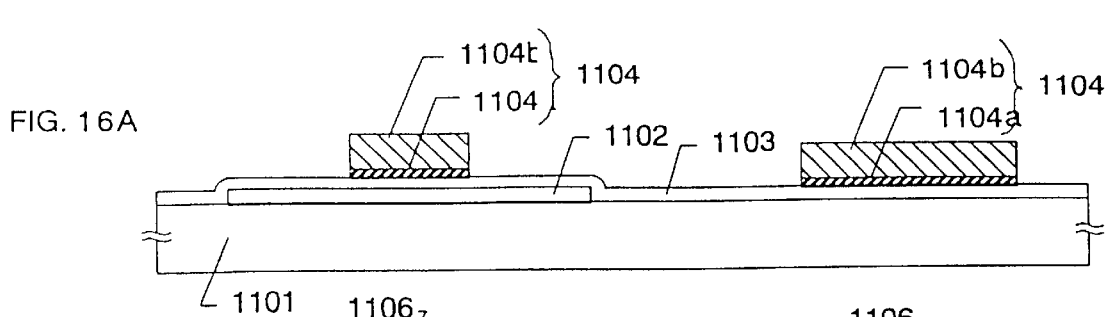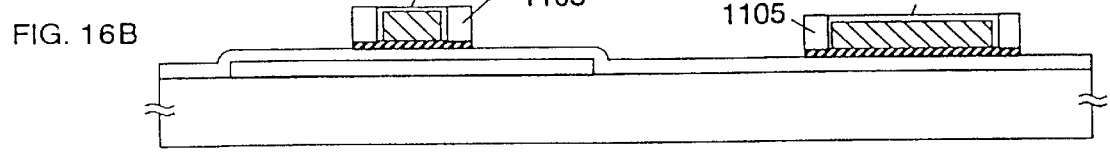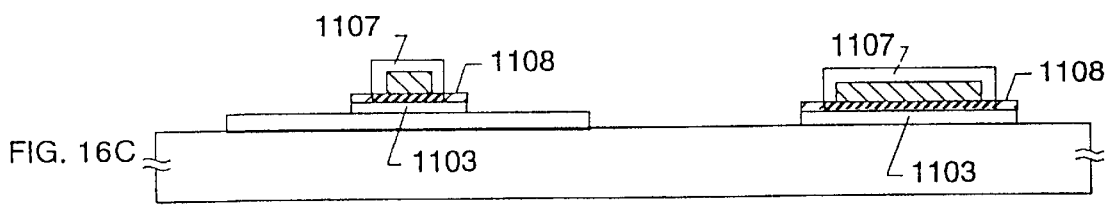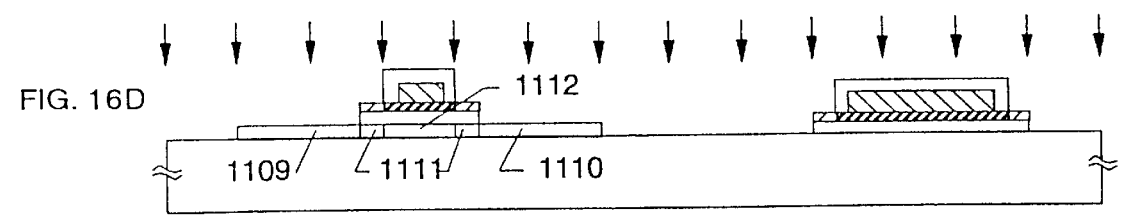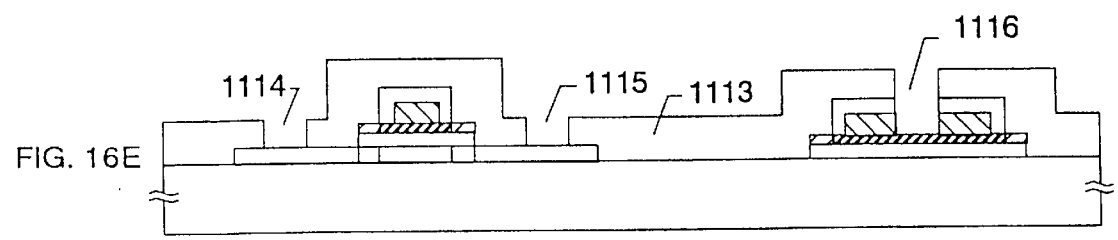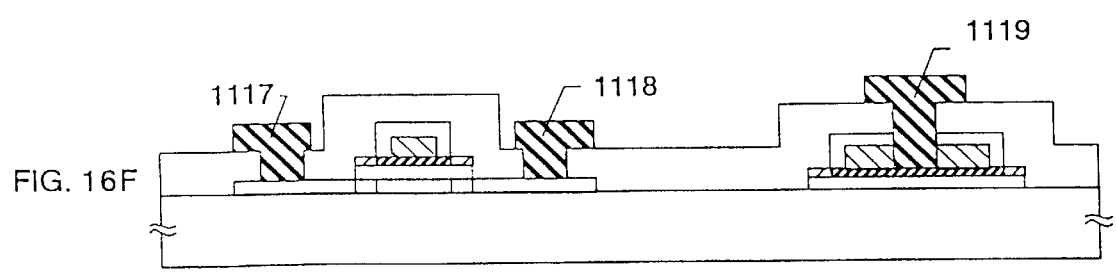

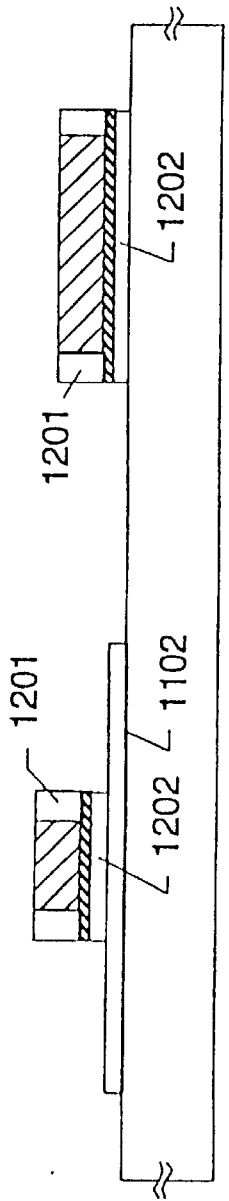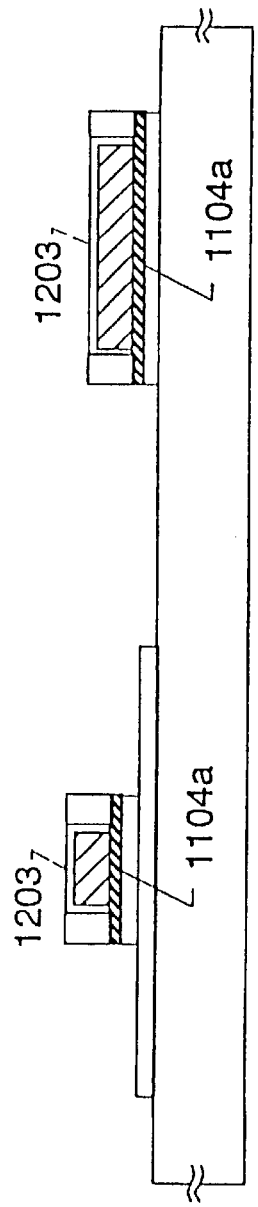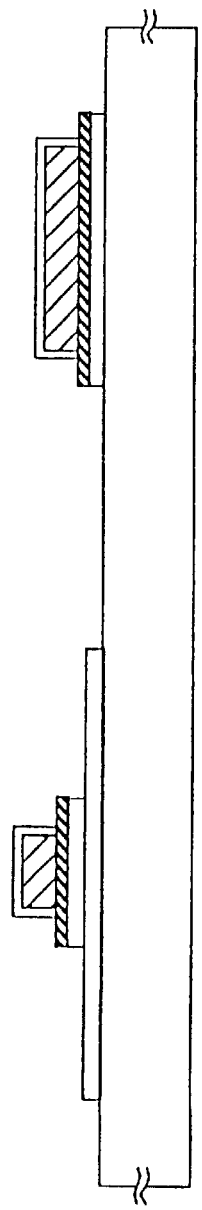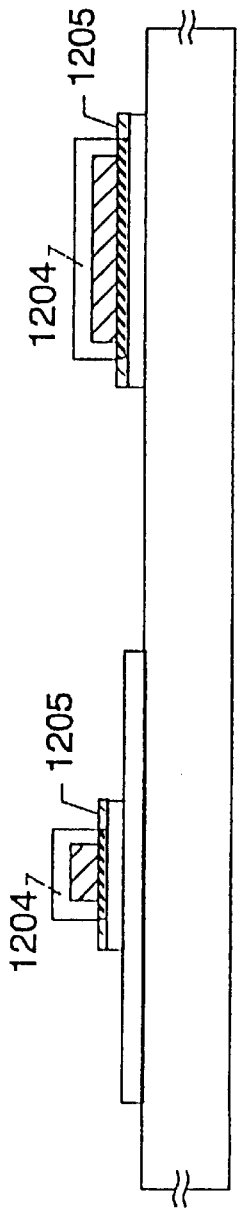

LPCVD Silicon Film

Al single layer (Ta = 0 nm)

PCVD Silicon Film

Al single layer (Ta = 0 nm)

LPCVD Silicon Film

Al / Ta layer (Ta = 20 nm)

PCVD Silicon Film

Al / Ta layer (Ta = 20 nm)

LPCVD Silicon Film

Al / Ta layer (Ta = 50 nm)

PCVD Silicon Film

Al / Ta layer (Ta = 50 nm)

SEMICONDUCTOR DEVICE AND METHOD OF MANUFACTURING THE SEMICONDUCTOR DEVICE

BACKGROUND OF THE INVENTION

1. Field of the Invention

The present invention relates to the structure of a semiconductor device including a semiconductor circuit constituted by a plurality of insulated gate type transistors, such as thin film transistors using semiconductor thin films, and to a method of manufacturing the same. The semiconductor device of the present invention includes also an electronic equipment having a semiconductor circuit constituted by insulated gate type transistors, such as an active matrix type liquid crystal display device and an image sensor.

2. Description of the Related Art

In recent years, attention has been paid to an active matrix type liquid crystal display device (hereinafter abbreviated to AMLCD) in which a pixel matrix circuit and a driving circuit are constituted by TFTs formed on an insulating substrate.

As an insulating substrate, it is desired to use an inexpensive glass substrate rather than using an expensive substrate, such as a quartz substrate, from the industrial viewpoint.

Such AMLCDs include devices of various sizes from one with a size of about 0.5 to 2 inches for a projector to one with a size of about 10 to 20 inches for a note-sized personal computer, and are mainly used as displays from a small-sized one to a middle-sized one.

When the AMLCD is made middle-sized, the area of a pixel matrix circuit, which becomes a picture display portion, is increased. If it is required to increase the area of a liquid crystal display, the area of the pixel matrix circuit, which becomes the picture display portion, is also increased. With the increase of the area, the length of a source wiring line, a gate wiring line, and the like arranged in matrix become long, so that wiring resistance is increased. Further, because of the request for miniaturization, it is necessary to make the wiring line thin, so that the increase of the wiring resistance becomes more tangible. Moreover, with respect to the source wiring line and gate wiring line, since a TFT is connected to each of pixels and the number of pixels is increased, increase of parasitic capacitance also becomes a problem. In the liquid crystal display, a gate wiring line and a gate electrode are integrally formed in general, so that delay of a gate signal becomes tangible with the increase of the area of a panel.

Thus, a material mainly containing aluminum with low specific resistance is used for the gate wiring line. While the aluminum material has the merit of low resistance, the material has the demerit of poor heat resistance. When the gate wiring line and gate electrode are formed of a material containing aluminum as its main ingredient, a gate delay time can be made short and a high speed operation can be made.

For example, in Japanese Patent Unexamined Publication No. Hei. 7-135318 by the same assignee as this application, there is disclosed a TFT structure in which a thin film (also called aluminum alloy) containing aluminum as its main ingredient is used for a gate wiring line, and the periphery of the gate wiring line is protected by an anodic oxidation film (alumina film). No. Hei. 7-135318 in turn corresponds to U.S. Pat. No. 5,598,284. An entire disclosure of No. Hei. 7-135318 and U.S. Pat. No. 5,598,284 is incorporated herein by reference. The thin film containing aluminum as its main ingredient in the present specification includes also a thin film including an extremely small amount of impurity, such as a film of so-called high purity aluminum.

In the case where the TFT structure disclosed in the above publication is adopted, a step of etching an alumina film becomes necessary to connect a gate wiring line to a lead wiring line. At first, the present assignee used an etchant (a mixed solution of ammonium fluoride and hydrofluoric acid) called buffered hydrofluoric acid at etching of the alumina film.

However, buffered hydrofluoric acid has a small selection ratio of alumina (typically $Al_2O_3$) to aluminum, so that there is a problem that not only the alumina film but also the gate wiring line under the alumina film is etched. The state is shown in FIG. 30.

In FIG. 30, reference numeral 81 denotes a substrate having an insulating surface, 82 denotes an insulating film (functioning as a gate insulating film on an active layer) made of a silicon oxide film, 83 denotes a gate wiring line made of aluminum alloy, and 84 denotes an alumina (anodic oxidation) film obtained by anodic oxidation of the gate wiring line 83.

When part of the upper surface of the alumina film 84 is etched by buffered hydrofluoric acid, the gate wiring line 83 is first exposed. Normally, since etching is carried out with a distribution to some degree on the substrate surface, it becomes necessary to completely remove the alumina film 84 by overetching.

At this time, if overetching is excessively carried out, the gate wiring line 83 is etched by buffered hydrofluoric acid. In the worst case, there can occur a case where an etching hole 85 passes through the gate wiring line 83 and reaches the insulating film 82.

If such a state occurs, only the section of the gate wiring line 83 as indicated by 86 (thick line) comes in contact with a lead wiring line (not shown). When it is considered that while the diameter of a general contact hole is several microns, the thickness of a gate wiring line is several hundreds nm, in the state shown in FIG. 30, the contact area between the gate wiring line and the lead wiring line is reduced to about ¹⁄₁₀₀ of a normal area.

That is, if the state as shown in FIG. 30 occurs, the contact area between wiring lines is extremely reduced, so that electrical connection becomes almost impossible. Thus, it becomes impossible to operate the TFT and causes an erroneous operation of a circuit itself.

If there is such a structure that an active layer of a TFT exists under the insulating film 82 (for example, in the case where the contact between the gate electrode and lead wiring line is made over the TFT), it is possible that the lead wiring line is short-circuited to the active layer.

Then, the present applicant developed a process using a specific etchant instead of the foregoing buffered hydrofluoric acid. The etchant used by the present assignee is obtained by mixing a chromic acid solution of 550 grams (chromium of 300 grams, water of 250 grams) with a solution of 10 liters which is a mixture of phosphoric acid, nitric acid, acetic acid, and water mixed at a ratio of 85:5:5:5. The present assignee refers to this etchant as chromium mixed acid.

This chromium mixed solution has such selectivity that although an alumina film of an anodic oxidation film is etched, an aluminum film is not etched, and by using the property, it is possible to selectively etch only the alumina film.

Like this, in the present circumstances, a contact hole for connecting a gate electrode to a lead wiring line is formed by a specific etchant. This method has certainly a high yield factor and can realize an excellent ohmic contact.

However, in view of the fact that a large amount of heavy metal chromium, which has a possibility to damage a human body, is required to be used, the process of using chromium mixed acid is not desirable in industry. From such a reason, although development of a substitution etchant substituting chromium mixed acid has been hastened, in the present circumstances, such an etchant has not been found.

For a high speed operation, it is necessary to decrease the sheet resistance between source/drain regions and source/drain wiring lines connected to these regions. For the purpose of decreasing the resistance of the source/drain regions, silicide layers of refractory metal such as Ta or Ti are formed on the surfaces of the source/drain regions.

As an active layer of a TFT, it is considered to be promising to use a crystalline silicon film having mobility higher than that of an amorphous silicon film. Conventionally, in order to obtain the crystalline silicon film by a heat treatment, it is necessary to use a quartz substrate having a high distortion point.

Then the present applicant et al. developed a technique (Japanese Patent Unexamined Publication No. Hei. 6-232059 and No. Hei. 7-321339) to obtain a crystallized silicon film by introducing a very small amount of material into an amorphous silicon film and then carrying out a heat treatment. An entire disclosure of No. Hei. 6-232059 and No. Hei. 7-321339 is incorporated herein by reference. As a material for facilitating crystallization, a kind of or plural kinds of elements selected from Fe, Co, Ni, Ru, Rh, Pd, Os, Ir, Pt, Cu, and Au are used. By using this technique, it became possible to manufacture a crystalline silicon film through a process (low temperature process) at a temperature where a glass substrate can withstand.

However, this technique has a problem that a material used for crystallization remains in the crystalline silicon film, and the material has a bad influence on the component characteristics (especially, reliability, uniformity, and the like) of a TFT. Thus, the present applicant et al. further developed a technique (Japanese Patent Unexamined Publication No. Hei. 8-330602) to getter a material in the crystalline silicon film after formation of a wiring line using an aluminum material. An entire disclosure of No. Hei. 8-330602 is incorporated herein by reference.

However, in the above gettering technique, since the aluminum material having low heat resistance is used for the wiring line, a heat treatment is restricted within a temperature range (about 300 to 450° C.).

Since the above temperature range is low as a temperature at which the material in the crystalline silicon film is sufficiently guttered, a long treatment time is required. However, since the heat resistance of aluminum material is low, heating for a long time has been avoided. Even in a heat process in the temperature range (about 300 to 450° C.), aluminum atoms diffuse into a gate insulating film and reach a channel formation region, so that the atoms have caused a bad operation of a TFT or lowering of TFT characteristics.

Similarly, even in the heating treatment within the above temperature range, protrusions, such as hillocks or whiskers, produced from the aluminum material by the heat treatment go through the gate insulating film and reach the channel formation region, so that they have caused a bad operation of the TFT.

In addition, similarly, even in the heating treatment within the above temperature range, there exists a pinhole in the gate insulating film, so that aluminum atoms have flown at the heat treatment, entered the pinhole, and reached the channel formation region.

Like this, as the result that the present inventors et al. analyzed the malfunction of the TFT which had produced a bad operation, it was found that there was a possibility that a short circuit took place between the gate electrode and the channel.

It is inferred that the gate electrode and the channel are short-circuited by some reason although they are insulated from each other by the gate insulating film, so that the TFT causes the bad operation. The following three factors are conceivable for this.

(1) Aluminum atoms diffuse into the gate insulating film, and reach the channel which is in contact with the gate electrode through the gate insulting film.

(2) Protrusions produced from the aluminum material, such as hillocks or whiskers, go through the gate insulating film and reach the channel.

(3) There exists a pinhole in the gate insulating film, so that aluminum atoms flow at the heat treatment, enter the pinhole, and reach the channel.

Although the above described factors are conceivable, a definite mechanism is not clear in the present circumstances. However, it is almost certain that a short circuit between the gate electrode and the channel is the cause, and there is a high possibility that any one of the above three factors is the cause.

SUMMARY OF THE INVENTION

An object of the present invention is to provide a technique to realize a TFT, which uses an aluminum material as a gate electrode, at a high yield factor.

Another object of the present invention is to provide a technique to prevent a short circuit between a gate electrode and a channel (active layer).

Still another object of the present invention is to provide a novel forming method of an LDD region.

Still another object of the present invention is to provide a method of manufacturing a TFT in which aluminum atoms do not diffuse into a gate insulting film in the case where a heat treatment is added after a wiring line using an aluminum material is formed.

While an aluminum material has a merit that resistance is low, it has a demerit that heat resistance is low. Thus, in the case where a gate electrode and a gate wiring line are formed of a material containing aluminum as its main ingredient, it is difficult to use a salicide (self-aligned silicide) step to make the surfaces of source/drain regions silicide.

Since hillocks or whiskers are apt to occur when aluminum is subjected to a heat treatment, in a step after the formation of the gate electrode and gate wiring line, the upper limit of a process temperature is limited within the range of 300 to 450° C.

However, in a TFT using an aluminum wiring line, even at a heating temperature within the range of 300 to 450° C., a bad operation of the thin film transistor due to a short circuit between a gate electrode and a channel was confirmed. It appears that the cause is that protrusions produced at the gate electrode, such as hillocks or whiskers, go through a gate insulating film and reach a channel formation region, or that aluminum atoms diffuse into the gate insulating film.

On the other hand, a heat treatment at a temperature exceeding 400° C. becomes necessary to make source/drain regions silicide. In the field of LSI, titanium silicide is mainly used for the purpose of decreasing the sheet resistance of the source/drain regions. However, in order to form titanium silicide by reacting a titanium (Ti) film with silicon, a heat treatment at a temperature of about 500 to 600° C. becomes necessary.

Conventionally, in view of heat resistance of an aluminum wiring line and reliability of a TFT, it was impossible to carry out a step of making silicide after formation of a gate electrode and wiring line made of aluminum.

Objects of the present invention are to solve the foregoing problem, to provide an insulated gate type transistor capable of operating at high speed, in which the resistance of a gate electrode and wiring line is reduced by using an aluminum material for the gate electrode and the gate wiring line material, and at the same time, the sheet resistance of source/drain regions is reduced by forming silicide layers on the surfaces of the source/drain regions, and to provide a method of manufacturing the same.

Particularly, an object of the present invention is to provide a technique in which even if a step of heat treatment is added after formation of a wiring line using an aluminum material, aluminum atoms do not diffuse into a gate insulating film, so that an insulated gate type transistor can be manufactured at a high yield factor.

The present inventors developed an etchant substituting chromium mixed acid, and at the same time, examined a process not using chromium mixed acid from the viewpoint of a TFT structure.

An object of the present invention is to realize an excellent ohmic contact between a wiring line electrically connected to a wiring line and an electrode and the wiring line and the electrode made of a lamination structure of alumina and aluminum, without using chromium mixed acid.

In order to achieve the above objects, according to an aspect of the present invention, a semiconductor device comprises a semiconductor circuit constituted by a plurality of TFTs formed on the same substrate, and is characterized in that each of the TFTs includes an active layer, a gate insulating film, and a gate electrode made of a lamination of a tantalum layer and a material layer containing aluminum or aluminum as its main ingredient; and that the tantalum layer has an enough thickness to be capable of functioning as a blocking layer to prevent a constituent element of the material layer containing aluminum or aluminum as its main ingredient from intruding into the gate insulating film.

The gist of the present invention is that the gate electrode, which is conventionally formed of only aluminum material, is made a tantalum/aluminum lamination film (tantalum formes an under layer), so that an aluminum component can be prevented from intruding into the gate insulating film. That is, the tantalum layer disposed as the under layer is used as the blocking layer against the aluminum component.

Thus, the thickness of the tantalum layer must be so thick that the tantalum layer can function as a barrier against the movement of the aluminum component. According to the knowledge of the present inventors et al., the tantalum layer with a thickness of not smaller than 5 nm is required. If the thickness is smaller than the value, the blocking effect can not be expected.

The upper limit of the thickness is considered to be about 200 nm. If the thickness is larger than this value, the aluminum material must be made thin to suppress the total thickness of the gate electrode (to decrease a difference in level), so that the feature of low resistance of aluminum can not be effectively used.

From the above, it is preferable to select the thickness of the tantalum layer within the range of 5 to 200 nm (preferably 10 to 100 nm, more preferably 20 to 50 nm).

The tantalum film has a feature that an anodic oxidation process is easily carried out by the same electrolytic solution as the aluminum film, and modes of formation of an anodic oxidation layer (progressing direction in a forming process of the oxidation layer, and the like) are close to those of the aluminum film, so that tantalum is a suitable material used in the present invention.

According to another aspect of the present invention, a semiconductor device comprises a semiconductor circuit constituted by a plurality of TFTs formed on the same substrate, and is characterized in that each of the TFTs includes an active layer, a gate insulating film, and a gate electrode made of a lamination of a tantalum layer and a material layer containing aluminum or aluminum as its main ingredient; and that a tantalum oxide layer is formed in a region of the tantalum layer which does not overlap with the material layer containing aluminum or aluminum as its main ingredient.

According to still another aspect of the present invention, a semiconductor device comprises a semiconductor circuit constituted by a plurality of TFTs formed on the same substrate, and is characterized in that each of the TFTs includes an active layer, a gate insulating film, and a gate electrode made of a lamination of a tantalum layer and a material layer containing aluminum or aluminum as its main ingredient; and that the end portion of the tantalum layer protrudes outside of the material layer containing aluminum or aluminum as its main ingredient, and a tantalum oxide layer is formed on the protruding end portion.

According to still another aspect of the present invention, a semiconductor device comprises a semiconductor circuit constituted by a plurality of TFTs formed on the same substrate, and is characterized in that each of the TFTs includes an active layer, a gate insulating film, and a gate electrode made of a lamination of a tantalum layer and a material layer containing aluminum or aluminum as its main ingredient; that the end portion of the tantalum layer protrudes outside of the material layer containing aluminum or aluminum as its main ingredient; and that the position of a source or drain contact portion included in the active layer is defined by the protruding end portion.

One of the features of the present invention is that the tantalum oxide layer obtained by anodic oxidation of part of the tantalum layer is used as a mask when an LDD region is formed. That is, through doping is carried out to the active layer through the tantalum oxide layer so that the LDD region is formed under the tantalum oxide layer.

Thus, there is a feature in structure that the tantalum oxide layer having almost the same shape as the LDD region is formed over the LDD region provided in the active layer.

According to still another aspect of the present invention, a method of manufacturing a semiconductor device, which comprises a semiconductor circuit constituted by a plurality of TFTs formed on the same substrate, comprises the steps of: forming an active layer and a gate insulating film; forming a gate electrode by sequentially laminating a tantalum layer and a material layer containing aluminum or aluminum as its main ingredient; forming a porous alumina layer by selective first anodic oxidation of only the material layer containing aluminum or aluminum as its main ingredient; and forming a nonporous alumina layer on the surface of the material layer containing aluminum or aluminum as its main ingredient by second anodic oxidation, and at the same time, for transforming the entire or part of the tantalum layer positioned under the porous alumina layer into a tantalum oxide layer.

According to still another aspect of the present invention, a method of manufacturing a semiconductor device, which comprises a semiconductor circuit constituted by a plurality of TFTs formed on the same substrate, comprises the steps of: forming an active layer and a gate insulating film; forming a gate electrode by sequentially laminating a tantalum layer and a material layer containing aluminum or aluminum as its main ingredient; forming a porous alumina layer by selective first anodic oxidation of only the material layer containing aluminum or aluminum as its main ingredient; forming a nonporous alumina layer on the surface of the material layer containing aluminum or aluminum as its main ingredient by second anodic oxidation, and at the same time, for transforming the entire or part of the tantalum layer positioned under the porous alumina layer into a tantalum oxide layer; etching the gate insulating film by using the nonporous alumina layer and the porous alumina layer as masks; and adding an impurity to impart an N type or a P type by using the gate electrode, the tantalum oxide layer, and the gate insulating film as masks.

In the above method, the first anodic oxidation is carried out in a solution containing oxalic acid as its main ingredient. In such a solution, only aluminum material is selectively subjected to anodic oxidation, and the tantalum layer remains as it is.

The second anodic oxidation is carried out in a solution containing tartaric acid as its main ingredient. In this solution, both the aluminum material and the tantalum layer are subjected to anodic oxidation. By this process, the aluminum material is covered with a dense nonporous alumina layer, and part (portion being brought into contact with the solution) of the tantalum layer is transformed into a tantalum oxide layer.

According to yet another aspect of the present invention, a semiconductor device comprises: a first wiring layer; a second wiring line formed on a layer upper than the first layer line; and a contact hole for electrically connecting the first wiring line and the second wiring line to each other; and is characterized in that the first wiring line is made of a lamination layer structure in which a thin film containing aluminum as its main ingredient is provided on a valve metal film; and that the second wiring line is in contact with the valve metal film through a contact hole formed to pierce the thin film containing aluminum as its main ingredient.

In the above structure, the valve metal indicates such a metal that an anodically produced barrier type anodic oxidation film allows to flow a cathode current but does not allow to flow an anode current, that is, a valve operation is shown (Electrochemical Handbook, fourth edition; edited by Electrochemical Society, p 370, Maruzen, 1985).

It is necessary that the valve metal film used in the present invention has a low etching rate by buffered hydrofluoric acid, that is, has hydrofluoric acid resistance. As the materials having such a condition, typically, tantalum (Ta), niobium (Nb), hafnium (Hf), zirconium (Zr), and the like can be enumerated.

Particularly, it is ascertained that tantalum can be anodically oxidized by the same electrolytic solution as the thin film containing aluminum as its main ingredient, and is suitable for the present invention. It is also possible to use a tantalum alloy such as molybdenum tantalum (MoTa).

When the above structure is applied to an active matrix type liquid crystal display device, the first wiring line corresponds to a gate wiring line for supplying a gate signal to a plurality of TFTs, and the second wiring line corresponds to a wiring line (which will be referred to as a lead wiring line) for transmitting a signal from the outside to the gate wiring line.

The gist of the present invention is to provide the valve metal film having hydrofluoric acid resistance under the thin film containing aluminum as its main ingredient.

By this, even if the thin film containing aluminum as its main ingredient is etched by buffered hydrofluoric acid, since the valve metal film functions as an etching stopper, it is possible to prevent etching from progressing over the valve metal film.

Moreover, since an excellent ohmic contact can be made between the valve metal film and the second wiring line, it is also possible to prevent poor contact from occurring between the first wiring line and the second wiring line.

As described above, the effect of the present invention is that by the structural improvement of the semiconductor device, an excellent ohmic contact against an aluminum wiring line can be realized without using an etchant, such as chromium mixed acid, which is difficult in industrial handling.

According to still another aspect of the present invention, a semiconductor device comprises a semiconductor circuit including a plurality of TFTs formed on the same substrate, and is characterized in that the TFT includes: a gate electrode of a lamination of a valve metal layer and a material layer containing aluminum or aluminum as its main ingredient; a gate insulating film being in contact with the gate electrode; a channel formation region being in contact with the gate insulating film; a high resistance region being in contact with the channel formation region; and a source region or a drain region being in contact with the high resistance region, that the source region or the drain region includes a material at a high concentration which facilitates crystallization of silicon, and that the high resistance region includes the material at a low concentration.

The gist of the present invention is to prevent aluminum atoms from intruding into the gate insulating film by making the gate electrode of the tantalum/aluminum lamination film (tantalum layer is the lower layer), which is conventionally composed of only aluminum material. That is, the tantalum layer disposed as the lower layer is used as a blocking layer against aluminum atoms which has low heat resistance. By making such a structure, it becomes possible to carry out a heat treatment at a temperature of 300° C. or more, preferably 450° C. or more, after formation of a wiring line.

The present invention has a feature that after formation of the wiring line, the source region or the drain region is doped with a phosphorus element, and is subjected to a heat treatment at a temperature of 450° C. or more, so that the material in a crystalline silicon film is lowered. In this way, it is inferred that the concentration of the material in the channel formation region is lowered down to $1 \times 10^{17}$ atoms/cm$^3$, typically about $1 \times 10^{15}$ atoms/cm$^3$ which is an undetectable level of SIMS. On the other hand, the concentration of the material in the source region or the drain region is $5 \times 10^{18}$ atoms/cm$^3$ or more, typically $1 \times 10^{19}$ atoms/cm$^3$ or more. Although another element in group 15, such as arsenic or antimony, may be used other than the phosphorus element, the phosphorus element has the most excellent gettering effect. It is desirable to use nickel as the material for facilitating crystallization.

As a blocking layer other than the above tantalum layer, it is possible to use a metal film or an alloy film mainly containing a metal element having heat resistance (melting point, etc.) higher than aluminum, or an inorganic film (silicon nitride film, silicon nitride oxide film, silicon oxide film). In addition, a lamination film of those may be used. Preferably, it is desirable to use niobium (Nb), hafnium (Hf), zirconium (Zr), titanium (Ti), or the like, which is called a valve metal. Tantalum is one of the valve metal.

The thickness of the tantalum layer must be so thick that it can function as a barrier against movement of aluminum atoms. The present inventors carried out experiments as to the film thickness, and the results are shown in FIGS. 34A to 34C. FIGS. 34A to 34C are photomicrographs showing the states after a treatment at 550° C. for 2 hours subsequent to formation of a wiring line using an aluminum layer. The experiments were carried out in both cases where a silicon film by a low pressure CVD method was used as an active layer and a silicon film by a plasma CVD method was used as an active layer.

In FIG. 34A showing a case (conventional structure) where an aluminum single layer (tantalum layer=0 nm) was used, it was ascertained that aluminum diffused (permeated). In FIGS. 34B and 34C showing cases where an aluminum lamination layer (lower layer is a tantalum layer=20 nm, 50 nm) was used, it was ascertained that aluminum did not diffuse and a sufficient blocking effect was obtained. According to the knowledge of the present inventors, the tantalum layer with a thickness of 1 nm or more, preferably 5 nm or more is required. If the thickness is lower than this value, the blocking effect can not be expected.

The upper limit of the thickness is considered to be 400 nm, preferably about 200 nm. If the thickness is larger than this value, the aluminum material layer must be made thin to suppress the total thickness of the gate electrode (to decrease a difference in level), so that the feature of low resistance of aluminum can not be effectively used.

From the above, it is preferable to select the thickness of the tantalum layer within the range of 1 to 400 nm (preferably 1 to 200 nm, more preferably 5 to 50 nm).

The valve metal film such as the tantalum layer has a feature that an anodic oxidation process is easily made in the same electrolytic solution as the aluminum layer, and further, modes of formation of an anodic oxidation layer (progressing direction in a forming process of the oxidation layer, and the like) are close to those of the aluminum film, so that tantalum is a suitable material used in the present invention. In addition, when such a structure is adopted that the lamination gate electrode is coated with the respective anodic oxidation films, the insulation properties are improved and the heat resistance is improved.

According to still another aspect of the present invention, a method of manufacturing a semiconductor device, which comprises a semiconductor circuit including a plurality of TFTs formed on the same substrate, comprises the steps of: forming an active layer by using a crystalline silicon film containing a material for facilitating crystallization of silicon; forming a gate insulating film; forming a gate electrode by sequentially laminating a tantalum layer and a material layer containing aluminum or aluminum as its main ingredient; forming a porous alumina layer by selective first anodic oxidation of the material layer containing aluminum or aluminum as its main ingredient; forming a nonporous alumina layer on a surface of the material layer containing aluminum or aluminum as its main ingredient by second anodic oxidation, and at the same time, for transforming the entire or part of the tantalum layer positioned under the porous alumina layer into a tantalum oxide layer; doping a region, which becomes a source region or a drain region of the TFT, with a phosphorus element; and gettering the material by a heat treatment.

In the above method, the heat treatment in the gettering is carried out at a temperature of 450 to 700° C.

According to still another aspect of the present invention, a method of manufacturing a semiconductor device, which comprises a semiconductor circuit including a plurality of TFTs formed on the same substrate, comprises the steps of: forming an active layer by using a crystalline silicon film containing a material for facilitating crystallization of silicon; forming a gate insulating film; forming a gate electrode by sequentially laminating a tantalum layer and a material layer containing aluminum or aluminum as its main ingredient; forming a porous alumina layer by selective first anodic oxidation of the material layer containing aluminum or aluminum as its main ingredient; forming a nonporous alumina layer on a surface of the material layer containing aluminum or aluminum as its main ingredient by second anodic oxidation, and at the same time, for transforming part of the tantalum layer positioned under the porous alumina layer into a tantalum oxide layer; removing the porous alumina layer; forming a nonporous alumina layer on a surface of the material layer containing aluminum or aluminum as its main ingredient by third anodic oxidation, and at the same time, for transforming the entire of the tantalum layer positioned under the porous alumina layer into a tantalum oxide layer; carrying out doping of a phosphorus element by using the gate electrode, the tantalum oxide layer, and the gate insulating film as masks; and gettering the material by a heat treatment.

The above method further comprises a step of etching the gate insulating film by using the nonporous alumina layer and the porous alumina layer as masks.

In the above method, the first anodic oxidation is carried out in a solution containing oxalic acid as its main ingredient.

In the above method, the second anodic oxidation is carried out in a solution containing tartaric acid as its main ingredient.

In the above method, the heat treatment at the gettering is carried out at a temperature of 450 to 700° C.

According to still another aspect of the present invention, a semiconductor device comprises a semiconductor circuit including a plurality of N-channel TFTs and P-channel TFTs formed on the same substrate, and is characterized in that each of the N-channel TFTs and the P-channel TFTs includes a gate electrode of a lamination of a valve metal layer and a material layer containing aluminum or aluminum as its main ingredient; a gate insulating film being in contact with the gate electrode; a channel formation region being in contact with the gate insulating film; a high resistance region being in contact with the channel formation region; and a source region or a drain region being in contact with the high resistance region, that the source region or the drain region of each of the N-channel TFTs and the P-channel TFTs contains a phosphorus element, and that the source region or the drain region of each of the P-channel TFTs contains an impurity to impart P-type conductivity, the concentration of the impurity being high as compared with the concentration of the phosphorus element.

According to still another aspect of the present invention, a method of manufacturing a semiconductor device, which comprises a semiconductor circuit including a plurality of N-channel TFTs and P-channel TFTs formed on the same substrate, comprises the steps of: forming an active layer by using a crystalline silicon film employing a material for facilitating crystallization of silicon; forming a gate insulating film; forming a gate electrode by sequentially laminating a valve metal layer and a material layer containing aluminum or aluminum as its main ingredient; forming a porous alumina layer by selective first anodic oxidation of the material layer containing aluminum or aluminum as its main ingredient; forming a nonporous alumina layer on a surface of the material layer containing aluminum or aluminum as its main ingredient by second anodic oxidation, and at the same time, for transforming the entire or part of the valve metal layer positioned under the porous alumina layer into an anodic oxidation layer; doping a region, which becomes a source region or a drain region of each of the N-channel TFTs and the P-channel TFTs, with a phosphorus element; gettering the material by a heat treatment; and doping a region, which becomes the source region or the drain region of each of the P-channel TFTs, with an impurity to give P-type conductivity, the concentration of the impurity being higher as compared with the concentration of the phosphorus element.

According to still another aspect of the present invention, a semiconductor device comprises a semiconductor circuit including a plurality of TFTs formed on the same substrate, and is characterized in that each of the TFTs includes a gate electrode of a material layer containing aluminum or aluminum as its main ingredient; a blocking layer being in contact with the gate electrode; a gate insulating film being in contact with the blocking layer; a channel formation region being in contact with the gate insulating film; a high resistance region being in contact with the channel formation region; and a source region or a drain region being in contact with the high resistance region, that the source region or the drain region contains a material at a high concentration which facilitates crystallization of silicon, and that the high resistance region contains the material at a low concentration.

In the above semiconductor device, the blocking layer is a silicon nitride oxide film, a silicon nitride film, a silicon oxide film, or a lamination of those.

According to still another aspect of the present invention, a semiconductor device comprises a semiconductor circuit including a plurality of insulated gate transistors formed on the same substrate, and is characterized in that a gate electrode of each of the insulated gate type transistors includes a metal layer which is formed close to a gate insulating film and mainly contains a metal material having a melting point higher than that of aluminum and being capable of anodically oxidized; an anodic oxidation film of the metal material formed on a side of the metal layer; an aluminum layer or a material layer containing aluminum as its main ingredient formed close to the metal layer; and an alumina layer obtained by anodic oxidation of aluminum and formed on a surface of the aluminum layer or the material layer containing aluminum as its main ingredient, and that a silicide layer is formed in the source region or th e drain region at least at a connection portion to the so urce electrode or the drain electrode.

According to still another aspect of the present invention, a semiconductor device comprises a semicond uctor circuit including a plurality of thin film transistors formed on the same substrate, and is characterized in that a gate electrode of each of the thin film transistors includes a tantalum layer formed close to a gate insulating film; a tantalum oxide layer formed at a side of the tantalum layer; an aluminum layer or a material layer containing aluminum as its main ingredient formed close to the tantalum layer; and an alumina layer formed on a surface of the aluminum layer or the material layer containing aluminum as its main ingredient, and that a silicide layer is formed in the source region or the drain region at least at a connection portion to a source electrode or a drain electrode.

According to still another aspect of the present invention, a method of manufacturing a semiconductor device, which comprises a semiconductor circuit including a plurality of thin film transistors formed on the same substrate, comprises the steps of: forming an active layer made of a material containing silicon as its main ingredient, and a gate insulating film close to the active layer; forming a tantalum layer close to the gate insulating film; forming a material layer containing aluminum or aluminum as its main ingredient close to the tantalum layer; forming a porous alumina layer on a side of the material layer by selectively anodically oxidizing the material layer containing aluminum or aluminum as its main ingredient through a first anodic oxidation process; forming a nonporous alumina layer on a surface of the material layer by anodically oxidizing the material layer containing aluminum or aluminum as its main ingredient through a second anodic oxidation process, and at the same time, for forming a tantalum oxide layer at a side of the tantalum layer by anodic oxidation of the tantalum layer; exposing a surface of source and drain regions of the active layer by patterning the gate insulating film; removing the porous alumina layer; adding an impurity to give one conductivity into the source and drain regions; and making at least a surface of the source and drain regions become silicide.

BRIEF DESCRIPTION OF THE DRAWINGS

In the accompanying drawings:

FIGS. 16A to 16F are views showing manufacturing steps of a TFT and a contact portion to a gate wiring line;

FIGS. 17A to 17D are views showing manufacturing steps of a TFT;

DETAILED DESCRIPTION OF THE INVENTION

Figure 1A:
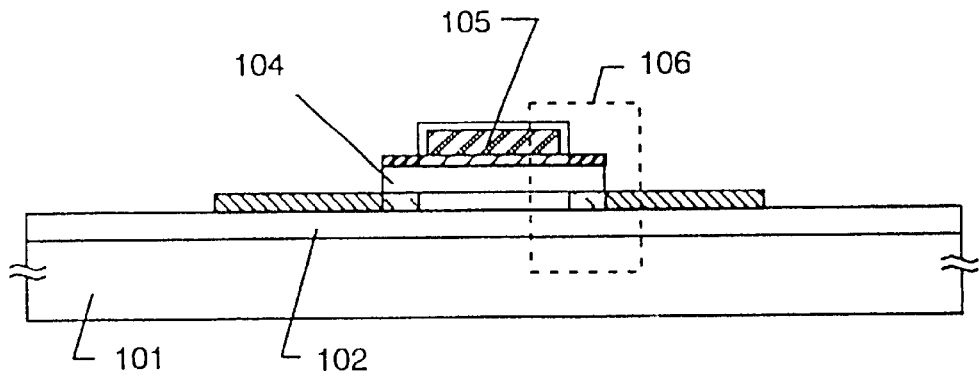
FIGS. 1A and 1B are views showing the structure around a gate electrode of a TFT.

An embodiment of the present invention will be described with reference to FIGS. 1A and 1B. FIG. 1A is a sectional view showing an example of a TFT using the present invention and taken along the direction of a channel formation region (direction of movement of carriers). Although FIG. 1A shows only one TFT, a semiconductor circuit constituted by a plurality of TFTs is formed on a substrate 101. However, an interlayer insulating film covering a gate electrode, source/drain electrodes, and the like are omitted.

In FIG. 1A, reference numeral 101 denotes the substrate, and 102 denotes an under film (insulating silicon film). In the case where the under film is provided, glass (including crystallized glass), silicon wafer, ceramics, quartz, or the like may be used for the substrate 101. If quartz is used, the under film may be omitted.

An active layer of the TFT is obtained by patterning a semiconductor thin film (typically a polycrystalline polysilicon film) like an island. Although any semiconductor thin film can be used for the active layer in the present invention, remarkable effects can be obtained particularly in the case of using a crystalline silicon film obtained by employing a technique (Japanese Patent Unexamined Publication No. Hei. 6-232059, No. Hei. 7-321339, etc.) of making crystallization with a material (typically nickel element) for facilitating crystallization. An entire disclosure of No. Hei. 6-232059 and No. Hei. 7-321339 is incorporated herein by reference.

For example, an SOI substrate (UNIBOND) using a smart cut method or an SIMOX substrate may be used. In that case, since an active layer can be formed of single crystal silicon, a TFT having extremely high operation performance can be realized.

A gate electrode is disposed over the active layer through a gate insulating film 104. The gate electrode is formed of a lamination layer of an aluminum layer 105 and a valve metal film (typically a tantalum layer), and the TFT having small signal delay can be realized by effectively using the low resistance of the aluminum material. In the present invention, since the valve metal layer functions as a blocking layer, a heat treatment at a temperature of 300° C. or more, preferably 450° C. or more becomes possible.

Figure 1B:
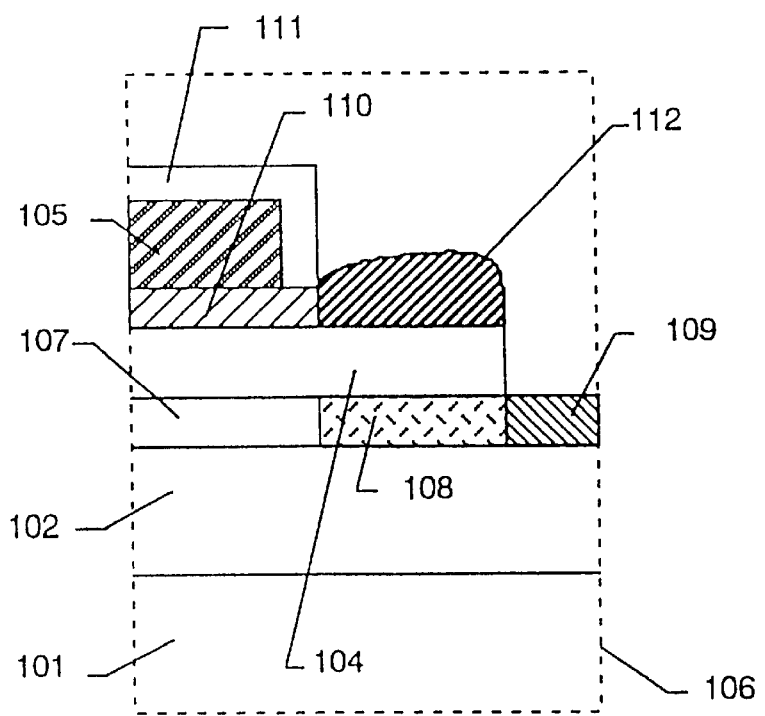

FIG. 1B is an enlarged view of a region surrounded by a dotted line 106. As shown in FIG. 1B, an active layer 103 is constituted by a channel formation region 107, an LDD (Lightly Doped Drain) region 108, and a drain (or source) region 109, and the gate insulating film 104 is disposed on the channel formation region 107 and the LDD region 108. Strictly speaking, although an offset region is formed between the channel formation region and the LDD region, if its width is small, an offset effect can be hardly obtained. Incidentally, in the present specification, the low concentration impurity region (including the LDD region) or the offset region is referred to as a high resistance region.

In the present invention, in the structure in which the high resistance region, such as the LDD region and the offset region, is disposed adjacently to the channel formation region, the source region and the drain region (at least one of the regions) are doped with typically a phosphorus element to make a gettering site. By carrying out a heat treatment at a temperature of typically 300 to 700° C., preferably 450 to 600° C., the concentration of a material in the channel formation region and the high resistance region is lowered down to typically $1\times10^{18}$ atoms/cm$^3$ or less by SIMS (Secondary Ion Mass Spectroscopy), preferably to $1\times10^{16}$ atoms/cm$^3$ or less by SIMS. If the dosage of phosphorus is $1\times10^{13}$ atoms/cm$^2$ or more, the concentration of the material (typically nickel) can be sufficiently lowered to $1\times10^{18}$ atoms/cm$^3$ or less.

Figure 31A:
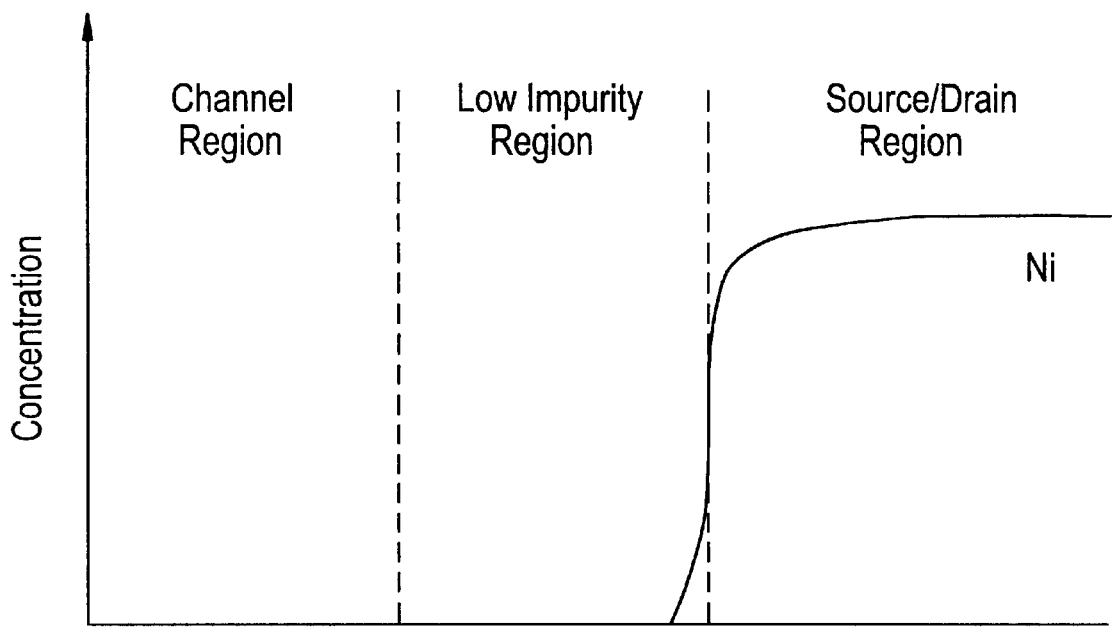
FIGS. 31A and 31B are views showing the concentration distributions of nickel and phosphorus in an active layer of a TFT.
Figure 31B:
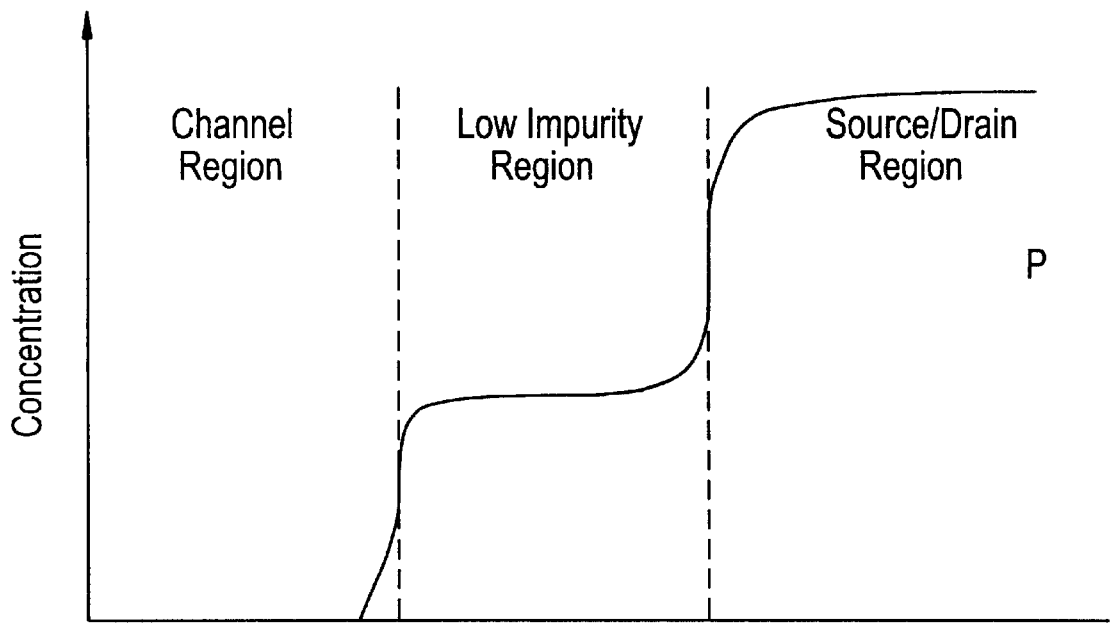

If the above heat treatment is carried out, the concentration of the material in the high resistance region and the channel formation region is made lower than the concentration of the material in the source region and the drain region. FIGS. 31A and 31B show the distribution of the concentration of the material (nickel) in the crystalline silicon film after the heat treatment (FIG. 31A) and the distribution of the concentration of the phosphorus element in the crystalline silicon film (FIG. 31B), respectively.

As the temperature of the heat treatment becomes high, an excellent gettering effect can be obtained, and as a processing time becomes long, the process becomes preferable. However, in view of the object of the present invention that a low temperature process is effectively used, it is desirable that the upper temperature limit is made 700° C., and in view of a throughput of manufacturing steps, it is desirable that the upper time limit is made 24 hours (preferably 1 to 12 hours, typically 2 to 8 hours).

In the case where a P-channel TFT (PTFT) is manufactured, source and drain regions of the PTFT are doped with a phosphorus element, and are further doped with an impurity (typically B (boron)), which imparts P-type conductivity, at a concentration higher than the concentration of the phosphorus element.

Particularly, since a silicon nitride film has a high ion blocking effect, it is effective to use the film as part of the gate insulating film. A silicon nitride oxide film has properties of both a silicon oxide film and a silicon nitride film, it is suitable as the gate insulating film.

The lamination structure is not limited to a two-layer structure but may be a plural layer structure. For example, since a lamination film (called an ONO film) made of a three-layer structure of silicon oxide/silicon nitride/silicon oxide has high reliability, the lamination film is suitable as the gate insulating film of the present invention.

In the gate electrode, a valve metal layer (tantalum layer) 110, an aluminum layer 105 are laminated in this order. By an anodic oxidation process, part of the aluminum layer 105 is transformed into a nonporous alumina layer 111, and part of the valve metal film (tantalum layer) 110 is transformed into an anodic oxidation layer (tantalum oxide layer) 112 of the valve metal.

At the foregoing anodic oxidation, only part of the tantalum layer which does not overlap with the aluminum layer 105 and the nonporous alumina layer 111 is subjected to anodic oxidation, and as shown in FIG. 1B, the anodic oxidation layer (tantalum oxide layer) 112 of the valve metal layer is formed into a shape such as protrudes outside of the aluminum layer 105.

When the source/drain regions are formed, the anodic oxidation layer (tantalum oxide layer) 112 of the valve metal film is used as a mask, and the impurity concentration under the layer is intentionally lowered, so that an LDD region 108 can be formed. Thus, the position of a contact portion (source or drain contact portion) between the drain (or source) region 109 and the LDD region 108 is defined in a self-aligning manner by the end portion (protruding end portion) of the anodic oxidation layer (tantalum oxide layer) of the valve metal layer.

Figure 2A:
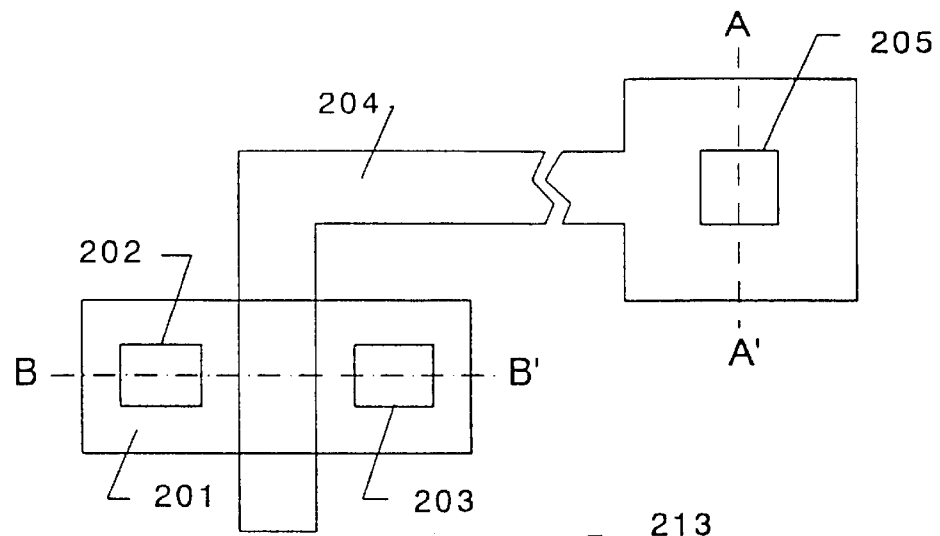
FIGS. 2A to 2C are views showing the structure of a TFT and the structure of a contact portion to a gate wiring line.

Another embodiment of the present invention will be described with reference to FIGS. 2A to 2C. In FIG. 2A, reference numeral 201 denotes an active layer of a TFT, 202 and 203 denote contact portions (source/drain contact portions) between the active layer 201 and a source electrode/a drain electrode, and 204 denotes a gate wiring line. Incidentally, there is also a case where a portion of the gate wiring line 204 which overlaps with the active layer 201 is particularly called a gate electrode. Reference numeral 205 denotes a contact portion (gate contact portion) between the gate wiring line 204 and a lead wiring line (not shown), and the present invention is a technique relating to this gate contact portion 205.

Figure 2B:
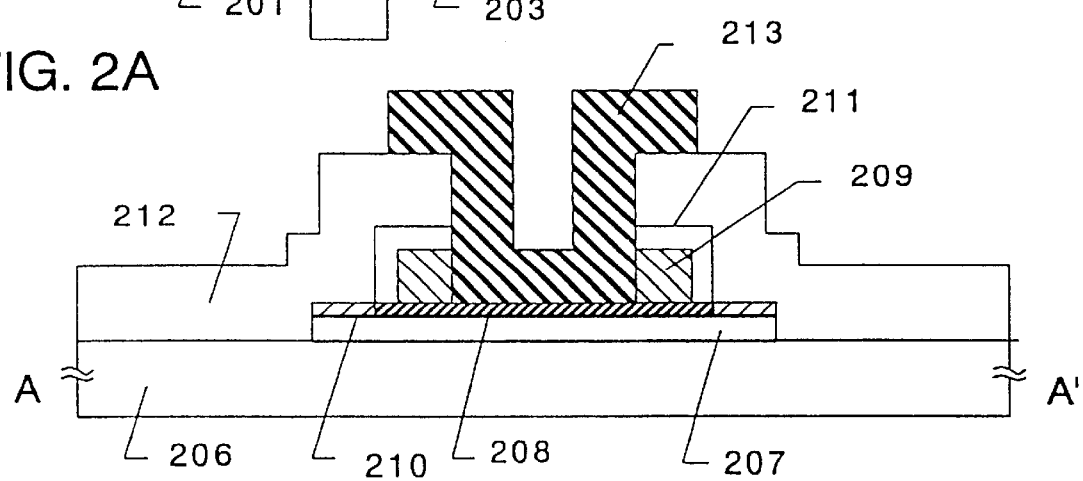

FIG. 2B is a sectional view taken along line A–A' in FIG. 2A. In FIG. 2B, reference numeral 206 denotes a substrate having an insulating surface, 207 denotes an insulating film made of silicon oxide, and the gate wiring line 204 made of a lamination structure of a valve metal film 208 and an aluminum film (thin film containing aluminum as its main ingredient) 209 is provided on the insulating film.

It is appropriate that the thickness of the valve metal film 208 may be made 5 to 300 nm (preferably 10 to 100 nm, more preferably 20 to 50 nm).

If the thickness becomes not larger than 5 nm, there is a fear that the film does not effectively function as an etching stopper. If the thickness becomes 300 nm or more, the total thickness of the gate wiring line 204 becomes excessively thick, and there is increased fear that disconnection is caused when another wiring line gets over the gate wiring line, so that such a large thickness is not preferable.

If the thickness of the valve metal film 208 is made 10 to 100 nm, the end portion of the valve metal film is completely transformed into oxide by anodic oxidation. In view of the function of the valve metal film 208 as the etching stopper and the thickness (including a margin) in which the end portion is completely oxidized, it is preferable that the thickness of the valve metal film 208 is about 20 to 50 nm.

If the thickness of the valve metal film is set like this, the gate wiring line 204 is finally covered with two different kinds of anodic oxidation films. Specifically, the end portion of the valve metal film 208 is transformed into a metal oxide film 210 by anodic oxidation, and an alumina film 211 is formed around the aluminum film 209 by anodic oxidation.

If the thickness of the valve metal film 208 is 100 nm or more, although there is a case where the valve metal film remains in the lower layer of the metal oxide film 210, such a case does not become a factor to hinder the effect of the present invention.

An interlayer insulating film 212 covering the gate wiring line 204 is provided, and a contact hole is bored in the portion corresponding to the gate contact portion 205 and a lead wiring line 213 is formed. Buffered hydrofluoric acid is used for the formation of the contact hole, and the interlayer insulating film 212, the alumina film 211, and the aluminum film 209 are successively removed in this order.

At this time, since the valve metal film 208 is not etched by buffered hydrofluoric acid, the valve metal film 208 becomes a stopper so that etching is stopped.

When the contact hole is formed, the lead wiring line 213 made of a metal film is formed and ohmic contact to the valve metal film 208 is realized. Of course, although the lead wiring line is in contact with the aluminum film 209, since the contact is made by only a section, it is conceivable that the contact hardly contributes to the ohmic contact.

The most remarkable feature of the present invention is that like this, the gate wiring line 204 is made the lamination structure of valve metal and aluminum, so that the contact hole can be formed by using buffered hydrofluoric acid. That is, it is not necessary to use an etchant, such as chromium mixed acid, the handling of which is difficult, but buffered hydrofluoric acid, which is easily obtained and is easily managed, can be used, so that the present invention is extremely useful in industry.

When the present invention is carried out, the structure of a TFT also becomes unique. FIG. 2C is a sectional view taken along line B–B' of a TFT portion in FIG. 2A.

Figure 2C:
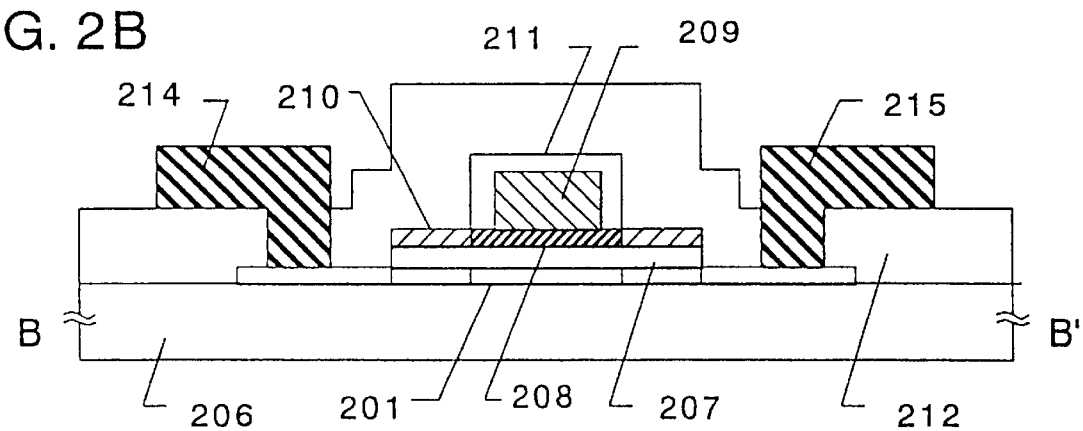

Since the TFT structure shown in FIG. 2C is almost the same as the TFT structure disclosed in Japanese Patent Unexamined Publication No. Hei. 7-135318 by the present applicant, although its detailed description will be omitted, the point different from the publication is that the gate electrode is made of the lamination structure of the valve metal film 208 and the aluminum film 209. No. Hei. 7-135318 corresponds to U.S. Pat. No. 5,598,284. An entire disclosure of No. Hei. 7-135318 and U.S. Pat. No. 5,598,284 is incorporated herein by reference.

In this case, the valve metal film 208 functions also as a blocking layer to prevent the constituent of the aluminum film 209 from outflowing (diffusing) into the active layer 201 through the gate insulating film 207. Although it is conceivable a case where such diffusion of aluminum is caused from the phenomenon that aluminum alloy has fluidity by a heat treatment or heat generation by static electricity, such diffusion can be prevented by providing the valve metal film as the under layer of the aluminum film.

Reference numerals 214 and 215 denote a source wiring line and a drain wiring line each made of conductive film, and are made of the same material and in the same layer as the lead wiring line 213 shown in FIG. 2B. It is appropriate that a lamination film of titanium and aluminum, or the like is used.

Still another embodiment of the present invention will be described with reference to FIG. 3.

Figure 3:
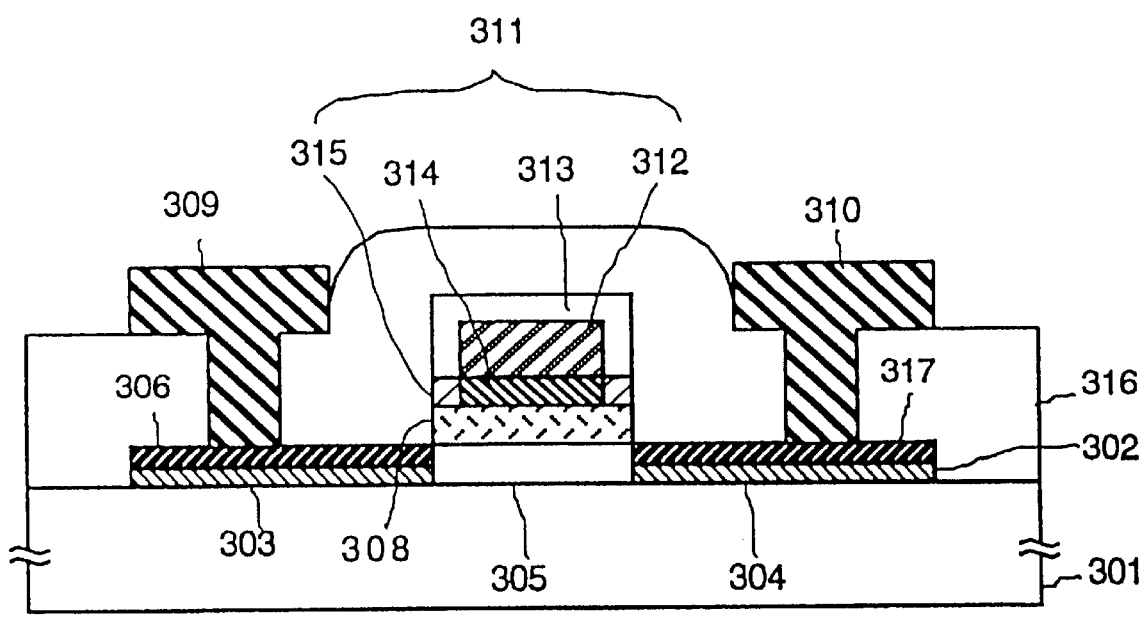
FIG. 3 is a sectional structural view of a TFT for explaining the structure of the present invention.

FIG. 3 is a schematic view for enplaning the structure of the present invention, and is a sectional view of a thin film transistor. Although FIG. 3 shows only one thin film transistor, a plurality of thin film transistors are formed on the substrate 301 to constitute a semiconductor circuit.

The thin film transistor includes an active layer 302 formed from a semiconductor film containing silicon on a substrate 301 having an insulating surface, a gate insulating film 308, a gate electrode 311, a source electrode 309, and a drain electrode 310. The gate electrode 311 and the source/drain electrodes 309 and 310 are electrically insulated from each other by an interlayer insulating film 316.

The active layer 302 includes a source region 303, a drain region 304, and a channel formation region 305, and the surfaces of the source region 303 and the drain region 304 are made to become silicide so that silicide layers 306 and 307 are formed.

The gate electrode 311 includes a lamination conductive film of a metal layer 312 formed close to the gate insulating film 308 and an aluminum layer 314 formed on the metal layer 312, and further includes an anodic oxidation layer 313 of the metal layer formed on the side of the metal layer 312 and an alumina layer 315 obtained by anodic oxidation of the surface of the aluminum layer 314. By this structure, since the above lamination conductive film is covered with each anodic oxidation film, its insulation property is raised, and the heat resistance of the aluminum layer 314 is also improved.

In the present invention, the metal layer 312 is made of a metal material which can be anodically oxidized and has a melting point higher than aluminum, and is made to function as a barrier layer to prevent aluminum from diffusing into the gate insulating film 308, so that a heat treatment at a temperature of 400° C. or more becomes possible after formation of the gate electrode 311, and the heat temperature can be raised up to about 500 to 600° C.

As such metal layer 312, valve metal may be used, and it is appropriate that any one kind of metal element selected from Ta, Nb, Hf, Ti, and Cr, an alloy of those, or an alloy of Mo and Ta is used. The aluminum layer 314 may be made of not only pure aluminum but also aluminum added with Si, Sc, or the like of several wt % to improve the heat resistance.

In the present invention, since heating at a temperature of 500 to 650° C. becomes possible after formation of the gate electrode 311, it is possible to form the silicide layers 306 and 307 in the source/drain regions by a salicide step.

An example of manufacturing methods of the thin film transistor of FIG. 3 will be described below. The active layer 302 containing silicon as its main ingredient is formed on the substrate 301 having the insulating surface. As the active layer 302, it is appropriate that a polycrystalline silicon thin film obtained by crystallizing an amorphous silicon thin film is used. In view of the heat resistance of the substrate, it is appropriate that a heat treatment, a method of irradiation of laser light or intense light comparable with the laser light, or the like is suitably selected for crystallization. An insulating coating film constituting the gate insulating film 308 is formed on the active layer 302.

Next, the gate electrode 311 is formed. The metal layer 312 and the aluminum layer 314 are formed and are patterned into predetermined shapes. Each layer is subjected to anodic oxidation to form the anodic oxidation layers 313 and 315. By this, the gate electrode 311 is completed. In the present invention, since the aluminum layer 314 is mainly used as a path of signals and current in the gate electrode 311, its film thickness is made about 400 to 650 nm. It is satisfactory if the metal layer functions as a barrier layer, and its film thickness is made about 10 to 100 nm.

Next, the insulating coating film is patterned by using the gate electrode 311 as a mask, so that the gate insulating film 308 is formed in a self-aligning manner. Further, an impurity to give conductivity is added into the active layer 302 by using the gate electrode 311 as a mask, so that the source/drain regions 303 and 304 and the channel formation region 305 are formed in a self-aligning manner.

Next, the silicide layers 306 and 307 are formed in the source/drain regions 303 and 304. First, a metal film which reacts with silicon to form silicide is formed. As this metal film, any metal film can be used as long as the film reacts with silicon to form silicide at a heat temperature of about 500 to 600° C. For example, a film of any one kind of metal selected from Ta, Cr, Mn, Nb, Mo and Ti can be used. The metal film is in contact with only the source/drain regions 303 and 304 in the active layer 302, and silicon in the source/drain regions 303 and 304 reacts with the metal by a heat treatment, so that the silicide layers 306 and 307 are formed. The source/drain regions 303 and 304 may be completely made to become silicide.

After forming silicide, an non-reacted metal film is removed by etching. At this time, since the metal layer 312 and the aluminum layer 314 of the gate electrode 311 are coated with the anodic oxidation layers 315 and 313, respectively, they are not removed by the etching. As a heat treatment for forming silicide, it is appropriate that heating in an electric furnace or RTA using an infrared lamp is used.

Then an interlayer insulating film 316 is formed, contact holes are formed therein, and source/drain electrodes 309 and 310 are formed.

In the present invention, the aluminum layer 314 is used for the gate electrode 311, and the silicide layers 306 and 307 are formed at the connection portions between the source/drain electrodes 309 and 310 so that the operation speed is improved, and saving of electric power can be realized. Here, although the thin film transistor is shown as an example of insulated gate transistors, the present invention can also be applied to a MOS type transistor including source/drain regions in a silicon substrate.

The structure of the present invention will be described in more detail with reference to embodiments set forth below.

[Embodiment 1]

Manufacturing steps of a TFT using the present invention will be described with reference to FIGS. 4A–4E and 5A–5D. The present invention has a feature from formation of a gate electrode to formation of source/drain regions, and other portions can be formed by a well-known technique. Thus, the present invention is not limited to the manufacturing steps of this embodiment.

Figure 4A:
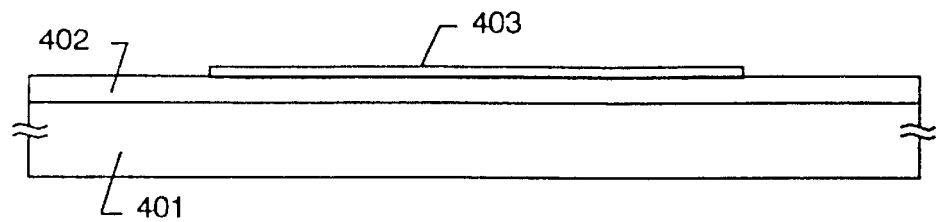
FIGS. 4A to 4E are views showing manufacturing steps of a TFT.

First, a glass substrate is prepared as a substrate 401, and a silicon oxide film with a thickness of 200 nm is formed as an under film 402 on the substrate. An active layer 403 is formed thereon by a well-known means. The thickness of the active layer 403 is made 10 to 100 nm (preferably 15 to 75 nm, more preferably 20 to 45 nm) (FIG. 4A).

As the active layer 403, although any of a single crystal silicon film, a polycrystalline silicon film (polysilicon film), and a noncrystalline silicon film (amorphous silicon film) may be used, it is preferable to use single crystal silicon or polycrystalline silicon to increase an operation speed.

As described above, if the single crystal silicon film is used, it is desirable to use a UNIBOND substrate using a smart cut method, a SIMOX substrate using an oxygen ion implantation method, or the like. In this case, since the silicon substrate and the under film are integrally obtained, it is not necessary to newly provide an under film.

If the polycrystalline silicon film is used, it can be obtained by direct film formation or by crystallization of an amorphous silicon film. As a crystallizing means, it is appropriate that laser annealing by excimer laser light irradiation, lamp annealing by irradiation of infrared rays or ultraviolet rays, or furnace annealing using an electric heating furnace is used. Further, a technique disclosed in Japanese Patent Unexamined Publication No. Hei. 7-130652 by the present inventors et al. may be used together. No. Hei. 7-130652 discloses a crystallization method of a semiconductor film using a material for promoting crystallization of the semiconductor film. An entire disclosure of No. Hei. 7-130652 is incorporated herein by reference.

After the state of FIG. 4A is obtained in this way, a gate insulating film 404 made of a silicon nitride oxide film is formed, and further, a tantalum layer 405 with a thickness of 50 nm and an aluminum layer 406 with a thickness of 350 nm are sequentially laminated. In this embodiment, as the aluminum layer 406, an aluminum layer containing scandium of 2 wt % is used.

Figure 4B:
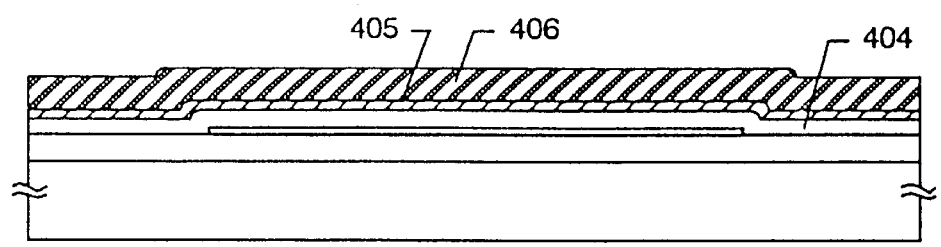

It is appropriate that the tantalum layer 405 and the aluminum layer 406 are formed by a vapor phase method (typically, a sputtering method) (FIG. 4B).

Figure 4C:
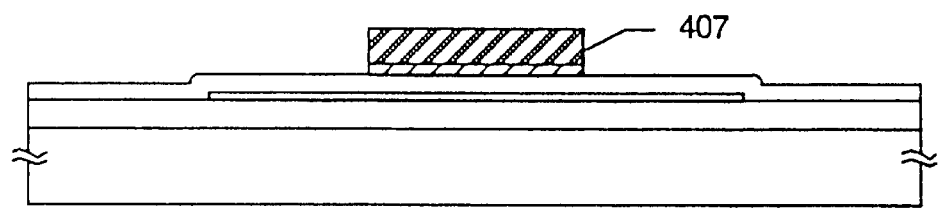

Next, the tantalum layer 405 and the aluminum layer 406 are etched by a dry etching method or a wet etching method, and a lamination pattern 407 which becomes an original of a subsequent gate electrode is formed (FIG. 4C).

As etching gases for dry etching, if the gases are selectively used, for example, if a chlorine-based gas is used for etching of the aluminum layer and a fluorine-based gas is used for etching of the tantalum layer, a continuous process is possible. In the case where the tantalum layer is as thin as about 50 nm, it is ascertained that the aluminum layer and the tantalum layer are etched at the same time by the chlorine-based gas.

Although a resist mask (not shown) is used for patterning of the lamination pattern 407, if the surface of the aluminum layer is covered with a thin anodic oxidation film before the resist mask is formed, the adhesiveness is improved.

Figure 4D:
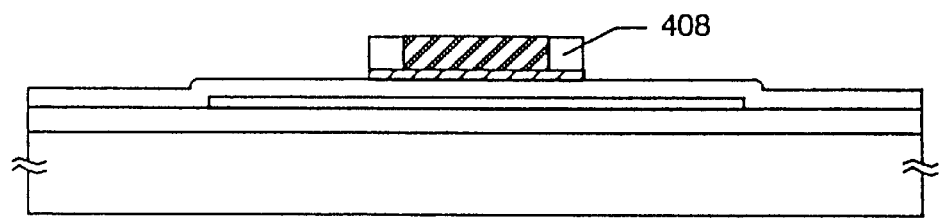

Next, while the resist mask remains, an anodic oxidation process with a reached voltage of 8 V is carried out in a solution of 3% oxalic acid, so that a porous alumina layer 408 with a thickness of 600 to 800 nm is formed. The tantalum layer is not subjected to anodic oxidation in the solution but remains as it is, and only the aluminum layer is selectively subjected to anodic oxidation (FIG. 4D).

Moreover, after the not-shown resist mask is removed, an anodic oxidation process with a reached voltage of 80 V is carried out in an ethylene glycol solution containing 3% tartaric acid. In this process, both the aluminum layer and the tantalum layer are subjected to anodic oxidation (FIG. 4E).

With respect to the tantalum layer 405, only its portion being in contact with the porous alumina layer 408 is subjected to anodic oxidation, so that a tantalum oxide layer 409 is formed. This is because only that portion touches the electrolytic solution having permeated through the inside of the porous alumina layer 408.

With respect to the aluminum layer 406, a nonporous alumina layer 410 with a thickness of 100 to 120 nm is formed on its surface (inside of the porous alumina layer). The film thickness of the nonporous alumina layer 410 is determined by the reached voltage.

Figure 4E:
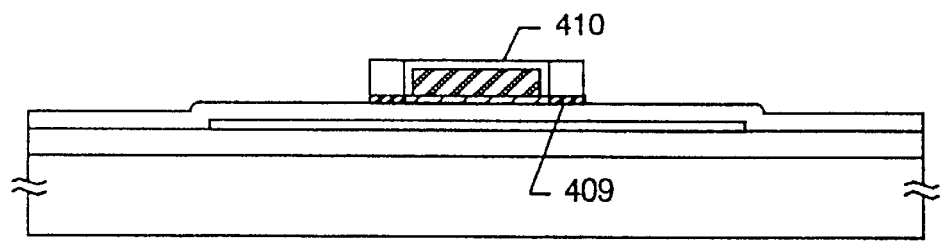
Figure 32A:
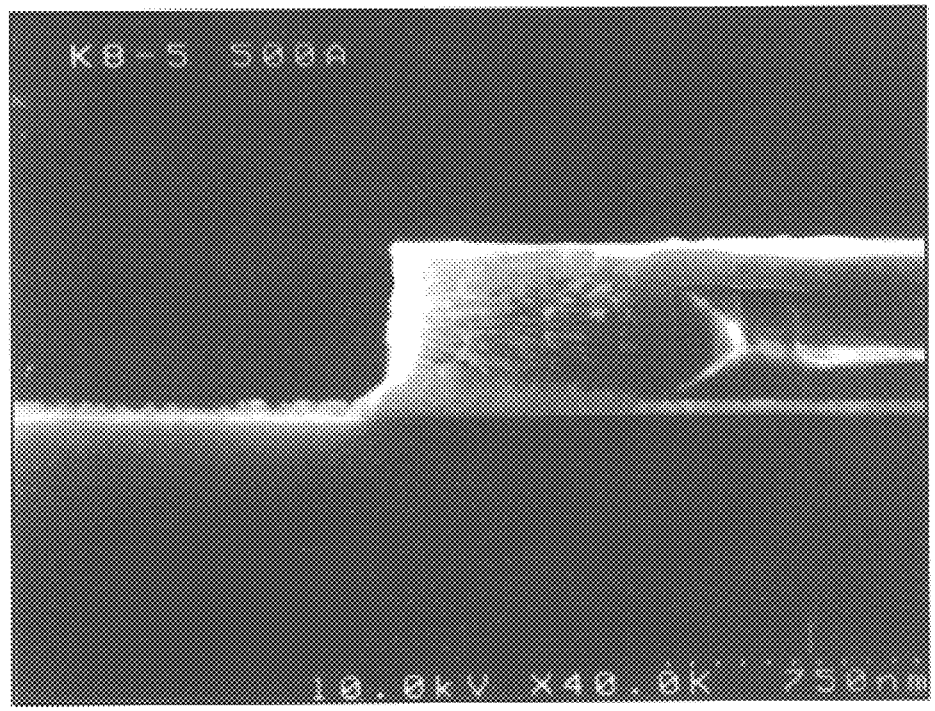
FIGS. 32A and 32B are a SEM photograph and its schematic view showing the structure near a gate electrode.

Here, a SEM photograph showing the state of FIG. 4E will be shown in FIG. 32A. In FIG. 32A, the SEM photograph shows a sample experimentally reproducing the state of FIG. 4E, which is magnified 40 thousands times, and shows the state near the porous alumina layer.

Figure 32B:
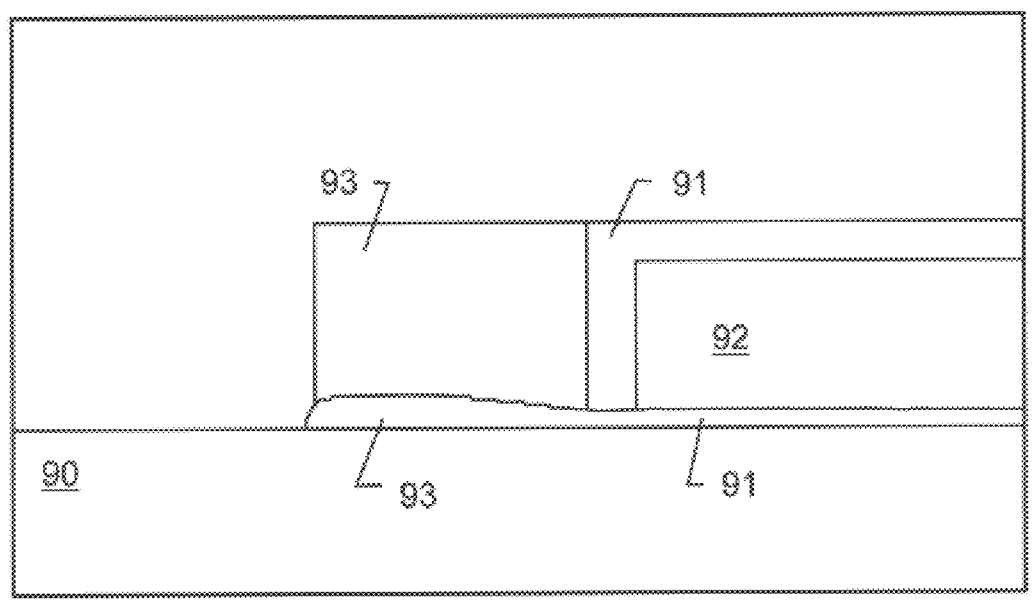

FIG. 32B is a schematic view of FIG. 32A. In FIG. 32B, reference numeral 90 denotes an under layer made of a silicon oxide film, 91 denotes a tantalum layer, 92 denotes an aluminum layer, 93 denotes a tantalum oxide layer, 94 denotes a nonporous alumina layer, and 95 denotes a porous alumina layer.

As shown in FIG. 32B, the surface of the aluminum layer 92 is covered with the nonporous alumina layer 94, and the porous alumina layer 95 is formed at the outside thereof. The tantalum oxide layer 93 is formed at the end portion (under the porous alumina layer) of the tantalum layer 91.

As long as inference is made from the photograph shown in FIG. 32A, it appears that the volume of the tantalum layer expands about twice when the tantalum layer is transformed into the tantalum oxide layer by the anodic oxidation process, and the thickness thereof becomes thick about 2 to 4 times (typically 3 times).

After such a structure is obtained, the gate insulating film 404 is etched by a dry etching method with the gate electrode and the porous alumina layer as masks. As an etching gas, a $CHF_3$ gas with the flow of 55 sccm is used, and etching is carried out under the conditions that the pressure is 55 mTorr and the supply power is 800 W.

The gate insulating film 404 is etched in a self-aligning manner by this step, and is processed into an island-like pattern as indicated by 411. At this time, the end portion (GI end portion) of the gate insulating film remains in such a shape protruding outside of the gate electrode. Besides, such a state is obtained that the active layer, which subsequently becomes source/drain regions, is exposed.

After this etching step is ended, the porous alumina layer 408 used as the mask is removed by using a solution of aluminum mixed acid (mixed solution of phosphoric acid, acetic acid, nitric acid, and water) the temperature of which is kept at 45° C. (FIG. 5A).

At this time, the selecting ratio of the porous alumina layer 408 to the tantalum oxide layer 409 is large, the tantalum oxide layer 409 is not etched. This state is obvious also from a SEM photograph shown in FIG. 33.

Figure 33:
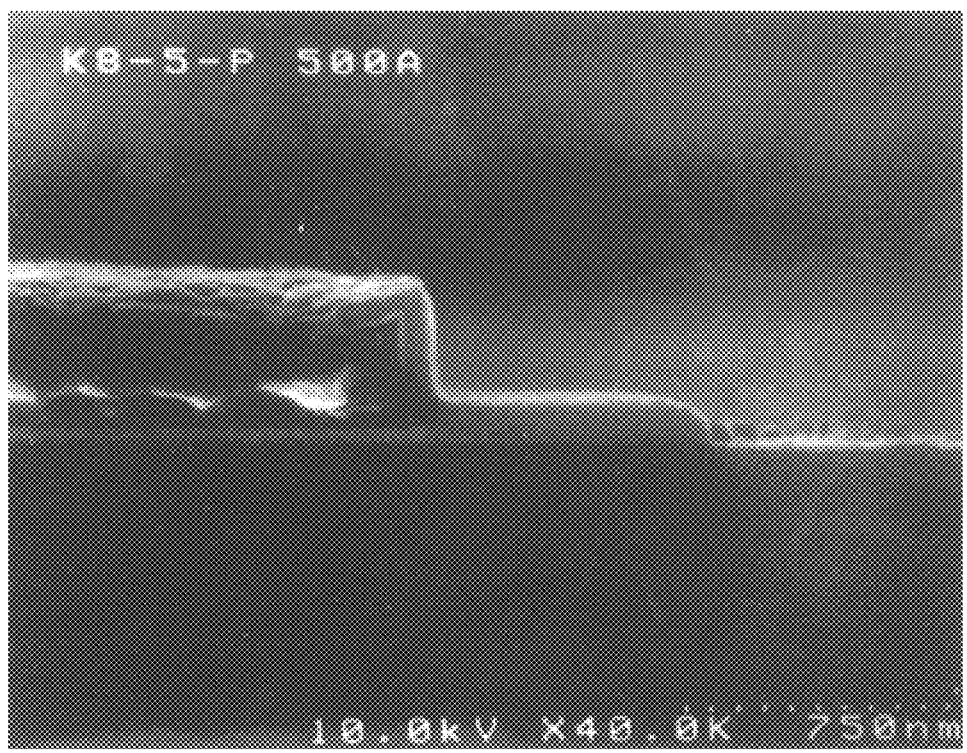
FIG. 33 is a SEM photograph showing the structure near a gate electrode.
Figures 1, 34A:
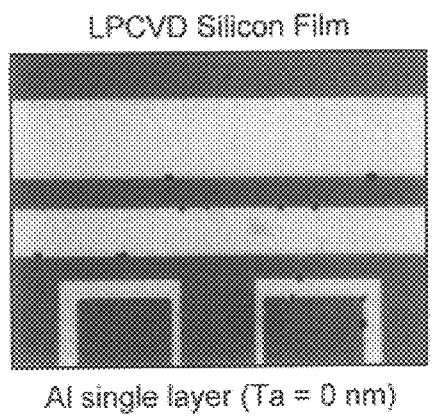
FIGS. 34A to 34C are photomicrographs showing the diffusion states of aluminum at a heat treatment.
Figures 2, 34A:
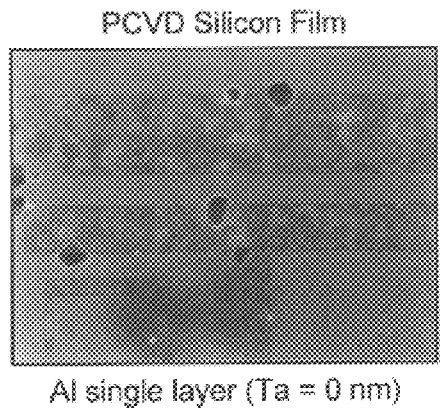
Figures 1, 34B:
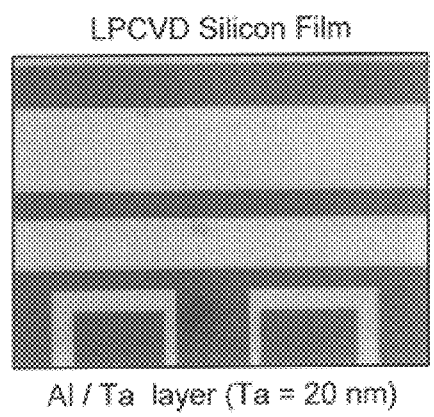
Figures 2, 34B:
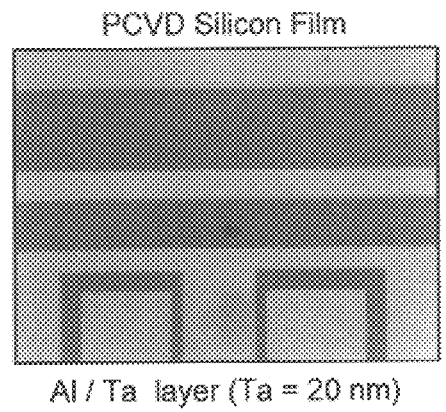
Figures 1, 34C:
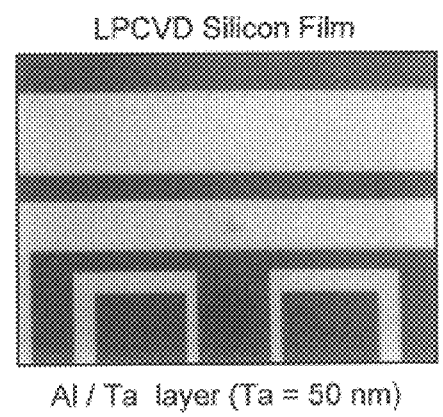
Figures 2, 34C:
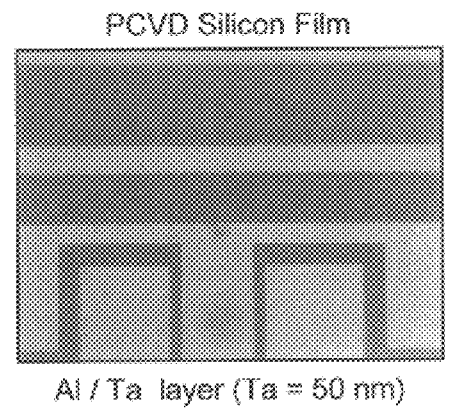

The SEM photograph of FIG. 33 shows the state where only the porous alumina layer 95 is removed from the state shown in FIG. 32A. It is ascertained from this photograph that the tantalum oxide layer remains in a hood-shape.

Figure 5A:
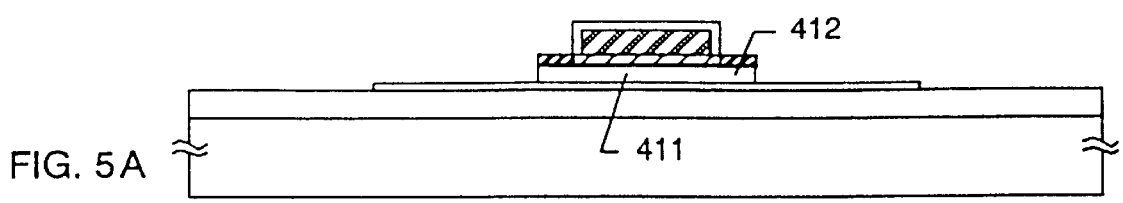
FIGS. 5A to 5D are views showing manufacturing steps of a TFT.
Figure 5B:
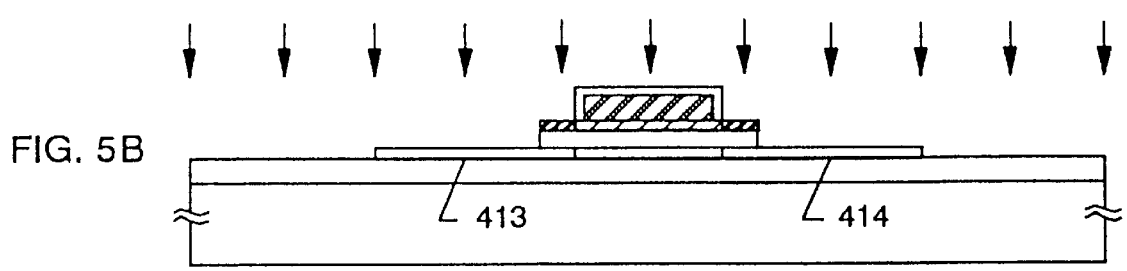

After the state of FIG. 5A is obtained in this way, a first impurity ion injection step is carried out by an ion implantation method or a plasma doping method. The first step is carried out at an acceleration voltage as high as 70 to 85 keV (FIG. 5B).

It is appropriate that if an N-channel TFT (NTFT) is manufactured, P (phosphorus) or As (arsenic) is selected, and if a P-channel TFT (PTFT) is manufactured, B (boron) is selected. In this embodiment, explanation will be given with phosphorus as an example.

Since the acceleration voltage is high in this step, an impurity ion is implanted through the tantalum oxide layer 409 and the GI end portion 412. That is, an impurity is also added under the region covered with the GI end portion and the like.

The impurity implanted under the GI end portion 412 in this step subsequently determines an impurity concentration in an LDD region. Thus, it is necessary for a user to determine a dosage at the ion implantation so that the LDD region contains an impurity at a desired concentration. In this embodiment, adjustment is made so that phosphorus of a concentration of $1\times10^{17}$ to $1\times10^{18}$ atoms/cm$^3$ is added under the GI end portion 412.

When the impurity ion implantation step as described above is carried out, low concentration impurity regions 413 and 414 are formed.

At this time, since the tantalum oxide layer 409 exists on the GI end portion 412, there is an advantage that damage at the ion implantation does not directly reach the gate insulating film. That is, it is possible to suppress occurrence of surplus trap levels in the gate insulating film.

Figure 5C:
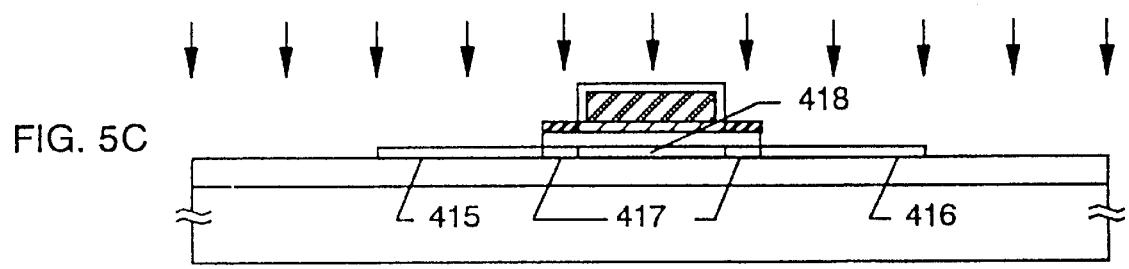

Next, a second ion implantation step is carried out at an acceleration voltage as low as 5 to 10 keV. In this step, since the acceleration voltage is low, the GI end portion 412 completely functions as a mask (since the tantalum oxide layer also exists, the masking effect is improved as compared with the technique disclosed in Japanese Patent Unexamined Publication No. Hei. 7-135318 which in turn corresponds to U.S. Pat. No. 5,598,284. An entire disclosure of No. Hei. 7-135318 and U.S. Pat. No. 5,598,284 is incorporated herein by reference)(FIG. 5C).

Thus, in this step, an impurity ion is added into only regions (source or drain region) indicated by 415 and 416. In this embodiment, adjustment is made so that phosphorus of a concentration of $1\times10^{20}$ to $1\times10^{21}$ atoms/cm$^3$ is added.

At the same time, the impurity region formed at the first ion implantation step remains as it is under the GI end portion 412, which becomes an LDD region 417. Thus, the contact portion between the source or drain region 415, 416 and the LDD region 417 is defined by the GI end portion (end portion of the tantalum oxide layer).

A region 418 where any ion has not been implanted in the first and second impurity ion implantation steps becomes an intrinsic or substantially intrinsic channel formation region which subsequently becomes a moving path of carriers.

Incidentally, the intrinsic region means a completely neutral region where electrons and holes completely balance with each other, and the substantially intrinsic region means a region containing an impurity to give an N type or a P type in a concentration range ($1\times10^{15}$ to $1\times10^{17}$ atoms/cm$^3$) where control of a threshold value can be made, or a region where the conductivity type is canceled by intentionally adding an impurity of reverse conductivity.

After the implantation of impurity ions into the active layer is ended in the manner described above, the impurities are activated by laser annealing, lamp annealing, or furnace annealing. At the same time, the damage at the ion implantation is repaired.

Next, an interlayer insulating film 419 is formed. As the interlayer insulating film 419, a silicon oxide film, a silicon nitride film, a silicon nitride oxide film, an organic resin film, or a lamination film of those may be used. As the organic resin film, polyimide, polyamide, polyimide amide, acryl, and the like can be enumerated.

After the interlayer insulating film 419 is formed, contact holes are formed, and a source electrode 420 and a drain electrode 421 are formed. In this embodiment, as a material for these electrodes, a lamination conductive layer made of titanium laluminum/titanium is used.

Figure 5D:
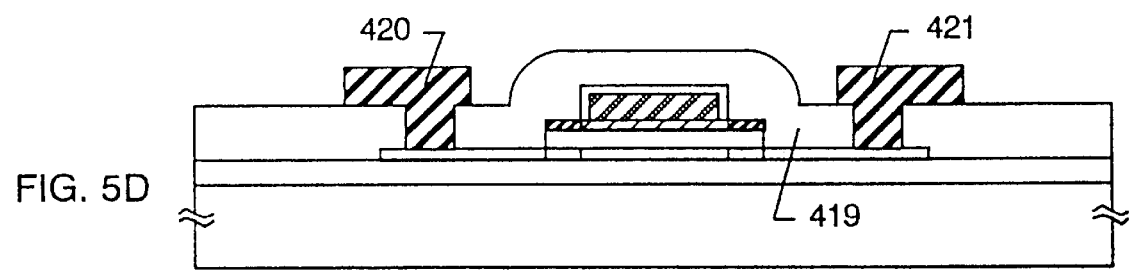

Finally, a hydrogenating process in a hydrogen atmosphere is carried out at about 350° C. for 2 hours, so that a hydrogen terminating process of the entire of a TFT is carried out. In this way, the TFT having the structure as shown in FIG. 5D is completed. In the thus manufactured TFT, since the tantalum layer exists between the gate electrode and the gate insulating film, it is possible to prevent a short circuit or the like from occurring between the two by a heat treatment on the way of manufacture.

Thus, it becomes possible to manufacture TFTs at an extremely high yield factor, and a high quality product rate can be secured even in manufacture of an AMLCD in which not less than one million TFTs are formed on the same substrate. With that, it is possible to lower the manufacturing cost of a liquid crystal module or a product (electronic equipment) having the liquid crystal module.

[Embodiment 2]

Embodiment 1, although the explanation has been given to the case, where the NTFT is manufactured, as an example, it is needless to say that the present invention can be applied to a PTFT. If well-known CMOS technique is used, it is also easy to constitute a MOS circuit in which an NTFT and a PTFT are complementarily combined.

In this embodiment, an example in which an active matrix substrate comprising a driving circuit constituted by CMOS circuits and a pixel matrix circuit constituted by NTFTs formed on the same substrate is manufactured, will be described with reference to FIG. 7.

Figure 7:
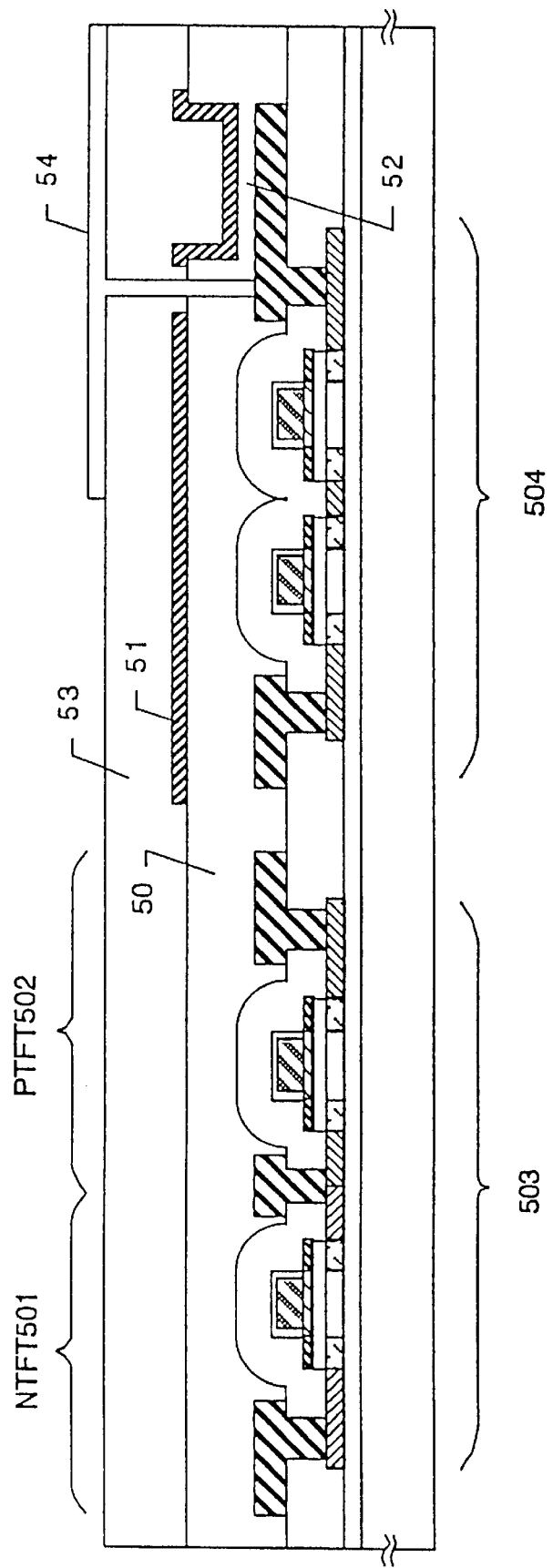
FIG. 7 is a view showing the structure of an active matrix substrate.
Figure 8A:
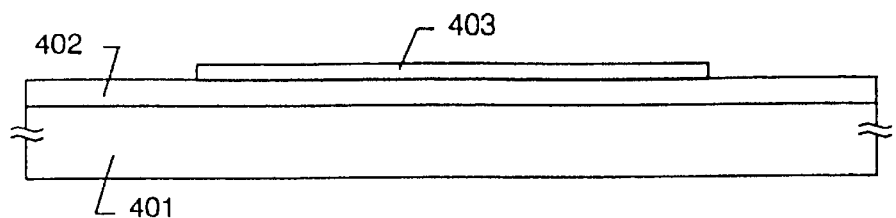
FIGS. 8A to 8E are views showing manufacturing steps of a TFT in embodiment 5.
Figure 8B:
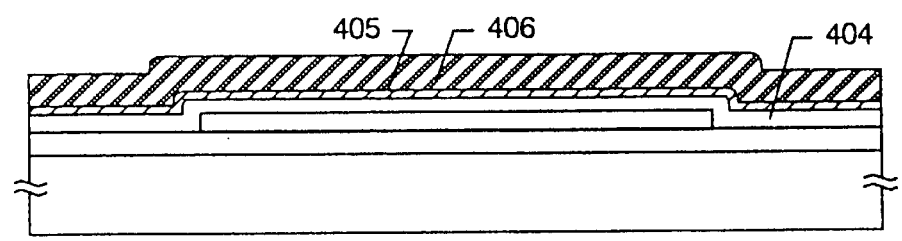
Figure 8C:
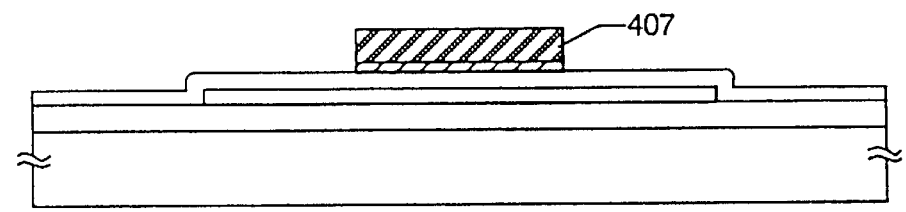
Figure 8D:
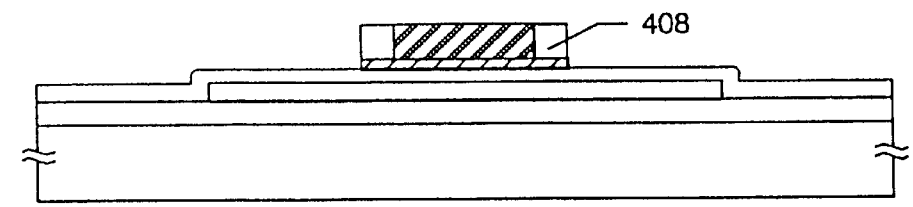
Figure 8E:
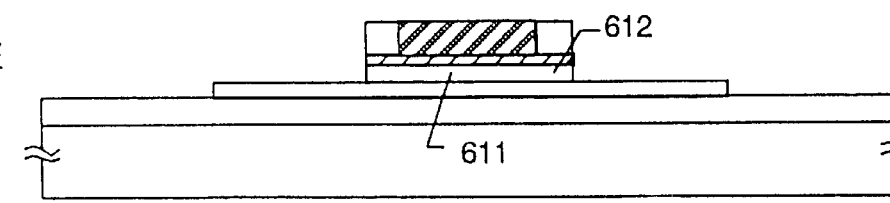

In FIG. 7, an NTFT 501 and a PTFT 502 constitute a CMOS circuit 503. As described before, if a well-known CMOS technique is used, this embodiment can be easily realized by almost the same steps as the embodiment 1.

A pixel TFT (in this embodiment, NTFT) 504 constituting the pixel matrix circuit can be realized by adding some steps to the manufacturing steps explained in the embodiment 1.

First, in accordance with the steps of the embodiment 1, the structure of FIG. 5D is obtained. Next, as shown in FIG. 7, a first flattened film 50 is formed. In this embodiment, a lamination structure of silicon nitride (50 nm)/silicon oxide (25 nm)/acryl (1 $\mu$m) is used as the first flattened film.

Since an organic resin film of acryl, polyimide, or the like is a solution coating type insulating film formed by a spin coating method, a thick film can be easily formed, and further, an extremely flat surface can be obtained. Thus, it is possible to form a film with a thickness of about 1 $\mu$m at a high throughput, and an excellent flat surface can be obtained.

Next, a black mask 51 made of a light shading conductive film is formed on the first flattened film 50. Before the black mask 51 is formed, the first flattened film 50 is etched to form a recess in which only the silicon nitride film of the lowermost layer remains.

If such a structure is made, the drain electrode and the black mask are close to each other through the silicon nitride film at the portion where the recess has been formed, and auxiliary capacitance 52 is formed there. Since silicon nitride has a high specific dielectric constant, and the film thickness is thin, large capacitance can be easily secured.

After the auxiliary capacitance 52 is formed in this way at the same time as the formation of the black mask 51, a second flattened film 53 is formed of an acryl film with a thickness of 1.5 $\mu$m. Although a large step difference occurs at a portion where the auxiliary capacitance 52 is formed, such a step difference can be sufficiently flattened.

Finally, a contact hole is formed in the first flattened film 50 and the second flattened film. 53, and a pixel electrode 54 made of a transparent conductive film (typically ITO) is formed. In this way, the pixel TFT 504 as shown in FIG. 7 can be manufactured.

If a conductive film having high reflectivity, typically aluminum or a material containing aluminum as its main ingredient is used for the pixel electrode, it is also possible to manufacture an active matrix substrate for a reflection type AMLCD.

Although the gate electrode of the pixel TFT in FIG. 7 has a double gate structure, the gate electrode may have a single gate structure or a multi gate structure such as a triple gate structure.

The structure of the active matrix substrate is not limited to the structure of this embodiment. Since the feature of the present invention exists in the structure of the gate electrode, a user may suitably determine the other structures.

[Embodiment 3]

Manufacturing steps of a TFT using the present invention will be described with reference to FIGS. 4A–4E, 5A–5C, 6A, and 6B. In this embodiment, an example in which an N-channel TFT (NTFT) is manufactured, is shown. The present invention has a feature in steps from formation of a gate electrode to formation of source/drain regions, and other portions can be formed by a well-known technique. Thus, the present invention is not limited to the manufacturing steps of this embodiment.

First, a glass substrate (Corning 1737; distortion point= 667° C.) was prepared as a substrate 401, and a silicon oxide film with a thickness of 200 nm was formed as an under film 402 on the substrate. An active layer 403 with a thickness of 45 nm was formed on the under film by a well-known means. The thickness of the active layer 403 is made 10 to 100 nm (preferably 15 to 75 nm, more preferably 20 to 45 nm) (FIG. 4A).

The active layer 403 was formed of a polycrystalline silicon film obtained by using a technique (Japanese Patent Unexamined Publication No. Hei. 6-232059, No. Hei. 7-321339, etc.) for obtaining a crystalline silicon film by using a material for facilitating crystallization of silicon. An entire disclosure of No. Hei. 6-232059 and No. Hei. 7-321339 is incorporated herein by reference. In this embodiment, nickel was used as the material for facilitating crystallization.

After the state of FIG. 4A was obtained in this way, a gate insulating film 404 made of a silicon nitride oxide film was formed, and further, a tantalum layer 405 with a thickness of 50 nm, and an aluminum layer 406 with a thickness of 350 nm were sequentially laminated. In this embodiment, as the aluminum layer 406, an aluminum layer containing scandium of 2 wt % was used.

It is appropriate that the tantalum layer 405 and the aluminum layer 406 are formed by a vapor phase method (typically, a sputtering method) (FIG. 4B).

Next, the tantalum layer 405 and the aluminum layer 406 were etched by a dry etching method or a wet etching method, and a lamination pattern 407 which became an original of a subsequent gate electrode was formed (FIG. 4C).

As etching gases for dry etching, if the gases are selectively used, for example, if a chlorine-based gas is used for etching of the aluminum layer and a fluorine-based gas is used for etching of the tantalum layer, a continuous process can be realized. In the case where the tantalum layer is as thin as about 50 nm, it is ascertained that the aluminum layer and the tantalum layer can be etched at the same time by the chlorine-based gas.

Although a resist mask (not shown) is used for patterning of the lamination pattern 407, if the surface of the aluminum layer is covered with a thin anodic oxidation film before the resist mask is formed, the adhesiveness is improved.

Next, while the resist mask remained, an anodic oxidation process with a reached voltage of 8 V was carried out in a solution of 3% oxalic acid, so that a porous alumina layer 408 with a thickness of 600 to 800 nm was formed. In this solution, the tantalum layer was not subjected to anodic oxidation but remained as it was, and only the aluminum layer was selectively subjected to anodic oxidation (FIG. 4D).

Moreover, after the not-shown resist mask was removed, an anodic oxidation process with a reached voltage of 80 V was carried out in an ethylene glycol solution containing 3% tartaric acid. In this process, both the aluminum layer and the tantalum layer were subjected to anodic oxidation (FIG. 4E).

With respect to the tantalum layer 405, only a portion being in contact with the porous alumina layer 408 was subjected to anodic oxidation, so that a tantalum oxide layer 409 was formed. This is because only that portion touched the electrolytic solution having permeated through the inside of the porous alumina layer 408.

With respect to the aluminum layer 406, a nonporous alumina layer 410 with a thickness of 100 to 120 nm is formed on its surface (inside of the porous alumina layer). The film thickness of the nonporous alumina layer 410 is determined by the reached voltage.

Here, FIG. 32A is a SEM photograph showing the state shown in FIG. 4E. In FIG. 32A, the SEM photograph shows a sample experimentally reproducing the state of FIG. 4E, which is magnified 40 thousands times, and shows the state near the porous alumina layer.

FIG. 32B is a schematic view of FIG. 32A. In FIG. 32B, reference numeral 90 denotes an under layer made of a silicon oxide film, 91 denotes a tantalum layer, 92 denotes an aluminum layer, 93 denotes a tantalum oxide layer, 94 denotes a nonporous alumina layer, and 95 denotes a porous alumina layer.

As shown in FIG. 32B, the surface of the aluminum layer 92 is covered with the nonporous alumina layer 94, and the porous alumina layer 95 is formed at the outside thereof. The tantalum oxide layer 93 is formed at the end portion (under the porous alumina layer) of the tantalum layer 91. The tantalum oxide layer serves to protect an LDD region obtained in a later step.

As long as inference is made from the photograph shown in FIG. 32A, it appears that the volume of the tantalum layer expands about twice when the tantalum layer is transformed into the tantalum oxide layer by the anodic oxidation process, and the thickness thereof becomes thick about 2 to 4 times (typically 3 times).

After such a structure was obtained, the gate insulating film 404 was etched by a dry etching method with the gate electrode and the porous alumina layer as masks. As an etching gas, a $CHF_3$ gas with a flow of 55 sccm was used, and etching was carried out under the conditions that the pressure was 55 mTorr and the supply power was 800 W.

The gate insulting film 404 was etched in a self-aligning manner by this step, and was processed into an island-like pattern as indicated by 411. At this time, the end portion (GI end portion) 412 of the gate insulating film remained in such a shape protruding outside of the gate electrode. Besides, such a state was obtained that the active layer which became source/drain regions later was exposed (FIG. 5A).

After this etching step was ended, the porous alumina layer 408 which had been used as the mask was removed by using a solution of aluminum mixed acid (mixed solution of phosphoric acid, acetic acid, nitric acid, and water) the temperature of which was kept at 45° C.

At this time, the selecting ratio of the porous alumina layer 408 to the tantalum oxide layer 409 is large, the tantalum oxide layer 409 is not etched. This state is obvious also from the SEM photograph shown in FIG. 33.

FIG. 33 is a SEM photograph showing the state where only the porous alumina layer 95 is removed from the state shown in FIG. 32A. It is ascertained from this photograph that the tantalum oxide layer remains in a hood-shape.

After the state of FIG. 5A was obtained in this way, a first impurity ion injection step was carried out by an ion implantation method or a plasma doping method. In this embodiment, an N-channel type TFT (NTFT) was manufactured, and P (phosphorus) was used as an impurity ion to give N-type conductivity. In any event, this doping step is not limited as long as an impurity ion to give the N-type conductivity is ionized and the ionized element is electrically accelerated and is injected. The first step was carried out at an acceleration voltage as high as 60 to 90 keV. It is appropriate that the dosage is made $1\times10^{13}$ to $8\times10^{15}$ atoms/cm$^2$ (FIG. 5B).

Since the acceleration voltage is high in this step, an impurity ion is implanted through the tantalum oxide layer 409 and the GI end portion 412. That is, an impurity was also added under a region covered with the GI end portion and the like.

The impurity implanted under the GI end portion 412 in this step subsequently determines an impurity concentration in an LDD region. Thus, it is necessary for a user to determine the dosage at the ion implantation so that the LDD region contains impurities of a desired concentration. In this embodiment, phosphorus of a concentration of $1\times10^{20}$ to $8\times10^{21}$ atoms/cm$^3$ was added in the source region and the drain region. Moreover, adjustment was made so that an impurity element (phosphorus) of a concentration of $1\times10^{16}$ to $1\times10^{17}$ atoms/cm$^3$ was added under the GI end portion 412.

When the impurity ion implantation step as described above is carried out, low concentration impurity regions 413 and 414 are formed. The dosage of phosphorus element was determined under the conditions that doped regions were made source and drain regions. It is preferable to carry out the step in such a condition that the doping concentration becomes larger than the concentration of a material (typically nickel) after gettering. By this, gettering of the material can be more effectively carried out in a subsequent step.

At this time, since the tantalum oxide layer 409 exists on the GI end portion 412, there is an advantage that damage at the ion implantation does not directly reach the gate insulating film. That is, it is possible to suppress occurrence of surplus trap levels in the gate insulating film.

Next, a second ion implantation step was carried out at an acceleration voltage as low as 5 to 10 keV. In this step, since the acceleration voltage is low, the GI end portion 412 completely functions as a mask (since the tantalum oxide layer also exists, the masking effect is improved as compared with the technique disclosed in Japanese Patent Unexamined Publication No. Hei. 7-135318 which in turn corresponds to U.S. Pat. No. 5,598,284. An entire disclosure of No. Hei. 7-135318 and U.S. Pat. No. 5,598,284 is incorporated herein by reference) (FIG. 5C).

Thus, in this step, an impurity ion is added into only regions (source region or drain region) indicated by 415 and 416. In this embodiment, adjustment was made so that phosphorus of a concentration of $1\times10^{20}$ to $1\times10^{21}$ atoms/cm$^3$ was added.

At the same time, the impurity region formed at the first ion implantation step remains as it is under the GI end portion 412, which becomes an LDD region 417. Thus, the contact portion between the source or drain region 415, 416 and the LDD region 417 is defined by the GI end portion (end portion of the tantalum oxide layer).

A region 418 where any impurity has not been implanted in the first and second impurity ion implantation steps becomes an intrinsic or substantially intrinsic channel formation region which subsequently becomes a moving path of carriers.

Incidentally, the intrinsic region means a completely neutral region where electrons and holes completely balance with each other, and the substantially intrinsic region means a region containing an impurity to give an N type or a P type within a concentration range ($1\times10^{15}$–$1\times10^{17}$ atoms/cm$^3$) where control of a threshold value can be made, or a region where the conductivity type is canceled by intentionally adding an impurity of reverse conductivity type.

After the steps of ion implantation into the source and drain regions are ended in the manner described above, a heat treatment in an inert gas atmosphere is next carried out.

In the prior art (single layer of aluminum material), since the heat resistance of the aluminum material is low, a heat treatment for a short time at a temperature of about 450° C. has been merely carried out. In addition, in the conventional structure, even in a heat treatment at about 450° C., there is a high possibility that aluminum atoms diffuse in a gate insulating film and an active layer, and there has been a high possibility that lowering and irregularity of TFT characteristics are caused.

On the contrary, in this embodiment, since the tantalum layer provided as the lower layer is used as a blocking layer against aluminum atoms which have low heat resistance and are apt to diffuse, it becomes possible to carry out a heat treatment for a long time at a temperature of not lower than 450° C., preferably 500 to 650° C. In this embodiment, a heat treatment in a nitrogen atmosphere was carried out at 550° C. for 2 hours (FIG. 6A).

Figure 6A:
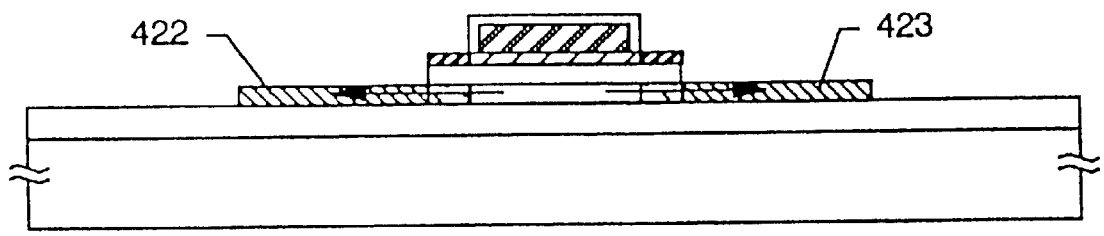
FIGS. 6A and 6B are views showing manufacturing steps of a TFT.

By the above heating step, the material is gettered by the phosphorus element in the process where the material diffuses in the direction indicated by an arrow in FIG. 6A. Reference numeral 422 denotes a source region containing the material of a high concentration, and 423 denotes a drain region containing the material of a high concentration. As a result, the concentration of the material in the channel formation region and the high resistance region could be lowered. Incidentally, the conventional temperature range (300 to 450° C.) was insufficient to carry out gettering.

In the case where nickel is used as the material for facilitating crystallization, phosphorus and nickel form various compounds, such as NiP, NiP$_2$, NiP$_3$. Besides, since its bonding state is extremely stable, in this embodiment, nickel was used as the material for facilitating crystallization, and phosphorus was used as the element for gettering. FIGS. 31A and 31B show distribution states of the nickel element (FIG. 31A) and the phosphorus element (FIG. 31B) after the heat treatment.

In the stage of the above heat treatment, the improvement of crystallinity of the regions 415, 416 and 417 shown in FIG. 5C, where crystallinity was damaged by the implantation of accelerated impurity ions, is progressed. This greatly relates to the fact that nickel is concentrated into the regions 415, 416, and 417. That is, in the regions 422 and 423 in FIG. 6A where the nickel element is concentrated, crystallization by the action of the nickel element is highly facilitated by that, so that damage of crystal structure caused at the doping of the phosphorus element is repaired.

In addition, by the above heat treatment, activation of impurities in the source region 422 and the drain region 423 is carried out at the same time as the gettering. In the prior art, since the heat resistance of the aluminum material is low, only a heat treatment at a temperature of about 450° C. is carried out, so that an activation rate of the dopant (phosphorus) is low.

In the prior art, as a step of repairing damage of crystal structure caused at ion implantation or a step of activating an impurity, another step (laser annealing, intense light annealing, etc.) is added and is carried out. Also in this embodiment, such a structure may be adopted that laser annealing, intense light annealing, or the like of surface or back surface irradiation is carried out at the same time as the heat treatment. Alternatively, such a structure may be adopted that laser annealing, intense light annealing, or the like of surface or back surface irradiation is added as another step, so that a more excellent active layer is obtained.

That is, according to this embodiment, in the heat treatment after doping, 1) the gettering process for lowering the material concentration in the channel formation region and the high resistance region,
2) the activating process of impurities in the source and drain regions, and
3) the annealing process for repairing the damage of crystal structure caused at the ion implantation are carried out at the same time.

Next, an interlayer insulating film 424 is formed. As the interlayer insulating film 424, a silicon oxide film, a silicon nitride film, a silicon nitride oxide film, an organic resin film, or a lamination film of those may be used. As the organic resin film, polyimide, polyamide, polyimide amide, acryl, and the like can be enumerated.

After the interlayer insulating film 424 is formed, contact holes are formed, and a source electrode 425 and a drain electrode 426 are formed. In this embodiment, as the electrode material, a lamination conductive layer made of titanium/aluminum/titanium is used.

Figure 6B:
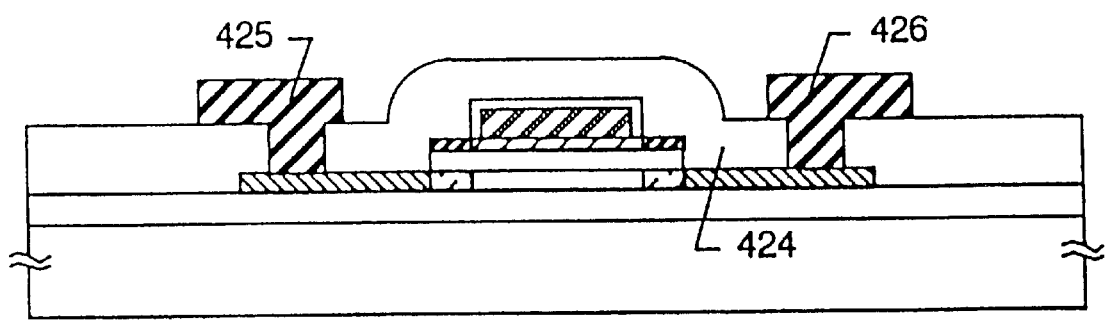

Finally, a hydrogenating process in a hydrogen atmosphere is carried out at about 350° C. for 2 hours, so that a hydrogen terminating process of the entire of a TFT is carried out. In this way, the TFT having the structure as shown in FIG. 6B is completed. In the thus manufactured TFT, since the tantalum layer exists between the gate electrode and the gate insulating film, it is possible to prevent diffusion or the like of aluminum atoms by a heat treatment on the way of manufacture.

Thus, it becomes possible to manufacture TFTs at an extremely high yield factor, and a high quality product rate can be secured even in manufacture of an AMLCD in which not less than one million TFTs are manufactured on the same substrate. With that, it is possible to lower the manufacturing cost of a liquid crystal module and a product (electronic equipment) having the liquid crystal module.

[Embodiment 4]

In the embodiment 3, although the explanation has been given to the case, where the NTFT is manufactured, as an example, it is needless to say that the present invention can be applied to a PTFT. An example of manufacturing steps of the P-channel type TFT (PTFT) and manufacturing conditions will be described in brief below.

First, an impurity ion (boron) to impart P-type conductivity is implanted into source and drain regions where phosphorus ions were implanted. As a doping gas, diborane diluted to 5% with hydrogen is used. The acceleration voltage is made 60 to 90 keV, and the dosage is made $1 \times 10^{13}$ to $8 \times 10^{15}$ atoms/cm$^2$. It is important to adjust the dosage such that the concentration obtained by subtracting the maximum value of the concentration of phosphorus from the maximum value of the concentration of boron implanted in the source and drain regions becomes $3 \times 10^{19}$ to $3 \times 10^{21}$ atoms/cm$^3$. As a result, the conductivity type of the source and drain regions is inverted, so that P-type impurity regions can be formed. Incidentally, the step may be modified such that the conductivity type of an LDD region is also inverted.

If a well-known CMOS technique is used, it is easy to constitute a CMOS circuit in which an NTFT and a PTFT are complementarily combined.

In this embodiment, an example in which an active matrix substrate comprising a driving circuit constituted by CMOS circuits and a pixel matrix circuit constituted by NTFTs formed on the same substrate is manufactured, will be described with reference to FIG. 7.

In FIG. 7, an NTFT 501 and a PTFT 502 constitute a CMOS circuit 503. If a well-known CMOS technique is used as described before, the circuit can be easily realized in almost the same steps as the embodiment 3.

A pixel TFT (in this embodiment, NTFT) 504 constituting the pixel matrix circuit can be realized by adding some steps to the manufacturing steps explained in the embodiment 3.

First, in accordance with the steps of the embodiment 3, the structure of FIG. 6B is obtained. Next, as shown in FIG. 7, a first flattened film 50 is formed. In this embodiment, a lamination structure of silicon nitride (50 nm)/silicon oxide (25 nm)/acryl (1 $\mu$M) is used as the first flattened film.

Since an organic resin film of acryl, polyimide, or the like is a solution coating type insulating film formed by a spin coating method, a thick film can be easily formed, and further, an extremely flat surface can be obtained. Thus, it is possible to form a film with a thickness of about 1 $\mu$m at a high throughput, and an excellent flat surface can be obtained.

Next, a black mask 51 made of a light shading conductive film is formed on the first flattened film 50. Prior to the formation of the black mask 51, the first flattened film 50 is etched to form a recess in which only the silicon nitride film of the lowermost layer remains.

If such a state is made, the drain electrode and the black mask are close to each other through only the silicon nitride film at the portion where the recess was formed, and auxiliary capacitance 52 is formed there. Silicon nitride has a high specific dielectric constant, and the film thickness is thin, so that large capacitance can be easily secured.

After the auxiliary capacitance 52 is formed in this way at the same time as the formation of the black mask 51, a second flattened film 53 is formed of an acrylic film with a thickness of 1.5 $\mu$m. Although a large step difference occurs at the portion where the auxiliary capacitance 52 is formed, such a step can also be sufficiently flattened.

Finally, a contact hole is formed in the first flattened film 50 and the second flattened film 53, and a pixel electrode 54 made of a transparent conductive film (typically ITO) is formed. In this way, the pixel TFT 504 as shown in FIG. 7 can be manufactured.

If a conductive film having high reflectivity, typically aluminum or a material containing aluminum as its main ingredient is used for the pixel electrode, it is also possible to manufacture an active matrix substrate for a reflection type AMLCD.

Although the gate electrode of the pixel TFT in FIG. 7 has a double gate structure, the gate electrode may have a single gate structure or a multi gate structure such as a triple gate structure.

The structure of the active matrix substrate is not limited to the structure of this embodiment. Since the feature of the present invention exists in the structure of the gate electrode, a user may suitably determine other structures.

[Embodiment 5]

In this embodiment, an example in which a TFT is formed through steps different from the embodiment 3 will be described with reference to FIGS. 4 and 8 to 10. Incidentally, the structure of this embodiment can be used for the structure of the embodiment 4.

Since steps of this embodiment are the same as those of the embodiment 3 up to the step of the state of FIG. 4D, their explanation will be omitted. FIGS. 4A–4D correspond to FIGS. 8A–8D. An insulating film 404 is selectively removed to obtain the state of FIG. 8E. In this state, a region of an active layer 403 which is not in contact with a gate insulating film 611 is exposed. An end portion of the gate insulating film 611 is denoted as 612.

Figure 9A:
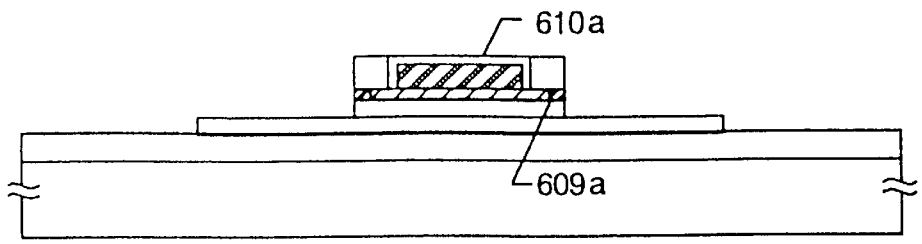
FIGS. 9A to 9E are views showing manufacturing steps of the TFT in embodiment 5.

Next, an anodic oxidation process with a reached voltage of 10 to 20 V is carried out in an ethylene glycol solution containing tartaric acid of 3%. In this process, both an aluminum layer and a tantalum layer are subjected to anodic oxidation, and thin anodic oxidation films are formed (FIG. 9A).

With respect to a tantalum layer 405, only a portion being in contact with a porous alumina layer 408 is subjected to anodic oxidation, so that a thin tantalum oxide layer 609a is formed.

With respect to an aluminum layer 406, a thin nonporous alumina layer 610a with a thickness of 10 to 30 nm is formed on its surface (inside of the porous alumina layer). The film thickness of the nonporous alumina layer 610a is determined by the reached voltage.

Figure 9B:
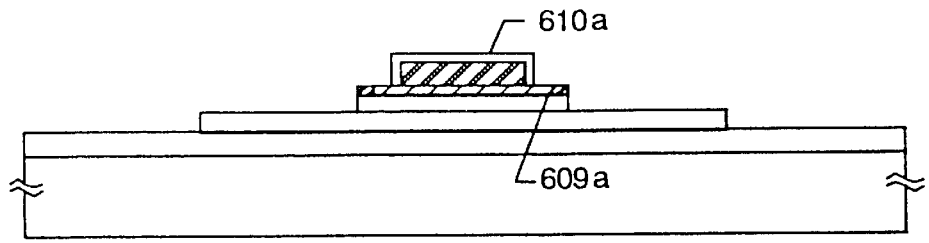

The porous alumina layer 408 is selectively removed so that the state of FIG. 9B is obtained. In this state, the tantalum layer is exposed.

Figure 9C:
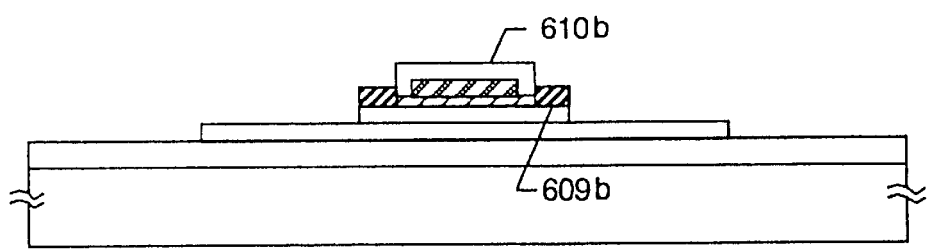

Next, an anodic oxidation process with a reached voltage of 80 V is again carried out in an ethylene glycol solution containing tartaric acid of 3%. In this process, both the aluminum layer and the tantalum layer are subjected to anodic oxidation, and thick anodic oxidation films 610b and 609b are formed (FIG. 9C).

Like this, although three anodic oxidation processes are carried out in this embodiment, the feature of this embodiment is that when the third anodic oxidation is carried out, the tantalum layer is exposed, so that the layer is made to be easily transformed into a tantalum oxide layer, and the film thickness is made thick about 2 to 4 times (typically 3 times).

It is preferable to make such a structure that the tantalum layer existing above a subsequent LDD region is completely transformed into the tantalum oxide layer (609b), so that a normal operation as a TFT is performed.

Figure 9D:
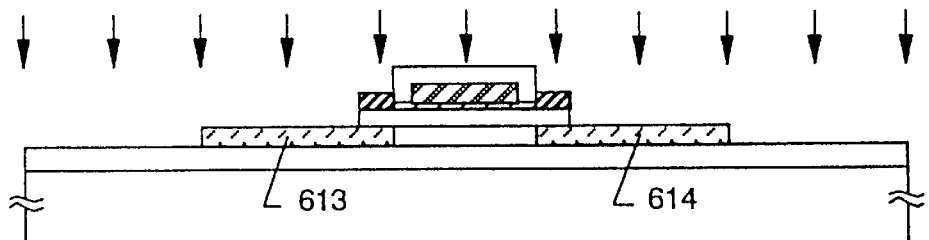

Next, as shown in FIG. 9D, an implantation step of an impurity ion by a high acceleration voltage is carried out. This step is a step for forming the subsequent LDD region as described in the embodiment 3. Thus, adjustment is made so that an impurity (phosphorus element) concentration in low concentration impurity regions 613 and 614 becomes about $1 \times 10^{16}$ to $1 \times 10^{17}$ atoms/cm$^3$.

Figure 9E:
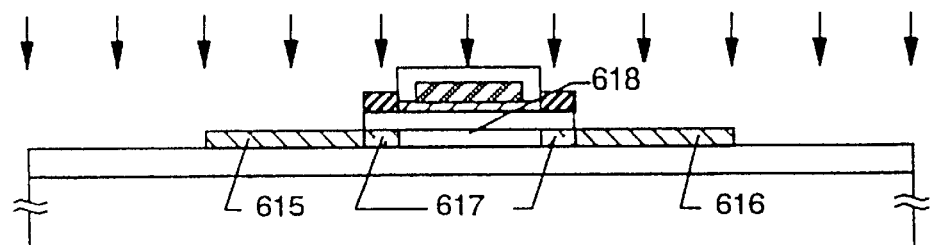

Next, as shown in FIG. 9E, an implantation step of an impurity ion at a low acceleration voltage is carried out. In this embodiment, adjustment was made so that phosphorus was added into a source region or a drain region at a concentration of $1 \times 10^{20}$ to $1 \times 10^{21}$ atoms/cm$^3$. In this step, since the region where the tantalum oxide layer 609b exists, functions as a mask, the foregoing low concentration impurity region remains under the region.

As a result, a source region 615, a drain region 616, an LDD region 617, and a channel formation region 618 are formed. Also in this case, since the tantalum oxide layer 609b exists over the LDD region 617, damage received by the GI at the ion implantation is lowered at that portion. Incidentally, the concentration distribution similar to that shown in FIGS. 31A and 31B was obtained.

Figure 10A:
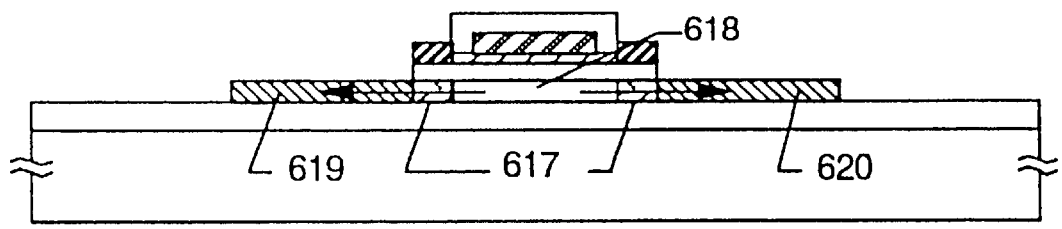
FIGS. 10A and 10B are views showing manufacturing steps of the TFT in embodiment 5.

Thereafter, similarly to the embodiment 3, a heat treatment (550° C., 2 hours) is carried out, so that activation and recovery of crystal structure are carried out at the same time as gettering (FIG. 10A). Reference numeral 619 denotes a source region containing a material of a high concentration, and 620 denotes a drain region containing a material of a high concentration.

Figure 10B:
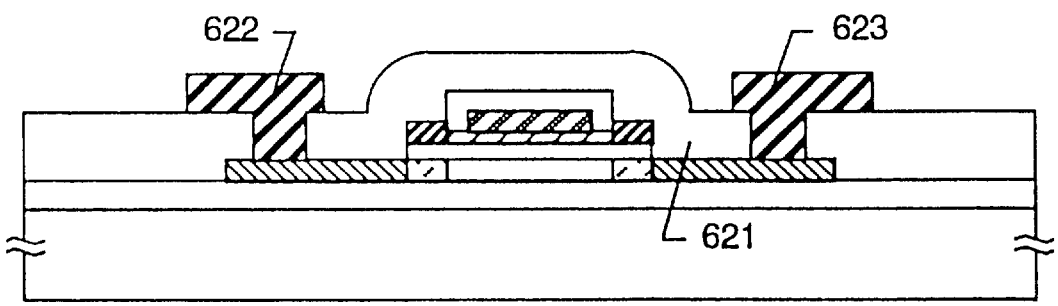

Similarly to the embodiment 3, an interlayer insulating film 621, a source electrode 622, and a drain electrode 623 are formed, and a hydrogenating step is finally carried out, so that a TFT as shown in FIG. 10B is completed.

As another structure, it is also possible to adopt such a structure that the gate insulating film is made to remain on the whole surface of the active layer, a source region and a drain region are formed, and a heat treatment is carried out.

[Embodiment 6]

Figure 11A:
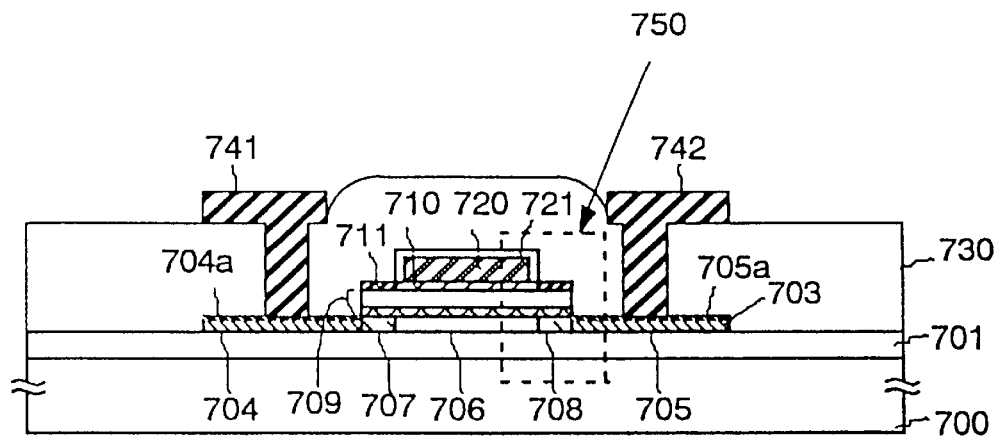
FIGS. 11A and 11B are sectional structural views of a TFT in embodiment 6.
Figure 11B:
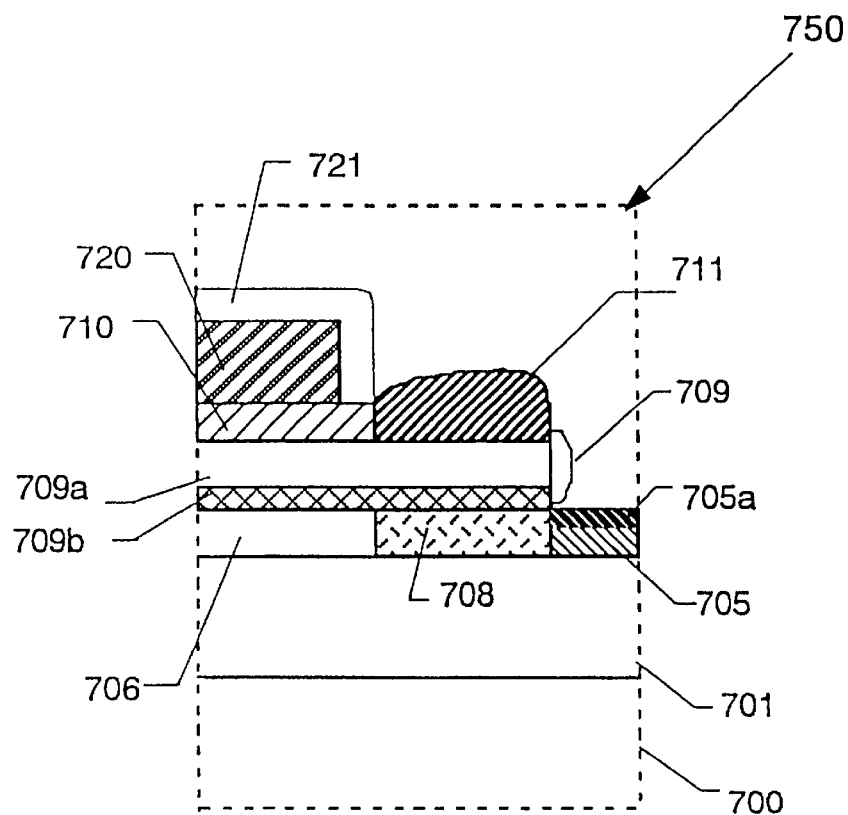

In this embodiment, a method of manufacturing a TFT constituting a semiconductor circuit will be described. FIG. 11A is a sectional structural view schematically showing a TFT of this embodiment. FIG. 11B is an enlarged view of a rectangular region designated by 750 in FIG. 11A.

An under film 701 is formed on the surface of a substrate 700. The TFT includes an active layer 703 formed on the under film 701, a gate insulating film 709, a gate electrode, an interlayer insulating film 730, a source electrode 741 and a drain electrode 742 connected to source/drain regions.

The active layer 703 is made of a polycrystalline silicon thin film. A source region 704, a drain region 705, a channel formation region 706, and high resistance regions 707 and 708 are formed in the active layer, and silicide layers 704a and 705a are formed on the surfaces of the source region 704 and the drain region 705, respectively.

The gate insulating film 709 is formed of a thermal oxidation film 709b obtained by thermal oxidation of the surface of the active layer 703, and a deposited insulating film 709a deposited by a vapor phase method (CVD). The gate electrode includes a tantalum layer 710 and an aluminum layer 720, and the tantalum layer 710 and the aluminum layer 720 include a tantalum oxide layer 711 and a nonporous alumina layer 721, which are obtained by anodic oxidation, respectively.

Hereinafter, a method of manufacturing a TFT will be described with reference to FIGS. 12 to 14. First, a substrate (in this embodiment, a quartz substrate) 800 having high heat resistance is prepared. An insulating silicon film with a thickness of 300 nm is formed as an under film 801 on the surface of the substrate 800. The insulating silicon film is one of a silicon oxide film ($SiO_x$), a silicon nitride film ($Si_xN_y$), and a silicon nitride oxide film ($SiO_xN_y$), or a lamination film of those.

It is satisfactory if the heat resistance temperature of the substrate 800 is such a temperature that the substrate can withstand a subsequent thermal oxidation step. If the distortion temperature is not lower than 750° C., a glass substrate (typically, material called crystallized glass, glass ceramics, or the like) can also be used. In that case, it is effective if the under film is formed by a low pressure CVD method to cover the whole surface of the substrate with an insulating silicon film, since diffusion of constituents from the glass substrate can be suppressed.

As the under film 801, it is also possible to use an insulating film obtained by covering the whole surface of the substrate 800 with an amorphous silicon film and by completely transforming the amorphous film into a thermal oxidation film. In the case where a silicon substrate is used, the under film 801 is formed by thermally oxidizing the surface of the silicon substrate.

Figure 12A:
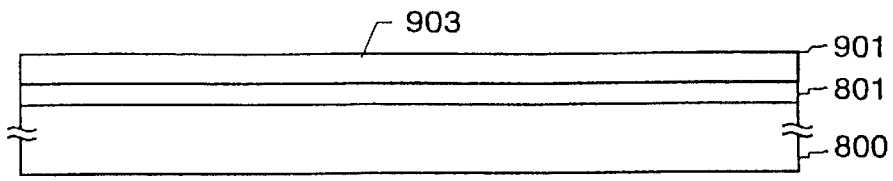
FIGS. 12A to 12F are views showing manufacturing steps of a TFT.

After the substrate having the insulating surface is prepared in this way, an amorphous silicon film 901 is formed by a low pressure CVD method. It is appropriate that the thickness of the amorphous silicon film 901 is made 20 to 100 nm (preferably 40 to 75 nm). In this embodiment, the thickness of the formed film is made 65 nm. If film quality comparable with the amorphous silicon film formed by the low pressure CVD method can be obtained, a plasma CVD method may be used (FIG. 12A).

Next, a mask insulating film 901 made of a silicon oxide film with a thickness of 120 nm is formed on the amorphous silicon film 901. An opening portion 902a is provided in the mask insulating film 902 by patterning.

Next, in accordance with a technique disclosed in Japanese Patent Unexamined Publication No. Hei. 8-78329, an adding step of a catalytic element for facilitating crystallization is carried out. In this embodiment, nickel is selected as the catalytic element, and a solution obtained by dissolving nickel acetate containing nickel of 10 ppm in weight in an ethanol solution is applied by a spin coating method. An entire disclosure of No. Hei. 8-78329 is incorporated herein by reference.

Of course, other than nickel, it is also possible to use one kind or plural kinds of elements selected from cobalt (Co), iron (Fe), palladium (Pd), platinum (Pt), copper (Cu), gold (Au), germanium (Ge), and lead (Pb).

Figure 12B:
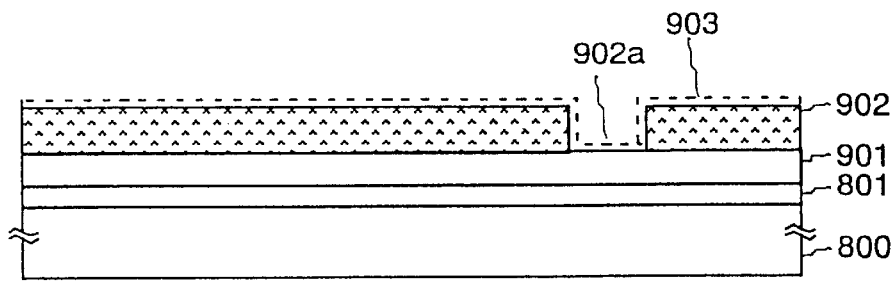

In this way, a nickel containing layer 903 is formed on the surface of the mask insulating film 902. At this time, such a state is made that nickel is in contact with the amorphous silicon film 901 at the opening portion 902a provided in the mask insulating film 902 (FIG. 12B).

Figure 12C:
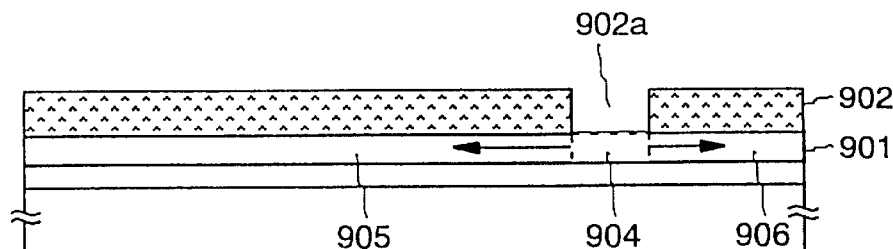

Next, after a dehydrogenating process is carried out by a heat treatment at about 450° C. for 1 hour, a heat treatment in an inert gas atmosphere, a hydrogen atmosphere, or an oxygen atmosphere is carried out at 500 to 700° C. (typically 550 to 650° C., preferably 570° C.) for 4 to 24 hours so that the amorphous silicon film 901 is crystallized. In this embodiment, a heat treatment at 570° C. for 14 hours is carried out so that crystallization is made to progress (FIG. 12C).

Crystallization of the amorphous silicon film 901 progresses first from nuclei generated in a region (nickel added region) 904 where nickel was added, and crystal regions (here, called lateral growth regions) 905 and 906 grown almost in parallel to the substrate surface of the substrate 800 are formed. Since respective crystal grains in the lateral growth regions 905 and 906 are collected in a relatively uniform state, the lateral growth region has an advantage that total crystallinity is superior.

Figure 12D:
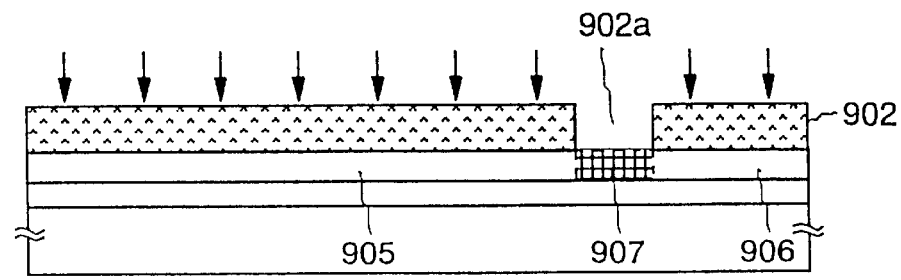

After the crystallizing step is ended, P (phosphorus) is added while the mask insulating film 902 is effectively used as a mask as it is, so that a phosphorus added region 907 is formed. It is preferable that phosphorus is added in the added region 907 so that phosphorus is contained at a concentration of $1\times10^{19}$ to $1\times10^{21}$ atoms/cm$^3$ (about 10 times that of nickel) (FIG. 12D).

In this embodiment, in order to remove nickel remaining in the lateral growth regions 905 and 906, gettering power of phosphorus is used. Although another element in group 15, such as arsenic or antimony, may be used other than phosphorus, phosphorus had high gettering power.

In this embodiment, although a plasma doping method is used as an adding step of phosphorus, either one of an ion injection method such as an ion implantation method or a plasma doping method, a method of using diffusion from a vapor phase, and a method of using diffusion from a solid phase may be used. Although the mask insulating film 902 used as a mask in the adding step of phosphorus may be patterned to provide a new opening portion, if the mask insulating film 902 is used as it is, a throughput can be improved.

Figure 12E:
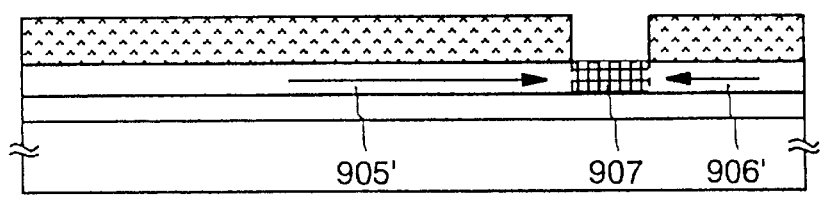

After the phosphorus added region 907 is formed, a heat treatment is carried out at 500 to 800° C. (preferably 600 to 650° C.) for 2 to 24 hours (preferably, 8 to 15 hours) so that nickel in the lateral growth regions 905 and 906 are moved into the phosphorus added region 907 (moving direction is indicated by an arrow). In this way, lateral growth regions 905' and 906' in which the concentration of nickel is lowered to $5\times10^{17}$ atoms/cm$^3$ or less (preferably $2\times10^{17}$ atoms/cm$^3$ or less) are obtained (FIG. 12E).

Incidentally, in the present circumstances, since the detecting lower limit of the SIMS (Secondary Ion Mass Spectroscopy) is about $2\times10^{17}$ atoms/cm$^3$, it is impossible to investigate the concentration lower the value. However, if the gettering step shown in this embodiment is carried out, it is inferred that the concentration of nickel in the lateral growth regions 905' and 906' is lowered at least down to about $1\times10^{14}$ to $1\times10^{15}$ atoms/cm$^3$.

Figure 12F:
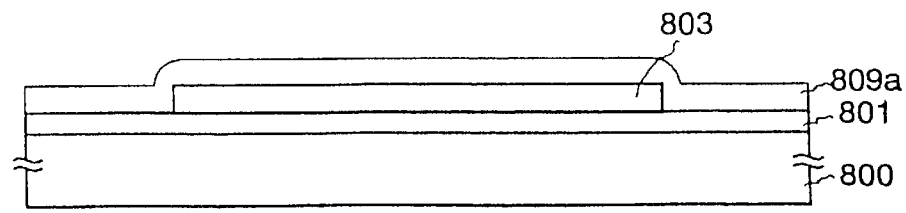

In this way, after the gettering step of nickel is ended, the mask insulating film 902 is removed, and then, an active layer 803 is formed by using only the lateral growth regions 905' and 906' as shown in FIG. 12F. At this time, it is desirable to completely remove the region 907 where nickel was gettered. By this, it is possible to prevent nickel from reversely diffusing into the active layer 803 again. For explanation, although only one active layer 803 is shown in the drawing, a plurality of active layers are simultaneously formed on the substrate 800 in conformity with TFTs constituting a semiconductor circuit.

Next, by a plasma CVD method or a low pressure CVD method, a deposited insulating film 809a made of an insulating silicon film is formed so as to cover the active layer 803. It is appropriate that the thickness of the insulating film 809a is made 50 to 150 nm. As the insulating silicon film, it is appropriate that a silicon oxide film, a silicon nitride film, or a silicon nitride oxide film is formed.

Figure 13A:
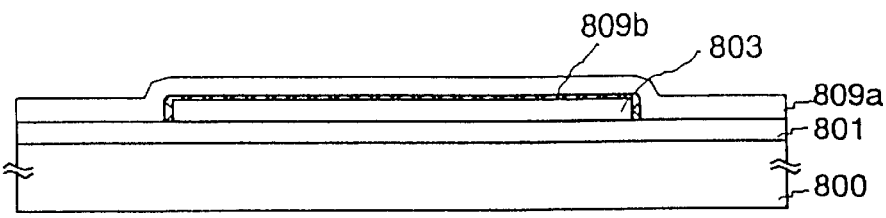
FIGS. 13A to 13E are views showing manufacturing steps of the TFT.
Figure 13B:
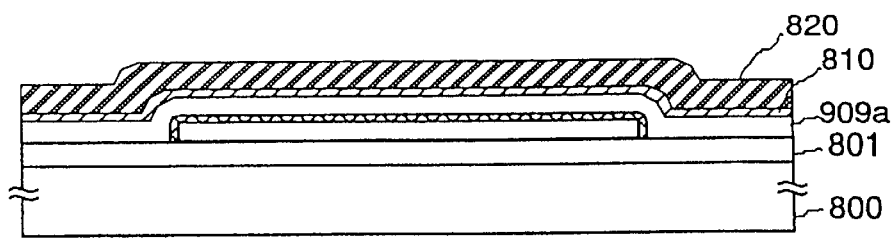

As shown in FIG. 13A, after the deposited insulating film 809a is formed, a heat treatment is carried out in an oxidizing atmosphere at 800 to 1100° C. (preferably 950 to 1050° C.) to oxidize the surface of the active layer 803, so that a thermal oxidation film 809b is formed at an interface between the active layer 803 and the deposited insulating film 809a.

It is appropriate that the oxidizing atmosphere is made a dry $O_2$ atmosphere, a wet $O_2$ atmosphere, or an atmosphere containing a halogen element (typically hydrogen chloride).

In the case where the halogen element is made contained, if the insulating film 809a on the active layer 803 is thin, the gettering effect of nickel by the halogen element can also be expected.

With respect to the temperature and time of the thermal oxidation step, it is appropriate that optimum conditions are determined in view of the thickness of the thermal oxidation film and the throughput. This embodiment adopts the condition (950° C., 30 minutes) in which the thermal oxidation film 809a with a thickness of 50 nm is formed. At the same time, the thickness of the active layer is decreased by 25 nm, and the final thickness of the active layer becomes 40 nm.

The structure in which thermal oxidation is carried out after the deposited insulating film 809a is formed, has an effect to prevent phosphorus from diffusing through a vapor phase. This phosphorus means phosphorus added before the gettering step (here, it means phosphorus contained in the under film), and it is possible to prevent the phosphorus from diffusing into the atmosphere at the thermal oxidation step and from being again added into the active layer 803 (also called auto-doping of phosphorus).

Of course, by thermally oxidizing the interface between the active layer 803 and the deposited insulating film 809a, interfacial levels are greatly decreased, so that the thermal oxidation also serves to remarkably improve the interfacial characteristics. Moreover, the film quality of the deposited insulating film 809a formed by a CVD method can be improved, lowering of a photo-leak current is also expected since the active layer 803 is made thin, and defects in the crystal grain of polycrystalline silicon constituting the active layer 803 are also lowered.

After the state of FIG. 13A is obtained in this way, a tantalum layer 810 with a thickness of 50 nm and an aluminum layer 820 with a thickness of 400 nm are sequentially laminated by a sputtering method. As the aluminum layer 820, an aluminum material containing scandium of 2 wt % is used. If the thickness of the tantalum layer 810 is not less than 20 nm, it functions as a barrier layer. However, if the thickness is too much, the asperity of the TFT becomes large. Thus, it is appropriate that the thickness is made about 20 to 100 nm (FIG. 13H).

Next, a photoresist mask 909 is formed, and the tantalum layer 810 and the aluminum layer 820 are etched by a dry etching method or a wet etching method, so that a lamination pattern 910 which becomes an original of a subsequent gate electrode is formed. In this embodiment, the gate electrode and gate wiring line for inputting signals to the gate electrode are integrally formed. In the drawing, only the gate electrode intersecting with the active layer of the TFT is shown, the lamination pattern 910 is formed in conformity with the pattern of the gate electrode and the gate wiring line.

Figure 13C:
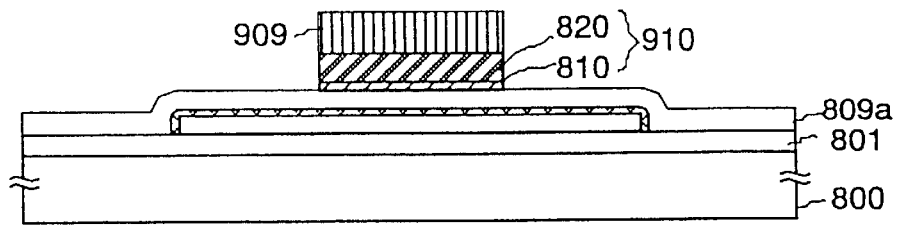

As etching gases for dry etching, if the gases are selectively used, for example, if a chlorine-based gas is used for etching of the aluminum layer 820 and a fluorine-based gas is used for etching of the tantalum layer 810, a continuous process can be realized. Incidentally, in the case where the tantalum layer 810 is as thin as about 50 nm, it is ascertained that the aluminum layer 820 and the tantalum layer 810 can be etched at the same time by the chlorine-based gas (FIG. 13C).

Although the resist mask 909 is used for patterning of the lamination layer pattern 910, before the resist mask 909 is formed, the surface of the aluminum layer 820 is subjected to anodic oxidation to form an extremely thin alumina film, so that the adhesiveness of the resist mask 909 is improved.

Figure 13D:
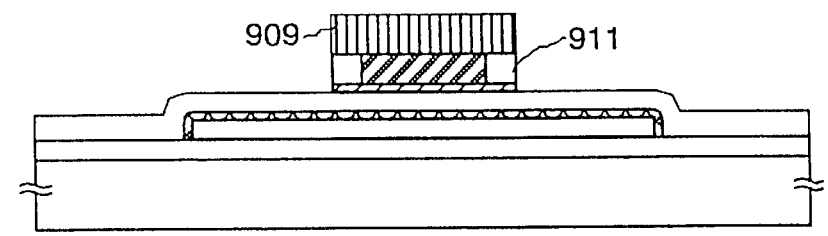

Next, while the resist mask 909 remains, an anodic oxidation process with a reached voltage of 8 V is carried out in a solution of 3% oxalic acid, and a porous alumina layer 911 with a thickness of 600 to 800 nm is formed. The tantalum layer 810 is not subjected to anodic oxidation in this solution, and only the aluminum layer 820 is selectively subjected to anodic oxidation so that the porous alumina layer 911 is formed (FIG. 13D).

After the resist mask 909 is removed, an anodic oxidation process with a reached voltage of 80 V is again carried out in an ethylene glycol solution containing 3% tartaric acid. In this process, both the aluminum layer 820 and the tantalum layer 810 are subjected to anodic oxidation (FIG. 13E).

With respect to the tantalum layer 810, only a portion being in contact with the porous alumina layer 911 is subjected to anodic oxidation, and is transformed into a tantalum oxide layer 811. This is because only that portion is brought into contact with the electrolytic solution permeating through the inside of the porous alumina layer 911.

With respect to the aluminum layer 820, a portion being in contact with the electrolytic solution permeating the inside of the porous alumina layer 911 is oxidized, so that a nonporous alumina layer 821 with a thickness of 100 to 120 nm is formed on the surface (inside of the porous alumina layer 911). The film thickness of the nonporous alumina layer 821 is determined by the reached voltage.

Figure 13E:
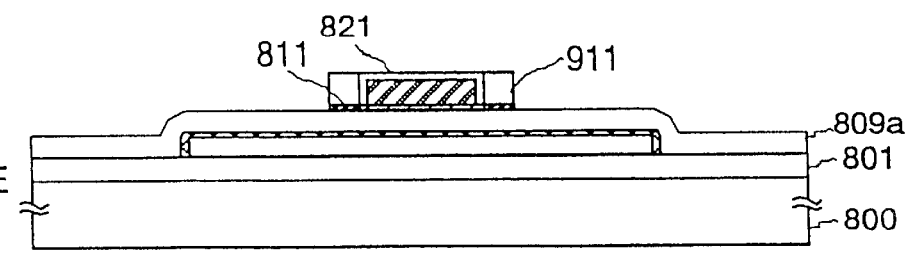

Here, a SEM photograph showing the state of FIG. 13E is shown in FIG. 32A. In FIG. 32A, the SEM photograph shows a sample experimentally reproducing the state of FIG. 13E, which is magnified 40 thousands times, and shows the state near the porous alumina layer 911.

FIG. 32B is a schematic view of FIG. 32A. In FIG. 32B, reference numeral 90 denotes an under layer made of a silicon oxide film, 91 denotes a tantalum layer, 92 denotes an aluminum layer, 93 denotes a tantalum oxide layer, 94 denotes a nonporous alumina layer, and 95 denotes a porous alumina layer.

As shown in FIG. 32B, the surface of the aluminum layer 92 is covered with the nonporous alumina layer 94, and the porous alumina layer 95 is formed at the outside thereof. The tantalum oxide layer 93 is formed at the end portion (under the porous alumina layer) of the tantalum layer 91.

In FIG. 13E, although the thickness of the tantalum layer 810 is the same as that of the tantalum oxide layer 811, as long as inference is made from the photograph shown in FIG. 32A, it appears that the volume of the tantalum layer expands about twice when the tantalum layer is transformed into the tantalum oxide layer by the anodic oxidation process, and the thickness thereof becomes thick about 2 to 4 times (typically 3 times). The tantalum oxide layer 93 protrudes outer than the end portion of the alumina layer 95. It is also inferred that the portion designated by 93 not only is formed of completely tantalum oxide, but also is mixed with tantalum.

After the structure shown in FIG. 13E is obtained, the deposited insulating film 809a and the thermal oxidation film 809b are etched by a dry etching method with the gate electrode portion (tantalum layer 810, tantalum oxide layer 811, aluminum layer 820, and alumina layer 821) and the porous alumina layer 911 as masks, so that the gate insulating film 809 is patterned. As an etching gas, a $CHF_3$ gas with a flow of 55 sccm was used, and etching was carried out under the conditions that the pressure is 55 mTorr and the supply power is 800 W.

Figure 14A:
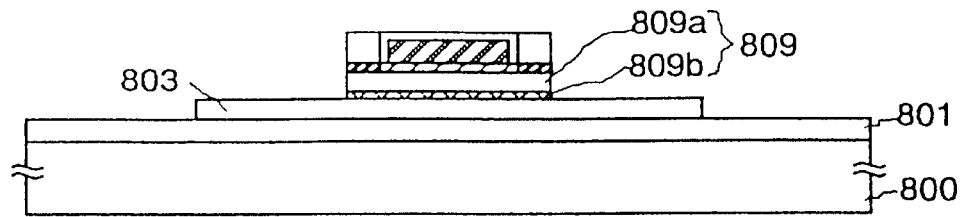
FIGS. 14A to 14D are views showing manufacturing steps of the TFT.

The deposited insulating film 809a and the thermal oxidation film 809b are etched in a self-aligning manner by this step, and the gate insulating film 809 is processed into an island-like pattern. At this time, as explained with reference to FIG. 32(B), since the tantalum oxide layer 811 protrudes outermost in the gate electrode, the end face of the gate insulating film is defined by the end face of the tantalum oxide layer 811. Besides, such a state is obtained that in the active layer 803, regions which subsequently become source/drain regions are exposed (FIG. 14A).

After this patterning step is ended, the porous alumina layer 911, which was used as the mask, is removed by using a solution of aluminum mixed acid (solution of phosphoric acid, acetic acid, nitric acid, and water mixed at a ratio of 85:5:5:5 in vol %) the temperature of which is kept at 45° C. Since the selecting ratio of the porous alumina layer 911 to the tantalum oxide layer 811 is large, the tantalum oxide layer 811 is not etched. This state is obvious also from the SEM photograph shown in FIG. 33.

FIG. 33 is a SEM photograph showing the state where only the porous alumina layer 95 is removed from the state shown in FIG. 32A. From this photograph, it is ascertained that the tantalum oxide layer 93 of a hood shape remains.

Next, a first impurity ion injection step is carried out. In this embodiment, a plasma doping method is used. For the purpose of manufacturing an N-channel TFT (NTFT), P (phosphorus) or As (arsenic) is selected as an impurity ion to give N-type conductivity. Here, phosphorus is added. The first step is carried out at an acceleration voltage as high as 70 to 85 keV. At this time, since the tantalum oxide layer 811 exists on the surface of the gate insulating film 809, damage at ion implantation does not directly reach the gate insulating film, so that it is possible to suppress trap levels from occurring in the gate insulating film 809.

Figure 14B:
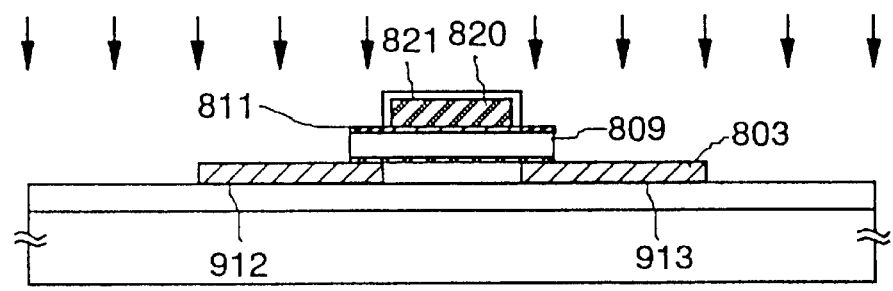

Since the acceleration voltage is high, a phosphorus ion passes through the tantalum oxide layer 811 and the gate insulating film 809, and is added into the active layer 803. As a result, N-type impurity regions 912 and 913 are formed. In the active layer, a phosphorus ion was not added in a region where the aluminum layer 820 and the alumina layer 821 exist on its upper portion (FIG. 14B).

In this step, the impurity concentration in the regions 912 and 913 subsequently determines the impurity concentration in a high resistance region. Thus, it is necessary for a user to determine an optimal dosage at the ion implantation so that the regions 912 and 913 contains impurities of a desired concentration. In this embodiment, adjustment is made so that the concentration of phosphorus in the impurity regions 912 and 913 becomes $1\times10^{17}$ to $1\times10^{18}$ atoms/cm$^3$.

Next, a second impurity adding step is carried out at an acceleration voltage as low as 5 to 10 keV. In this step, since the acceleration voltage is low, the gate insulating film 809 completely functions as a mask (since the tantalum oxide layer 811 also exists, the masking effect is improved as compared with the technique disclosed in Japanese Patent Unexamined Publication No. Hei 7-135318 which corresponds to U.S. Pat. No. 5,598,284. An entire disclosure of No. Hei 7-135318 and U.S. Pat. No. 5,598,284 is incorporated herein by reference). In this step, a phosphorus ion is added into only regions 804 and 805 the surfaces of which are exposed in the N-type impurity regions 912 and 913. In this embodiment, adjustment is made so that phosphorus is added into this regions 804 and 805 at a concentration of $1\times10^{20}$ to $1\times10^{21}$ atoms/cm$^3$.

Figure 14C:
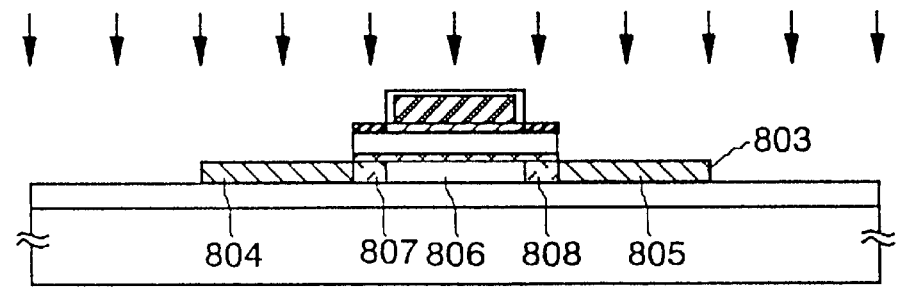

In the first and second impurity adding steps, the regions 804 and 805 where phosphorus was added in both the steps become a source region and a drain region, respectively. The regions where phosphorus was added in only the first impurity adding step become high resistance regions 807 and 808 having resistance higher than the source/drain regions 804 and 805. Thus, the contact portions between the source/drain regions 804, 805 and the high resistance regions 807, 808 are defined by the gate insulating film 809 (end portion of the tantalum oxide layer 811). A region 806 where any impurity was not implanted becomes an intrinsic or substantially intrinsic channel formation region which subsequently becomes a moving path of carriers (FIG. 14C).

Incidentally, the intrinsic region means a completely neutral region where electrons and holes completely balance with each other, and the substantially intrinsic region means a region containing an impurity to give an N type or a P type within a concentration range ($1\times10^{15}$–$1\times10^{17}$ atoms/cm$^3$) where control of a threshold value can be made, or a region where the conductivity type is canceled by intentionally adding an impurity of reverse conductivity.

The high resistance regions 807 and 808 in this embodiment include phosphorus of a concentration lower than the source/drain regions 804 and 805, and correspond to LDD regions or low concentration impurity regions. Incidentally, it is possible to prevent phosphorus from being added into the regions 807 and 808 by adjusting the acceleration voltage in the impurity adding step or the thicknesses of the gate insulating film 809 and the tantalum oxide layer 811. In this case, the high resistance regions 807 and 808 function as offset regions.

In the case where a P-channel TFT is also manufactured on the same substrate, it is satisfactory if the active layer of the N-channel TFT is covered with a photoresist, and boron is added in the remaining active layer. The concentration of added boron is adjusted such that the conductivity of the source/drain regions 804 and 805, or the high resistance regions 807 and 808 is inverted from the N type to the P type.

After the adding step of an impurity to give conductivity to the active layer 803 is ended in this way, a heat treatment or excimer laser irradiation in an inert gas atmosphere is next carried out so that the impurity added in the active layer is activated. This step may be carried out through a heat treatment to make silicide, which is to be next carried out.

Next, the surfaces of the source/drain regions 804 and 805 are made silicide. In this embodiment, a titanium silicide layer is formed. First, a titanium (Ti) film 915 is formed by a sputtering method. The thickness of the film is made 10 to 100 nm, here, the thickness is made 50 nm. In this state, the active layer 803 is in contact with the titanium film 915 at only the source/drain regions 804 and 805. Then, they are heated up to 500 to 650° C., here, 550° C. so that the titanium film 915 is made to react with the active layer 803, which is in contact with the titanium film 915, to make silicide. As a result, titanium silicide layers 804a and 805a are formed on the surfaces of the source/drain regions 804 and 805 in a self-aligning manner (FIG. 14D).

Conventionally, since the heat resistance of aluminum material is low, merely a heat treatment at a temperature of about 450° C. is carried out in a step after formation of a gate electrode. However, in this embodiment, since the tantalum layer 810 provided as the lower layer is used as a blocking layer of the aluminum layer 820 having low heat resistance, it becomes possible to carry out a heat treatment at a temperature of not less than 450°, or 500 to 650° C. Thus, by a salicide step using the gate electrode as a mask, it becomes possible to form the silicide layer 804a and 805a.

Figure 14D:
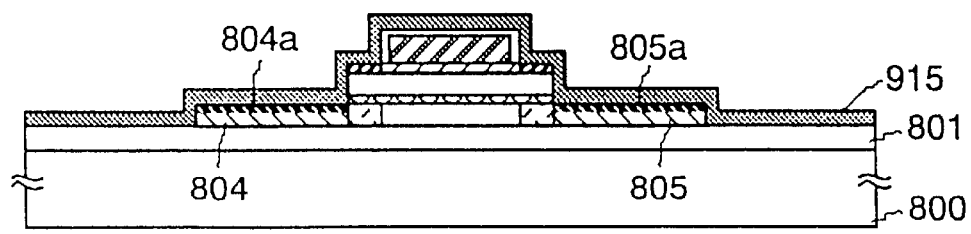

In FIG. 14D, as indicated by the silicide layers 804a and 805a, although only the surface layers of the source/drain regions 804 and 805 are made silicide, the entire of the source/drain regions 804 and 805 can be made silicide by adjusting the thickness of the active layer 803 and the heating time. Besides, as described before, since the impurity added in the active layer can be activated by the heat treatment in the step of making silicide, it is also possible to omit the activating step before the step of making silicide.

Next, the titanium film 915 non-reacted in the step of making silicide is removed. Here, an etchant obtained by mixing a hydrogen peroxide solution and an ammonia solution is used and only the titanium film 915 is selectively removed. Then, as shown in FIG. 11A, an interlayer insulating film 730 is formed. As the interlayer insulating film 730, a silicon oxide film, a silicon nitride film, a silicon nitride oxide film, an organic resin film, or a lamination film of those may be used. As the organic resin film, polyimide, polyamide, polyimide amide, acryl, and the like can be enumerated.

After the interlayer insulating film 730 is formed, contact holes are formed, and a source electrode 741 and a drain electrode 742 are formed. In this embodiment, as the electrode material, a lamination conductive layer of titanium/aluminum/titanium is used. Finally, a hydrogenating process in a hydrogen atmosphere is carried out at about 350° C. for 2 hours, so that a hydrogen terminating process of the entire of a TFT is carried out. In this way, the TFT having a structure as shown in FIG. 11A is completed.

In the TFT of this embodiment, the tantalum layer exists between the aluminum layer and the gate insulating film constituting the gate electrode, it is possible to prevent aluminum from diffusing into the gate insulating film by a heat treatment on the way of manufacture. Thus, the surfaces of the source/drain regions can be made silicide by using a salicide step. Thus, the resistance of the gate electrode can be lowered by forming the gate electrode of the aluminum material, and further, the sheet resistance of the source/drain regions can be lowered, so that a TFT suitable for a high speed operation can be obtained.

Further, since a short circuit due to aluminum diffusion can be prevented, it becomes possible to manufacture a TFT at an extremely high yield factor, and a high quality product rate can be secured even in manufacture of an AMLCD in which not less than one million TFTs are formed on the same substrate. With that, it is possible to lower the manufacturing cost of a liquid crystal module or a product (electronic equipment) having the liquid crystal module. In this embodiment, although an example of a TFT has been described, it is obvious that the manufacturing step of the gate electrode and salicide step of this embodiment can be applied to a MOS transistor in which source/drain regions are formed in a silicon substrate.

[Embodiment 7]

This embodiment will be described with reference to FIG. 7. This embodiment is an example of an active matrix substrate constituting an active matrix type liquid crystal display device (AMLCD) to which the present invention is applied. In the active matrix substrate, a driving circuit constituted by CMOS circuits and a pixel matrix circuit constituted by NTFTs are manufactured on the same substrate. An example of manufacturing steps of a P-channel TFT (PTFT) and manufacturing conditions will be described below in brief.

First, an impurity ion (boron) to give P-type conductivity is implanted into source and drain regions where a phosphorus ion was implanted. As a doping gas, diborane diluted to 5% with hydrogen is used. An acceleration voltage is made 60 to 90 keV, and a dosage is made $1 \times 10^{13}$ to $8 \times 10^{19}$ atoms/cm$^2$. It is important to adjust the dosage such that the concentration obtained by subtracting the maximum value of the concentration of phosphorus from the maximum value of the concentration of boron implanted in the source and drain regions becomes $3 \times 10^{19}$ to $3 \times 10^{21}$ atoms/cm$^3$. As a result, the conductivity type of the source and drain regions is inverted, so that P-type impurity regions can be formed. Incidentally, the step may be modified such that the conductivity type of the high resistance region is also inverted.

In FIG. 7, an NTFT 501 and a PTFT 502 constitute a CMOS circuit 503. If a well-known CMOS technique is used as described above, the circuit can be easily realized in almost the same step as the embodiment 6.

The pixel TFT (in this embodiment, NTFT) 504 constituting the pixel matrix circuit can be realized by adding some steps to the manufacturing steps explained in the embodiment 6.

First, in accordance with the steps of the embodiment 6, a plurality of pixel TFTs 504 and CMOS circuits 503 are formed. Next, as shown in FIG. 7, a first flattened film 50 is formed. In this embodiment, a lamination structure of silicon nitride (50 nm)/silicon oxide (25 nm)/acryl (1 µm) is used as the first flattened film 50.

Since an organic resin film of acryl, polyimide, or the like is a solution coating type insulating film formed by a spin coating method, a thick film can be easily formed, and further, an extremely flat surface can be obtained. Thus, it is possible to form a film with a thickness of about 1 µm at a high throughput, and an excellent flat surface can be obtained.

Next, a black mask 51 made of a light shading conductive film is formed on the first flattened film 50. Prior to the formation of the black mask 51, the first flattened film 50 is etched to form a recess in which only the silicon nitride film of the lowermost layer remains.

If such a state is made, the drain electrode of the pixel TFT 504 and the black mask 51 are close to each other through only the silicon nitride film at the portion where the recess was formed, and auxiliary capacitance 52 is formed there. Silicon nitride has a high specific dielectric constant, and the film thickness is thin, so that large capacitance can be easily secured.

After the auxiliary capacitance 52 is formed at the same time as the formation of the black mask 51, a second flattened film 53 is formed with an acrylic film having a thickness of 1.5 µm. Although a large step occurs at a portion where the auxiliary capacitance 52 was formed, such a step can be sufficiently flattened.

Finally, a contact hole is formed in the first flattened film 50 and the second flattened film 53, and a pixel electrode 54 made of a transparent conductive film (typically ITO) is formed. In this way, the active matrix substrate as shown in FIG. 7 can be manufactured.

If a conductive film having high reflectivity, typically aluminum or a material containing aluminum as its main ingredient is used for the pixel electrode 54, it is also possible to manufacture an active matrix substrate for a reflection type AMLCD.

Although the gate electrode of the pixel TFT in FIG. 7 has a double gate structure, the gate electrode may have a single gate structure or a multi gate structure such as a triple gate structure.

The structure of the active matrix substrate is not limited to the structure of this embodiment. Since the feature of the present invention exists in the structure of the gate electrode and the formation of silicide of source/drain regions, other structures do not limit the present invention and a user may suitably determine the other structures.

[Embodiment 8]

This embodiment will be described with reference to FIGS. 13D and 15A to 15E. This embodiment is an example in which a TFT is formed through steps different from those of the embodiment 6, and is a modified example of the anodic oxidation step of the Embodiment 6. The structure of this embodiment can be used for the structure of other embodiments.

Figure 15A:
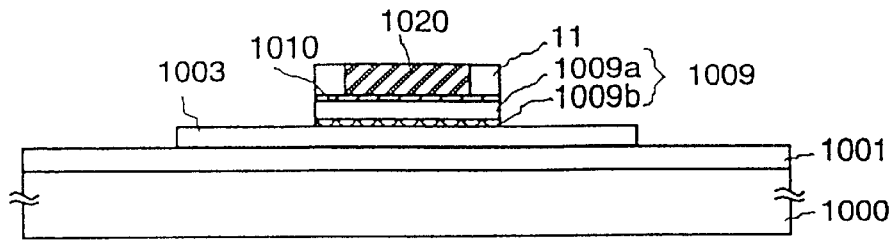
FIGS. 15A to 15E are views showing manufacturing steps of a TFT in embodiment 8.

Since steps of this embodiment are the same as those of the embodiment 6 up to the step of FIG. 13D, their explanation will be omitted. After the state of FIG. 13D is obtained, patterning of the gate insulating film is carried out as shown in FIG. 15A. In FIG. 15A, reference numeral 1000 denote a substrate, 1001 denotes an under film, 1003 denotes an active layer, 1009a denotes a deposited insulating film, 1009b denotes a thermal oxidation film, 1010 denotes a tantalum layer, 1020 denotes an aluminum layer, and 11 denotes a porous alumina layer obtained by anodic oxidation of the aluminum layer. After the state of FIG. 13D is obtained, the deposited insulating film 1009a and the thermal oxidation film 1009a are etched with the aluminum layer 1020 and the alumina layer 11 as masks, so that the gate insulating film 1009 is patterned.

Figure 15B:
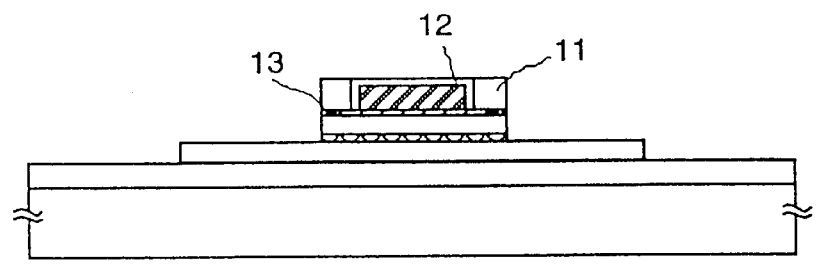

Next, an anodic oxidation process is carried out in an ethylene glycol solution containing tartaric acid of 3%. In this process, both the layers are subjected to anodic oxidation, and thin anodic oxidation layers are formed (FIG. 15B).

With respect to the tantalum layer 1010, only a portion being in contact with the porous alumina layer 11 is subjected to anodic oxidation, and is transformed into a thin tantalum oxide layer 13. With respect to the aluminum layer 1020, a thin nonporous alumina layer 12 is formed on the surface (inside of the porous alumina layer 11). Here, the reached voltage was made 1 to 20 V, so that the thickness of the nonporous alumina layer 12 became 10 to 30 nm.

Figure 15C:
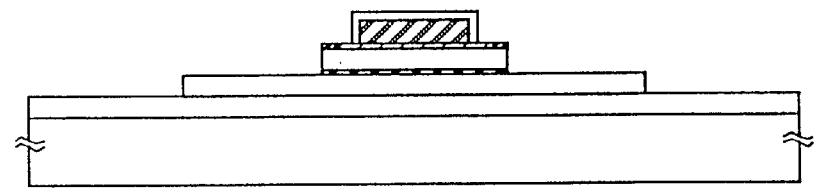

Then the porous alumina layer 11 is selectively removed and the state of FIG. 15C is obtained. In this state, the tantalum layer 1010 is exposed.

Figure 15D:
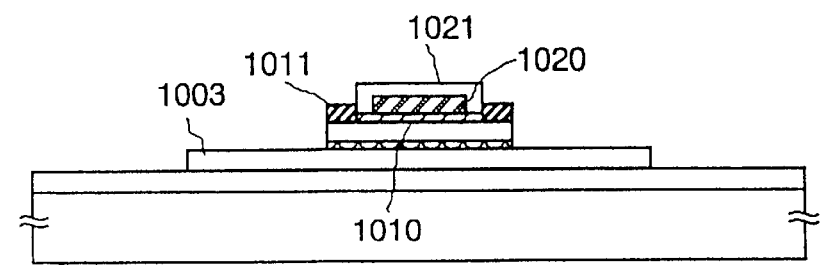

An anodic oxidation process with a reached voltage of 80 V is again carried out in an ethylene glycol solution containing tartaric acid of 3%. In this process, both the aluminum layer 1020 and the tantalum layer 1010 are subjected to anodic oxidation, and a thick alumina layer 1021 and a thick tantalum oxide layer 1011 are formed. In this step, the previously formed thin alumina layer 12 and the tantalum oxide layer 13 are integrated with the thick alumina layer 1021 and the thick tantalum oxide layer 1011, respectively (FIG. 15D).

Contrary to the step of FIG. 13E of the embodiment 6, in this embodiment, since the tantalum layer 1010 is subjected to anodic oxidation, the tantalum layer 1010 is made exposed so that the layer is easily transformed into the tantalum oxide layer 1011, and the film thickness of the tantalum oxide layer 1011 is made thick about 2 to 4 times (typically 3 times) the thickness of the tantalum layer 1010. By making such a structure, the tantalum layer existing over a subsequent high resistance region is completely transformed into the tantalum oxide layer 1011 to make a structure in which a normal operation as a TFT is performed.

Figure 15E:
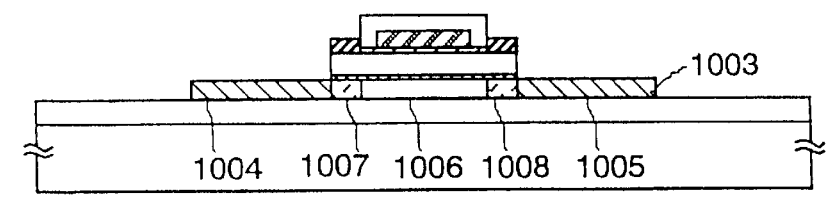

Next, an impurity ion is added into the active layer 1003. It is appropriate that this step is carried out in the step explained in the embodiment 6, and as shown in FIG. 15E, a source region 1004, a drain region 1005, a channel formation region 1006, and high resistance regions 1007 and 1008 are formed in the active layer 1003. Thereafter, it is appropriate that similarly to the embodiment 6, a is step of making silicide, and the like are carried out to complete a TFT.

[Embodiment 9]

This embodiment will be described with reference to FIGS. 16A to 16F. First, as a substrate 1101 having an insulating surface, a glass substrate with a surface provided with an insulating film is prepared. Other than the glass substrate, a silicon substrate provided with a thermal oxidation film, a quartz substrate, a ceramic substrate provided with a silicon oxide film, or the like may be used.

Next, an island-like semiconductor layer which becomes an active layer of a TFT is formed on the substrate 1101. In this embodiment, an active layer 1102 is formed of a polysilicon film formed by a technique disclosed in Japanese Patent Unexamined Publication No. Hei. teaching crystallization of a semiconductor film using a material for promoting crystallization of the semiconductor film. An entire disclosure of No. Hei. 7-130652 is incorporated herein by reference.

Any well-known means, such as a method of using laser annealing, may be used as a method of forming the polysilicon film. It is also possible to use a silicon germanium film indicated by $Si_XGe_{1-X}$ (0<X<1).

Next, the active layer 1102 is covered with an insulating film 1103 made of silicon oxide, and a gate wiring line 1104 made of a lamination structure of a tantalum film 1104a with a thickness of 20 nm and an aluminum film 1104b containing scandium of 2 wt % is formed.

In FIG. 16A, although the left gate wiring line and the right gate wiring line are separately shown, as shown in FIG. 2A, they are actually the same body. The left gate wiring line 1104 finally overlaps with the active layer 1102 and functions as a gate electrode of a TFT. The right gate wiring line 1104 subsequently becomes a contact portion for connection with an external terminal.

In this way, the state shown in FIG. 16A is obtained. Although not shown, in this state, a resist mask used for patterning remains on the gate wiring line 1104.

After the state of FIG. 16A is obtained, a porous anodic oxidation film 1105 is formed by using a technique disclosed in Japanese Patent Unexamined Publication No. Hei. 7-135318 which in turn corresponds to U.S. Pat. No. 5,598,284. An entire disclosure of No. Hei. 7-135318 and U.S. Pat. No. 5,598,284 is incorporated herein by reference.

The porous anodic oxidation film 1105 is obtained by anodic oxidation in a solution of 3% oxalic acid. At this time, the tantalum film 1104a is hardly anodically oxidized but remains as it is. The above publication may be referred to on the details of the condition of anodic oxidation. After etching of the porous anodic oxidation film is ended, the resist mask (not shown) used for the patterning of the gate wiring line is removed.

A dense anodic oxidation film 1106 with a thickness of 10 to 30 nm is formed by anodic oxidation in an ethylene glycol solution of 3% tartaric acid. Japanese Patent Unexamined Publication No. Hei. 7-135318 may be referred to also on this condition of the anodic oxidation. No. Hei. 7-135318 in turn corresponds to U.S. Pat. No. 5,598,284. An entire disclosure of No. Hei. 7-135318 and U.S. Pat. No. 5,598,284 is incorporated herein by reference. This dense anodic oxidation film 1106 has an effect to protect the aluminum film 1104b against an etchant in a next step. Incidentally, in the present specification, the aluminum film means this dense anodic oxidation film.

Next, the insulating film 1103 is etched by using the gate wiring line 1104 and the porous anodic oxidation film 1105 as masks. Etching is carried out by a dry etching method using a $CHF_3$ gas. After the etching of the insulating film 1103 is ended, the porous anodic oxidation film 1105 is removed.

Although an etchant of a mixture of phosphoric acid: nitric acid: acetic acid: and water=85:5:5:5 (vol %) is used to remove the anodic oxidation film 1105, this etchant can not have a sufficient selecting ratio of the anodic oxidation film to the aluminum film 1104*b*. However, since the dense anodic oxidation film 1106 is formed on the surface of the aluminum film 1104*b* in the previous step, it is possible to prevent the aluminum film 1104*b* from being etched.

Next, after the porous anodic oxidation film 1105 is removed, anodic oxidation is again carried out in an ethylene glycol solution of 3% tartaric acid, so that the thickness of the dense anodic oxidation film 1106 is made thick and a dense anodic oxidation film 1107 with a thickness of 100 to 150 nm is formed.

At this time, an exposed portion of the tantalum film 1104*a* is completely anodically oxidized and becomes an oxide (tantalum oxide indicated by $Ta_xO_y$) 1108. By doing so, the surrounding of the gate wiring line 1104 is surrounded by the oxide (tantalum oxide film) 1108 of the tantalum film and the oxide (alumina film) 1107 of the aluminum film, which serve to protect the gate wiring line against an etchant and the like in a subsequent step.

Next, an adding step of an impurity ion to give one conductivity is carried out. In order to manufacture an N-channel TFT, phosphorus or arsenic is added, and boron or gallium is added to manufacture a P-channel TFT. It is satisfactory if the addition of these impurity ions is carried out by using one of an ion implantation method, a plasma doping method, and a laser doping method.

In such a case that a CMOS circuit is constituted, it is appropriate that a resist mask is used so that impurity ions are selectively implanted.

The acceleration voltage is divided into two voltages and this step is carried out twice. The first step is carried out at an acceleration voltage set as high as about 80 keV, and the second step is carried out at an acceleration voltage set as low as about 30 keV. By doing so, in the first step, an impurity ion is added even in a portion under the tantalum oxide film 1108 and the insulating film 1103, and in the second step, the tantalum oxide film 1108 and the insulating film 1103 function as masks so that an impurity ion is not added into a portion under the films.

By such adding steps of impurity ions, a source region 1109, a drain region 1110, low concentration impurity regions (LDD regions) 1111, and a channel formation region 1112 are formed. The concentration of impurity ions added in the respective impurity regions may be suitably determined by a user (FIG. 16D).

After the adding steps of impurity ions are ended, a heat treatment is carried out by using furnace annealing, lamp annealing, laser annealing, or combination of those, so that the added impurity ions are activated.

Next, an interlayer insulating film 1113 made of a silicon oxide film is formed into a thickness of 1 $\mu$m. Next, the interlayer insulating film 1113 is patterned to form contact holes 1114 to 1116. The formation of the contact holes are carried out in the manner described below.

First, by using an etchant called LAL 500 made by Hashimoto Chemical Industry Co., Ltd., the interlayer insulating film 1113 is etched. LAL 500 is an etchant in which a surfactant of several % is added in buffered hydrofluoric acid of a mixture of ammonium fluoride, hydrofluoric acid, and water. Of course, other buffered hydrofluoric acid may be used.

It is preferable that buffered hydrofluoric acid used here can etch a silicon oxide film at a relatively high speed. Sine the interlayer insulating film 1113 is as thick as 1 $\mu$m, as the etching rate becomes high, the throughput is improved.

At the point of time when the interlayer insulating film 1113 is etched in this way, the source region 1109, the drain region 1110, and the anodic oxidation film 1107 are exposed. Here, etching is made to progress by using thin buffered hydrofluoric acid obtained by mixing ammonium fluoride, hydrofluoric acid, and water at a ratio of 2:3:150 (vol %).

By this buffered hydrofluoric acid, the silicon film, that is, the source region 1109 and the drain region 1110 are hardly etched. However, the anodic oxidation film 1107 of alumina is etched, and the aluminum film under the anodic oxidation film is also etched. Finally, at the point of time when etching reaches the tantalum film 1104*a*, the etching is stopped, so that the contact hole 1116 as shown in FIG. 16E is formed.

After the state shown in FIG. 16E is obtained in this way, a source wiring line 1117 and a drain wiring line 1118 made of conductive films are formed, and a lead wiring line 1119 electrically connected to the gate wiring line 1104 is formed of the same material (FIG. 16F).

In this embodiment, as the conductive film constituting the source wiring line 1117, the drain wiring line 1118, and the lead wiring line 1119, a wiring line of a three-layer structure of titanium/aluminum alloy/titanium is used. By doing so, it is possible to realize the low resistance wiring line while the aluminum film having high reactivity is protected by titanium. Of course, a conductive film which can be applied to the present invention is not limited to this.

The TFT having the structure as shown in FIG. 16F is completed through the steps as described above. Besides, according to the structure of this embodiment, electrical connection between the gate wiring line and the lead wiring line can be achieved by the structure as shown in FIG. 16F.

In the structure of this embodiment, since the tantalum film 1104*a* functions as an etching stopper when the contact hole 1116 is formed, the ability to control the process and the margin for the process are greatly improved.

That is, it is possible to prevent poor contact, such as over etching, which has been a problem in the prior art. Moreover, this embodiment does not require such an etchant as chromium mixed acid set forth in the prior art, the industrial handling of which is difficult, but can use buffered hydrofluoric acid which can be easily managed, so that this embodiment is advantageous in view of economy as well.

[Embodiment 10]

In this embodiment, an example in which a TFT is manufactured through steps different from those of the embodiment 9 will be described. Explanation will be given with reference to FIGS. 17A to 17D.

First, in accordance with steps of the embodiment 9, the state of FIG. 17A is obtained. Next, in accordance with Japanese Patent Unexamined Publication No. Hei. 7-135318, a porous anodic oxidation film 1201 is formed. No. Hei. 7-135318 in turn corresponds to U.S. Pat. No. 5,598,284. An entire disclosure of No. Hei. 7-135318 and U.S. Pat. No. 5,598,284 is incorporated herein by reference. After the porous anodic oxidation film 1201 is formed, dry etching by a $CHF_3$ gas is carried out so that an insulating film 1202 is formed in a self-aligning manner (FIG. 17A).

At this time, a resist mask (not shown) used for patterning remains on a gate wiring line 1104, and the resist mask functions as a mask at the dry etching.

It is desirable that a thin oxide film (not shown) is provided on the surface of an active layer 1102 after the insulating film 1202 is formed. If such a state is made, since a silicon film as the active layer is not directly exposed to an electrolytic solution in a next anodic oxidation step, it is possible to prevent pollution or the like from the electrolytic solution. Incidentally, a method of forming the thin oxide film may be a well-known means.

Next, after the foregoing resist mask is removed, an anodic oxidation process is carried out in an ethylene glycol solution containing 3% tartaric acid so that a thin dense anodic oxidation film 1203 with a thickness of 10 to 30 nm is formed. Japanese Patent Unexamined Publication No. Hei. 7-135318 may be referred to on the detailed conditions. No. Hei. 7-135318 in turn corresponds to U.S. Pat. No. 5,598,284. An entire disclosure of No. Hei. 7-135318 and U.S. Pat. No. 5,598,284 is incorporated herein by reference. At this time, although the surface of a tantalum film 1104a is also anodically oxidized, it is conceivable that the oxidation rate is slow since the porous anodic oxidation film 1201 becomes an obstacle (FIG. 17B).

After the dense anodic oxidation film 1203 is formed, the porous anodic oxidation film 1201 is removed. It is appropriate that the etchant explained in the embodiment 9 is used in this removing step (FIG. 17C).

Next, an anodic oxidation process is again carried out in an ethylene glycol solution containing 3% tartaric acid so that the thickness of the dense anodic oxidation film 1203 is increased, and finally, a dense anodic oxidation film 1204 with a thickness of 100 to 150 nm is formed. At the same time, the tantalum film 1104a is completely anodically oxidized and is transformed into a tantalum oxide 1205 (FIG. 17D).

Thereafter, if the steps of the embodiment 9 are carried out, the TFT having the structure as shown in FIG. 16F, and the contact portion between a gate wiring line and a lead wiring line are completed.

[Embodiment 11]

In this embodiment, an example in which a TFT is manufactured through steps different from those of the embodiment 9 or 10 will be described. Explanation will be given with reference to FIGS. 16A and 18A to 18C.

Figure 18A:
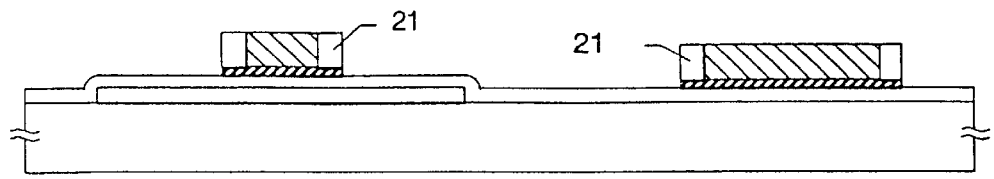
FIGS. 18A to 18C are views showing manufacturing steps of a TFT.

First, in accordance with the steps of the embodiment 9, the state of FIG. 16A is obtained. Next, in accordance with Japanese Patent Unexamined Publication No. Hei. 7-135318, a porous anodic oxidation film 21 is formed. No. Hei. 7-135318 in turn corresponds to U.S. Pat. No. 5,598, 284. An entire disclosure of No. Hei. 7-135318 and U.S. Pat. No. 5,598,284 is incorporated herein by reference. After the porous anodic oxidation film 21 is formed, a resist mask (not shown) thereon is removed (FIG. 18A).

Figure 18B:
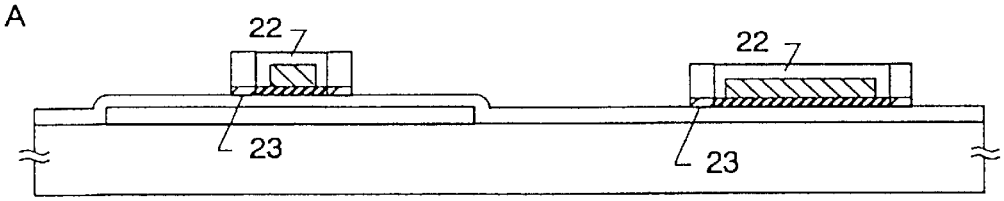

Next, anodic oxidation is carried out in an ethylene glycol solution of 3% tartaric acid so that a dense anodic oxidation film 22 with a thickness of 100 to 150 nm is formed. Japanese Patent Unexamined Publication No. Hei. 7-135318 may be referred to on the detailed conditions. No. Hei. 7-135318 in turn corresponds to U.S. Pat. No. 5,598,284. An entire disclosure of No. Hei. 7-135318 and U.S. Pat. No. 5,598,284 is incorporated herein by reference. At this time, a high voltage is applied to also a tantalum film 1104a shown in FIG. 16A, so that the film is almost completely anodically oxidized (FIG. 18B).

At this time, although the tantalum film 1104a is transformed into a tantalum oxide 23, it is necessary to pay attention to condition setting such that the tantalum film is completely transformed into the tantalum oxide. If the anodic oxidation is insufficient, the tantalum film remains as a lower layer to the tantalum oxide 23, and has a function comparable to a gate electrode, so that there is a fear that an effect of an LDD region formed thereunder is damaged.

Figure 18C:
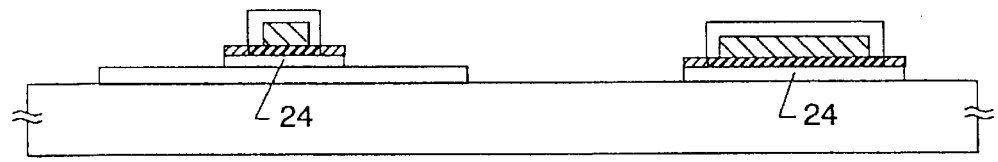

After the dense anodic oxidation film 22 and the tantalum oxide 23 are formed, dry etching by a $CHF_3$ gas is carried out, so that an insulating film 24 is formed in a self-aligning manner. After the dry etching is ended, the porous anodic oxidation film 21 is removed. It is appropriate that the etchant explained in the embodiment 9 is used in this removing step (FIG. 18C).

Thereafter, if the steps of the embodiment 9 are carried out, the TFT having the structure as shown in FIG. 16F and the contact portion between a gate wiring line and a lead wiring line are completed.

[Embodiment 12]

The structure of the present invention can be applied not only to a TFT but also to a MOSFFT formed by using a silicon substrate. An example in which the present invention is applied to a MOSFET will be shown in FIG. 19.

Figure 19:
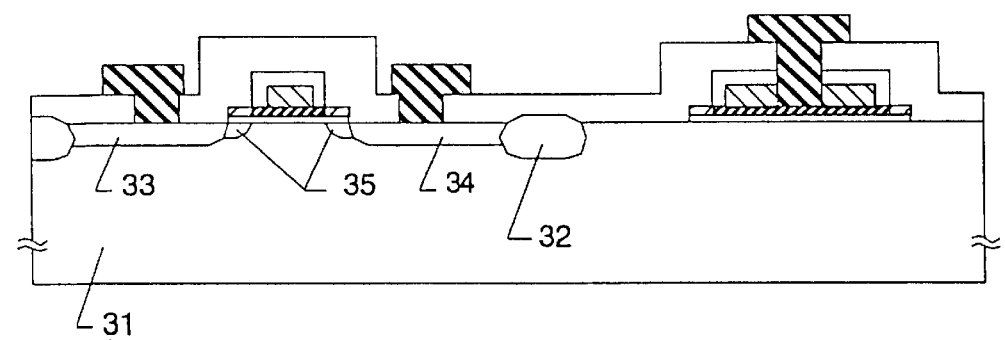
FIG. 19 is a view showing the structure of a MOSFET to which the present invention is applied.

In FIG. 19, reference numeral 31 denotes a silicon substrate, 32 denotes a field oxidation film, 33 denotes a source region, 34 denotes a drain region, and 35 denotes a pair of LDD regions. Since other structures are almost the same as those of the embodiment 9, their explanation will be omitted. Such a structure may be adopted that a MOSFET is manufactured in the inside of a well structure.

Like this, since the present invention is a technique relating to a contact structure among wiring lines, the invention can be applied to both a TFT and a MOSFET. Moreover, it is effective to apply the present invention to not only a semiconductor device, such as a TFT or a MOSFET, but also to a case which requires a structure for electrically connecting an aluminum wiring line protected by an anodic oxidation film to a conductive film formed at a different layer.

[Embodiment 13]

In this embodiment, an example in which an LDD region is formed through steps different from those of the embodiment 1 or 3 will be described with reference to FIGS. 4E and 20A to 20E. Incidentally, it is possible to use the structure of this embodiment for the structure of the embodiment 2.

First, in accordance with steps similar to those of the embodiment 1, the state of FIG. 4E is obtained. A porous alumina layer 408 is selectively removed to obtain the state of FIG. 20A. In this state, a tantalum oxide layer 409 is exposed.

Next, an implantation step of impurity ions is carried out at a high acceleration voltage. This step is a step for forming a subsequent LDD region as described in the embodiment 1. Thus, adjustment is made such that the impurity concentration of low concentration impurity regions 413 and 414 becomes about $1\times10^{17}$ to $1\times10^{18}$ atoms/cm$^3$.

Figure 20A:
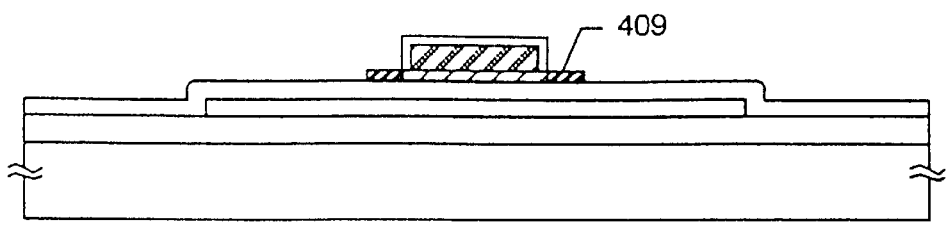
FIGS. 20A to 20E are views showing manufacturing steps of a TFT in embodiment 13.
Figure 20B:
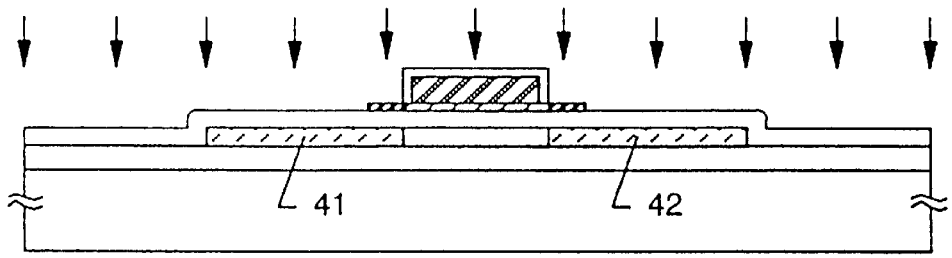

The step shown in FIG. 5B described in the embodiment 1 and the step shown in FIG. 20B are different from each other in the existence of a gate insulating film on subsequent source/drain regions. In the case of this embodiment, an impurity ion is implanted in an active layer entirely through the gate insulating film, that is, by through doping.

The merits of the through doping are that steps can be shortened (etching step of a gate insulating film can be omitted) and that damage at the ion implantation is not directly given to an active layer.

Figure 20C:
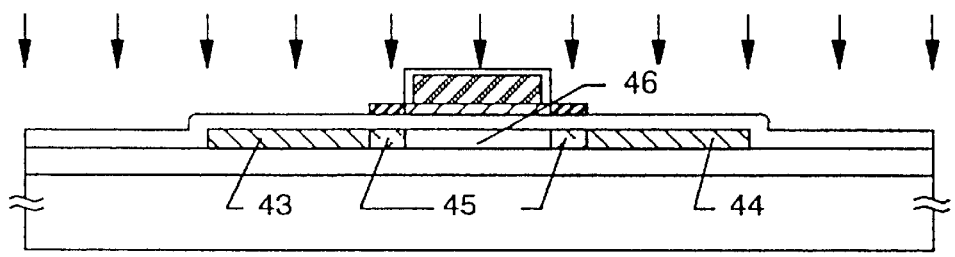

Next, as shown in FIG. 20C, an implantation step of an impurity ion by a low acceleration voltage is carried out. In this step, since a region where the tantalum oxide layer 409 exists functions as a mask, the foregoing low concentration impurity region remains under the layer.

As a result, a source region 43, a drain region 44, an LDD region 45, and a channel formation region 46 are formed. Also in this case, the tantalum oxide layer 409 exists on the LDD region 45, damage given to the GI at the ion implantation is lowered at that portion.

Figure 20D:
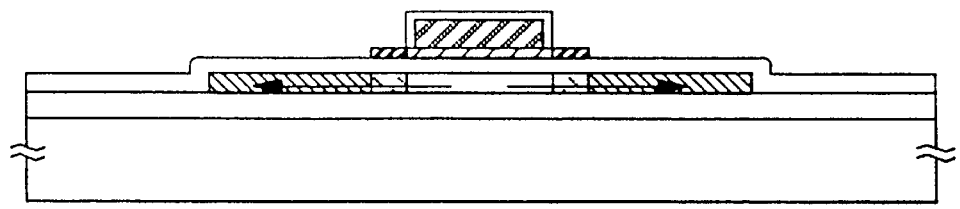

Thereafter, similarly to the embodiment 1, a heat treatment (550° C., 2 hours) is carried out, so that the effects of lowering of materials in the channel formation region and high resistance region, activation of a dopant, and recovery of a crystal structure can be simultaneously obtained (FIG. 20D).

Figure 20E:
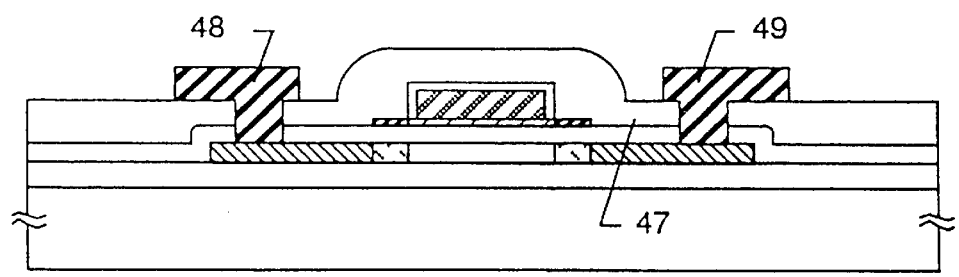

Then, similarly to the embodiment 1, activation of impurities is carried out, and an interlayer insulating film 47, a source electrode 48, and a drain electrode 49 are formed, and finally, a hydrogenating step is carried out, so that a TFT as shown in FIG. 20E is completed.

[Embodiment 14]

Figure 21A:
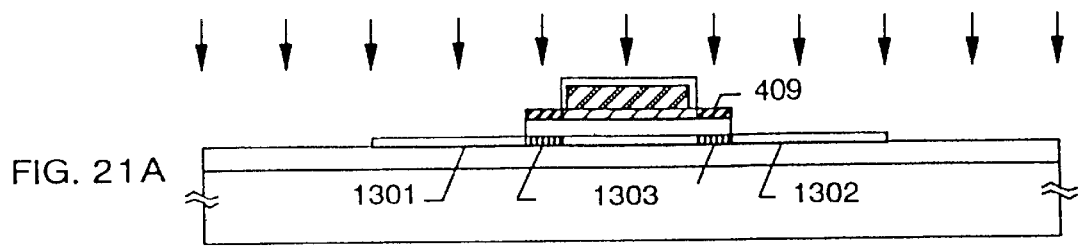
FIGS. 21A and 21D are views showing manufacturing steps of a TFT.

In this embodiment, an example in which an offset region is provided instead of an LDD region in the embodiment 1, will be described with reference to FIGS. 21A and 21B.

First, in accordance with the steps of the embodiment 1, the state of FIG. 5A is obtained. Then, without carrying out the first impurity ion implantation step shown in the embodiment 1, an ion implantation step by a low acceleration voltage as described with reference to FIG. 5C is carried out (FIG. 21A).

In this implantation step, since a tantalum oxide layer and a gate insulating film function as masks, a source region 1301 and a drain region 1302 containing impurities of a concentration of $1\times10^{20}$ to $1\times10^{21}$ atoms/cm$^3$ are formed.

Since a region designated by 1303 is not added with an impurity ion, the region maintains an intrinsic or substantially intrinsic state, and since a gate voltage is not applied, the region functions merely as a high resistance region. Such a region 1303 is called an offset region.

While the LDD region shown in the embodiments 1 to 4, and 13 has an effect to relieve an electric field at a drain contact portion, the offset region has an effect to lower an off current (current flowing when a TFT is in an off state) or a leak current more than the effect of the relief of the electric field.

Also in this case, the tantalum oxide layer 409 has an effect to lower damage received by the gate insluting film at ion implantation.

After the ion implantation step into the source and drain regions is ended in the manner described above, similarly to the embodiment 1, a heat treatment is next carried out in an inert gas atmosphere. In this embodiment, a heat treatment at a temperature of 600° C. for 12 hours was carried out. By this heat treatment, in the process where materials diffuse in the directions indicated by arrows in FIG. 21C, the materials are gettered by phosphorus with the regions 1307 and 1308 as gettering sites. As a result, the material concentration in the channel formation region and the high resistance region could be lowered.

Figure 21B:
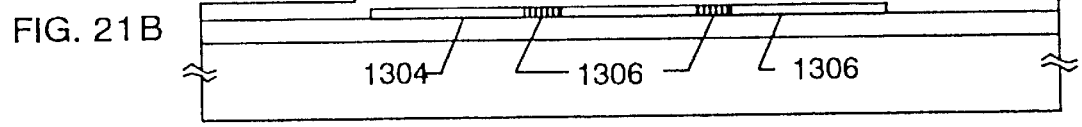
Figure 21C:
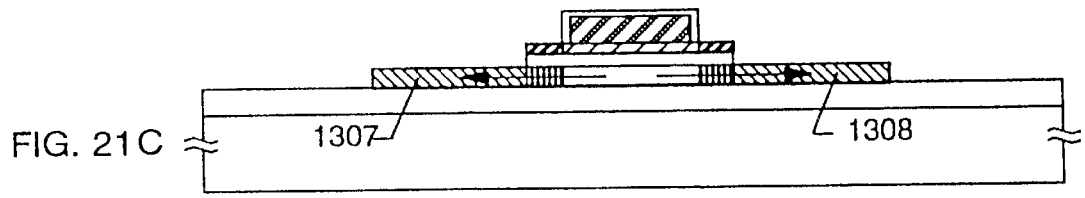
Figure 21D:
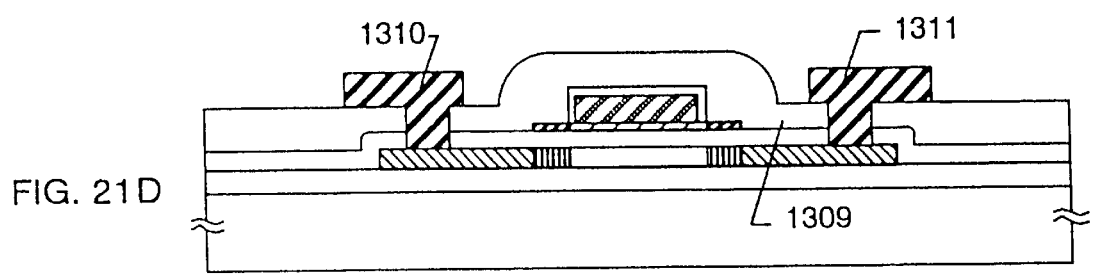

Thereafter, similarly to the embodiment 1, an interlayer insulating film 1309, a source electrode 1310, and a drain electrode 1311 are formed, and finally, a hydrogenating step is carried out so that a TFT is completed (FIG. 21D).

In addition, in this embodiment, since the impurity ion implantation step is carried out only one time, the throughput could be improved. Instead of the ion implantation step at the low acceleration voltage in this embodiment, even if a step of carrying out an ion implantation step at a high acceleration voltage is adopted, the throughput can be improved. However, the dosage of impurity ions is adjusted such that implanted regions function as a source region and a drain region.

Besides, the structure may be modified such that the gate insulating film is made to remain on the whole surface of the active layer, one through doping of phosphorus is carried out, a source region and a drain region are formed, and a heat treatment is carried out.

Moreover, a structure as shown in FIG. 21B can also be adopted. In FIG. 21B, the gate insulating film is made to remain on the whole surface of the active layer, and by through doping, a source region 1304 and a drain region 1305 are formed, and also in this case, an offset region 1306 can be formed by the masking function of the tantalum oxide layer 409.

It is easy to apply this embodiment to the structure of the embodiment 2 or 4.

[Embodiment 15]

In this embodiment, a structure in a case where the thickness of a tantalum layer is made thick at the formation of the tantalum layer, will be described with reference to FIGS. 22A and 22B.

Figure 22A:
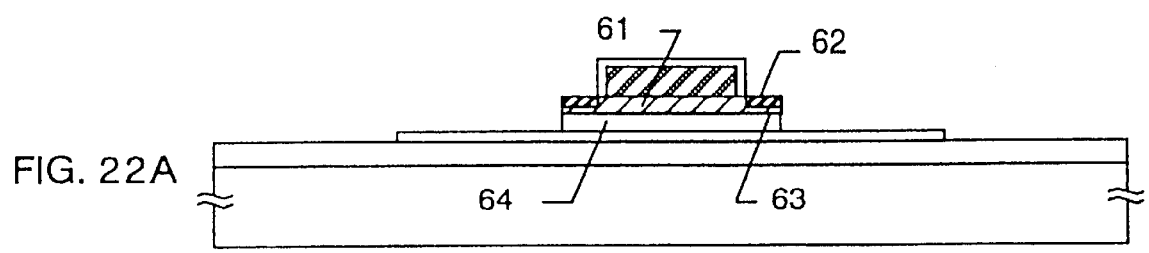
FIGS. 22A and 22B are views showing the structure near a gate electrode of a TFT.

FIG. 22A shows the state at the point of time when steps up to removal of an porous alumina layer are carried out in accordance with the steps of the embodiment 1. In FIG. 22A, reference numeral 61 denotes a tantalum layer, and its thickness is set as thick as 150 to 200 nm.

Reference numeral 62 denotes a tantalum oxide layer. Since the thickness of the tantalum layer 61 is thicker than that of the formed tantalum oxide layer 62, a tantalum layer 63 with a thickness of several hundreds nm remains under the tantalum oxide layer.

In the case of this embodiment, although an implantation step of an impurity ion is carried out in this state, since the protruding tantalum layer 63 functions almost completely as a mask irrespective of an acceleration voltage, an offset region is formed under the layer.

In this case, since damage reaching a gate insulating film 64 at ion implantation can be almost completely prevented, superfluous trap levels or the like are not generated in the gate insulating film 64. Thus, it is possible to realize a TFT having less deterioration and high reliability.

Figure 22B:
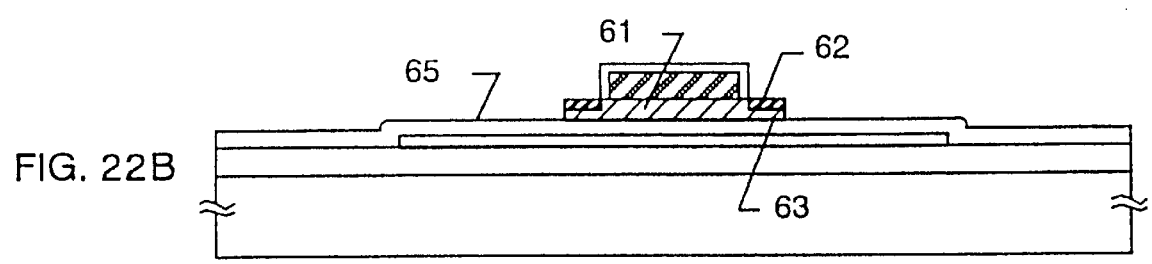

As shown in FIG. 22B, even in the case where through doping is carried out while a gate insulating film 65 is made to completely remain, similar effects can be obtained.

It is easy to apply this embodiment to the structure of the embodiment 2.

[Embodiment 16]

In this embodiment, an example in which a quartz substrate is used and a crystalline silicon film obtained by employing a technique disclosed in Japanese Patent Unexamined Publication No. Hei. 8-335152 is used on the substrate, will be described. An entire disclosure of No. Hei. 8-335152 is incorporated herein by reference. In the publication, gettering is carried out at the stage where the crystalline silicon film is obtained.

In the publication, even in a manufacturing method of using a quartz substrate having high distortion point, after a wiring line using an aluminum material is formed, a heat treatment is limited to a temperature in view of the heat resistance of the aluminum material. On the contrary, by adopting the structure (aluminum material/tantalum layer) of the present invention, after formation of a wiring line, it has become possible to carry out a heat treatment at 450 to 700° C., preferably about 600° C.

In this embodiment, although gettering has been carried out in the process of forming the crystalline silicon film, after the formation of a wiring line, a source region and a drain region doped with a phosphorus element are subjected to an activating heat treatment (about 600° C.) of an impurity for several hours (2 to 3 hours).

By doing so, activation of the impurity and recovery of crystal structure are carried out, so that a more uniform TFT can be obtained. Incidentally, at the same time as the activation of the impurity and the recovery of the crystal structure, second gettering is carried out.

Thereafter, similarly to the embodiment 1, an interlayer insulating film, a source electrode, and a drain electrode are formed, and finally, a hydrogenating step is carried out so that a TFT is completed.

The structure of this embodiment can be used for the structure of the embodiment 2.

The structure may be modified such that the gate insulating film is made to remain on the whole surface of the active layer, a source region and a drain region are formed, and a heat treatment is carried out.

[Embodiment 17]

Figure 23:
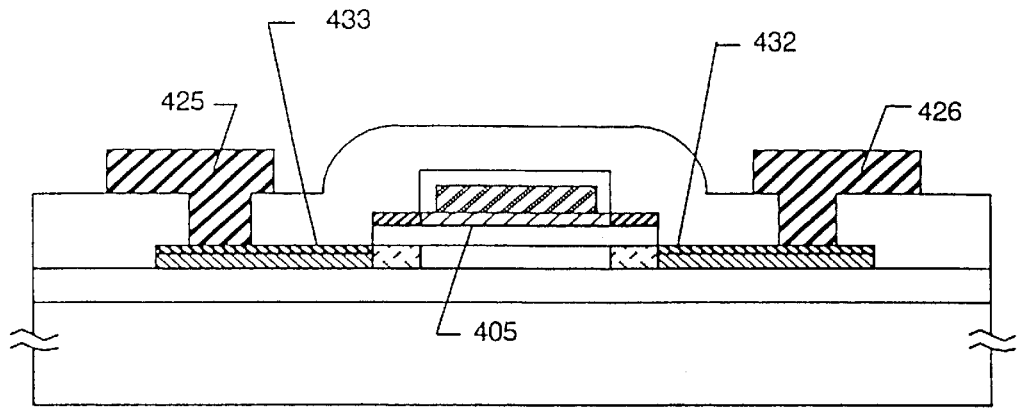
FIG. 23 is a view showing a manufacturing step of a TFT in embodiment 17.

In this embodiment, an example in which a silicide layer is formed after a step of forming a wiring line of the two-layer gate electrode structure (aluminum material layer/tantalum layer) shown in the above respective embodiments, a step of carrying out doping of phosphorus, and a step (typically, FIG. 6A) of applying a heat treatment, is shown in FIG. 23. The manufacturing method will be described below in brief.

First, similarly to the foregoing respective embodiment, a source region and a drain region are obtained. Next, a metal film, which reacts with silicon to make silicide, is formed. As the metal film, it is satisfactory if the metal film makes a silicide reaction at a heat temperature of about 500 to 600° C., and for example, any one kind of metal film selected from Ta, Cr, Mn, Nb, Mo, and Ti may be used. The metal film is in contact with only the source region and the drain region in the active layer.

By a heat treatment (450 to 700° C.), silicon reacts with the metal film which is in contact with silicon, so that silicide layers 432 and 433 are formed. Incidentally, all the source region and the drain region may be made silicide.

Thereafter, an non-reacted metal film is removed by etching. At this time, a gate insulating film is protected by an anodic oxidation film. As the heat treatment, it is appropriate that heating in an electric furnace or RTA using an infrared lamp is used. In this embodiment, since the silicide layer is provided, the sheet resistance of the source region and the drain region can be lowered.

Thereafter, similarly to the above-mentioned embodiments, an interlayer insulating film, a source electrode, and a drain electrode are formed, and finally, a hydrogenating step is carried out so that a TFT is completed.

The structure may be modified such that immediately after the doping of phosphorus, a metal film is formed, and a heat treatment at a temperature of 450° C. to 700° C. is added. In this case, it is possible to carry out gettering of phosphorus and making silicide at the same time, so that steps can be shortened.

[Embodiment 18]

In this embodiment, a method in which a contact to a lead wiring line is formed after a step of forming a wiring line of the two-layer gate electrode structure (aluminum material layer/tantalum layer) shown in the above respective embodiments, a step of carrying out doping of phosphorus, and a step of carrying out a heat treatment, will be illustrated.

In the conventional gate electrode structure (aluminum material single layer), in order to remove a nonporous alumina layer, an acid (here, called chromium mixed acid), which is obtained by mixing an aluminum mixed acid (acid in which phosphoric acid, acetic acid, nitric acid, and water are mixed in the ratio of 85:5:5:5 in vol %) with a chromic acid solution, is used. In the case where the chromium mixed acid is used, a selecting ratio against a silicon oxide film constituting an under film can not be secured, so that the under film is also etched. Incidentally, the chromium mixed acid is an acid obtained by mixing the foregoing aluminum mixed acid of 10 liters with the chromic acid solution (mixed solution of chromic acid of 300 g and water of 150 g) of 550 g.

Figure 24:
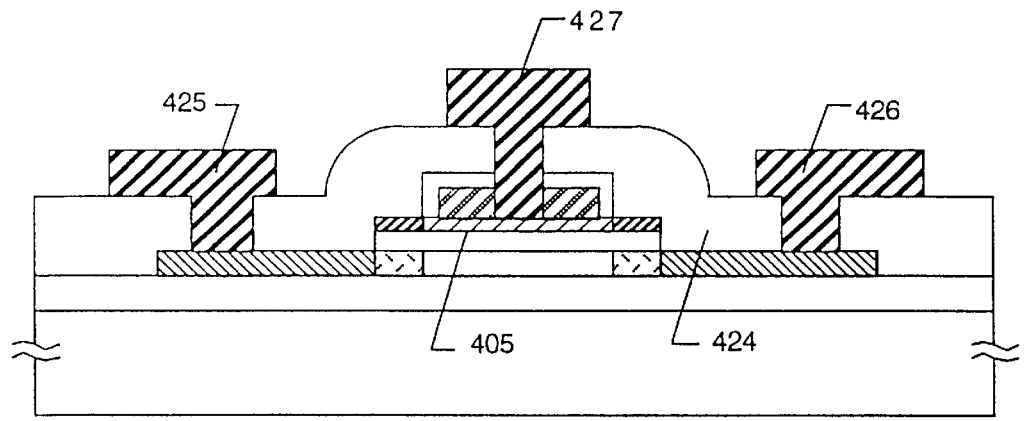
FIG. 24 is a view showing a manufacturing step of a TFT in embodiment 18.

In this embodiment, the two-gate electrode structure as shown in FIG. 24 is made, so that a tantalum layer 405 is used as an etching stopper, and a contact hole is formed. Then a lead wiring line 427 is formed, and it is possible to make excellent contact with the tantalum layer exposed on the bottom of the contact hole. In FIG. 24, although an example in which the contact hole is formed over an active layer, the contact hole is not particularly limited as long as the contact is made between the two-layer structure gate wiring line and the lead wiring line.

[Embodiment 19]

This embodiment will be described with reference to FIG. 25. In this embodiment, in the TFT of the embodiment 6, a method of connecting a two-layer gate electrode wiring line made of a metal layer (tantalum layer 710) and an aluminum layer 720 with another wiring line will be described. Incidentally, the TFT sown in FIG. 25 has the same structure as that in FIG. 11A, and reference characters are omitted.

In the conventional gate electrode structure of an aluminum single layer, since a nonporous alumina layer is removed by using an acid (here, called chromium mixed acid) obtained by mixing an aluminum mixed acid (acid in which phosphoric acid, acetic acid, nitric acid, and water are mixed at the ratio of 85:5:5:5 in vol %) with a chromic acid solution. In the case where the chromium mixed acid is used, a selecting ratio against a silicon oxide film constituting a gate insulating film or an under film can not be secured, so that the gate insulating film or the under film is also etched. Incidentally, the chromium mixed acid is an acid obtained by mixing the foregoing aluminum mixed acid of 10 liters with the chromic acid solution (mixed solution of chromic acid of 350 g and water of 150 g) of 550 g.

Figure 25:
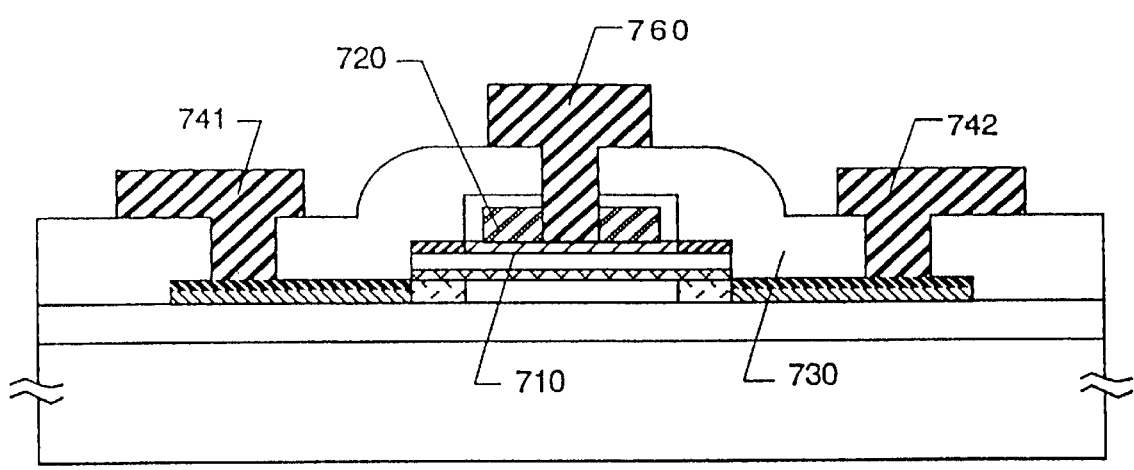
FIG. 25 is a sectional structural view of a TFT in embodiment 19.

In this embodiment, as shown in FIG. 25, tantalum having a selecting ratio against the chromium mixed acid is formed in the under layer of the gate electrode/wiring line, so that the tantalum layer 710 functions as an etching stopper, and electrical connection with a lead wiring line 760 can also be made. In FIG. 25, although the connection with the lead wiring line 760 is made at the gate electrode portion where the gate wiring line crosses with an active layer, the contact between the gate wiring line and the lead wiring line 760 may be made at another portion.

[Embodiment 20]

This embodiment will be described with reference to FIGS. 26A to 26E. This embodiment is a modified example of the embodiment 6, and an example in which contact pads are provided on the connection portions between source/drain regions and source/drain electrodes, will be described.

As described in the embodiment 8, for the purpose of obtaining a flat surface, an interlayer insulating film of a pixel TFT is made as relatively thick as 800 nm to 1 $\mu$m. In the present invention, since the surfaces of the source/drain regions are made silicide, or all of the source/drain regions are made silicide, there occurs a problem in the formation of contact holes in the foregoing thick interlayer insulating film for the purpose of making connection with the source/drain electrodes.

In the case where wet etching by hydrofluoric acid is carried out in order to form the contact holes, a titanium siticide layer is etched. In the case where dry etching with a fluorine-based gas is used, since a selecting ratio against a silicon oxide film or a silicon nitride film used as an under film or a gate insulating film can not be secured, if the interlayer insulating film is thick, the etching takes a long time, so that there is a fear that the under film or the gate insulating film is etched.

Figure 26A:
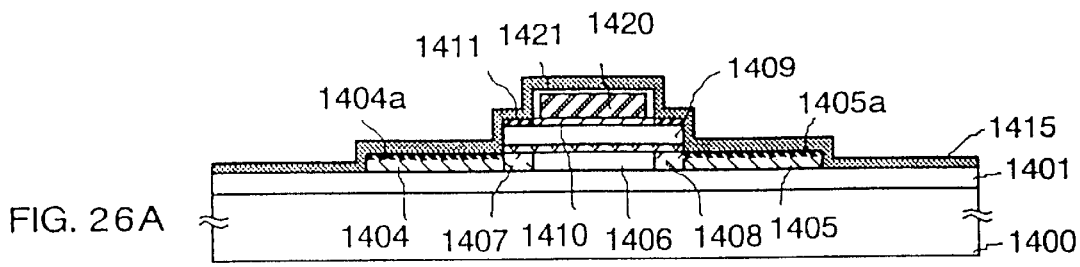
FIGS. 26A to 26E are views showing manufacturing steps of a TFT in embodiment 20.

This embodiment solves the above-described problem. Steps of forming a contact hole will be described below with reference to FIGS. 14D and 26A to 26E. First, in accordance with the manufacturing method described in the embodiment 6, the state shown in FIG. 14D is obtained. FIG. 26A corresponds to FIG. 14D, reference numeral 1400 denotes a substrate, and 1401 denotes an under film. In an active layer made of polycrystalline silicon, a source region 1404, a drain region 1405, a channel formation region 1406, and high resistance regions 1407 and 1408 are formed in a self-aligning manner. In the source/drain regions 1404 and 1405, silicide layers 1404a and 1405a are formed by a reaction with a titanium film 1415. Reference numeral 1409 denotes a gate insulating film made of a thermal oxidation film and a deposited insulating film. The gate electrode includes a conductive layer made of a tantalum layer 1410 and an aluminum layer 1420, and is coated with a tantalum oxide layer 1411 and an alumina layer 1421 which are anodic oxides of the conductive film.

Figure 26B:
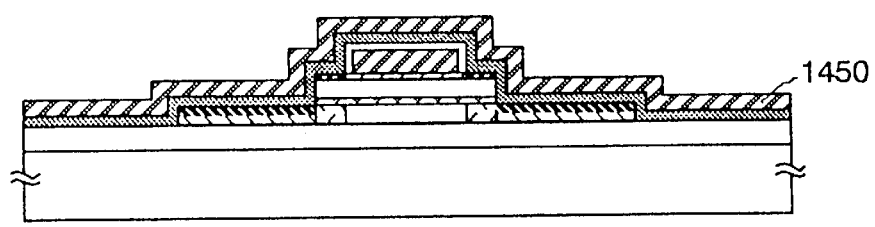

In this embodiment, after the surfaces of the source/drain regions 1404 and 1405 are made silicide, an aluminum film 1450 with a thickness of 600 to 1000 nm is formed by a sputtering method while an non-reacted titanium film 1415 is made to remain (FIG. 26B).

Figure 26C:
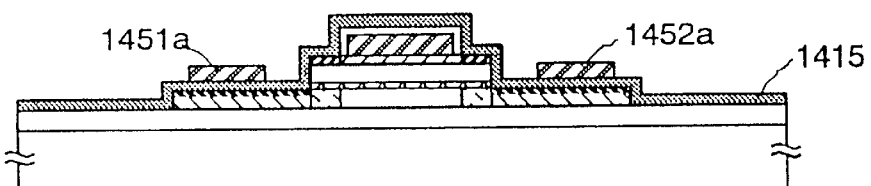

Next, only the aluminum film 1450 is patterned to form aluminum layers 1451a and 1452a constituting contact pads 1451 and 1452 against the source/drain electrodes. For the patterning, in order to take an etching selecting ratio against the titanium film 1415, wet etching using aluminum mixed acid explained in the embodiment 6 is used (FIG. 26C).

Figure 26D:
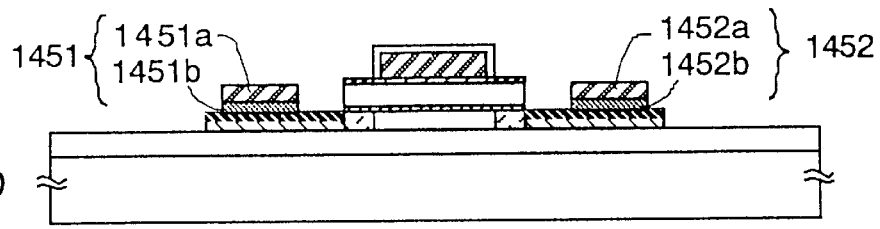

Next, the titanium film 1415 is patterned by using the aluminum layers 1451a and 1452a to form titanium layers 1451b and 1452b constituting the contact pads 1451 and 1452. For the patterning, an etchant obtained by mixing a hydrogen peroxide solution and an ammonia solution is used, and only the titanium film 1415 is selectively patterned. Through the above steps, the contact pads 1451 and 1452 constituted by lamination conductive films of the aluminum layers 1451a, 1452a and the titanium layers 1451b, 1452b are formed (FIG. 26D).

Figure 26E:
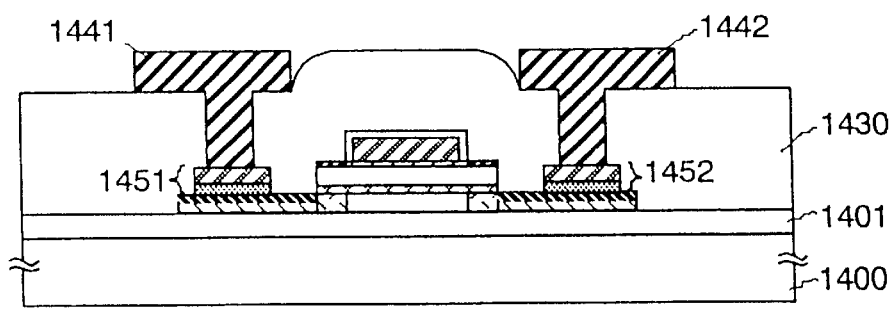

Next, an interlayer insulating film 1430 is formed. Here, by using a TEOS gas and an oxygen gas as a raw material gas, and by a plasma CVD method, a silicon oxide film with a thickness of 900 nm is formed. Then contact holes of the source/drain electrodes are formed in the interlayer insulating film 1430. Here, wet etching by hydrofluoric acid is carried out. In this embodiment, since the contact pads 1451 and 1452 formed on the opening portions of the contact holes function as etching stoppers, it is possible to prevent the silicide layers 1404a and 1405a from being etched. A lamination film made of titanium/aluminum/titanium is continuously formed by a sputtering method, and is patterned to form a source electrode 1441 and a drain electrode 1442 (FIG. 26E).

In this embodiment, since the non-reacted titanium films remaining in the silicide step are formed into the contact pads 1451 and 1452, it is possible to prevent the silicide layers 1404a and 1405a from being etched at the formation of the contact holes. Moreover, the aluminum layers 1451a and 1452a, which has resistance lower than titanium, are formed at the connection portions between the contact pads 1451, 1452 and the source/drain electrodes, so that the connection resistance against the source/drain electrodes can be lowered.

[Embodiment 21]

Figure 27:
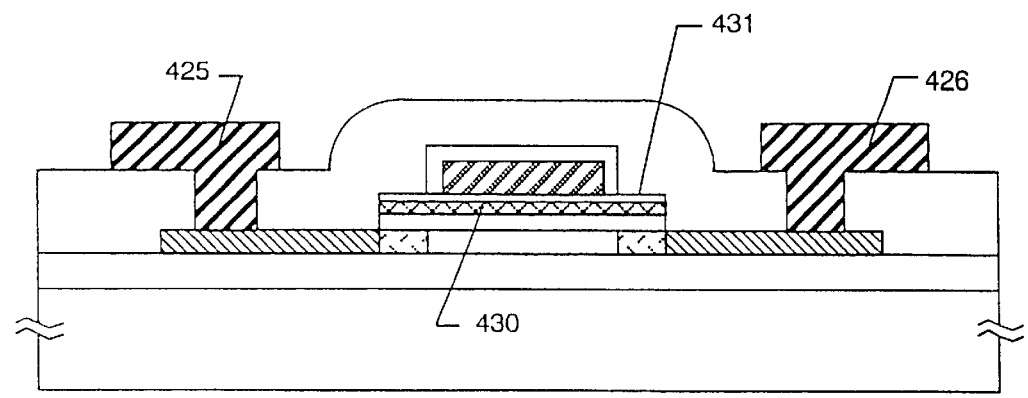
FIG. 27 is a view showing a manufacturing step of a TFT in embodiment 21.

In the foregoing respective embodiments, at the gate electrode, although the tantalum layer 810 provided as the lower layer is used as the blocking layer of the aluminum layer 820 having low heat resistance, instead of forming the tantalum layer 811, a silicon nitride film having a high blocking effect may be formed as the gate insulating film. FIG. 27 shows the structure of this embodiment. In this case, since stress is easily generated at the interface between a silicon nitride film and an aluminum layer, it is appropriate that a silicon nitride oxide film 431 is formed at the interface between the silicon nitride film 430 and the aluminum layer.

In this embodiment, in the case where the gate insulating film is formed (see FIG. 13A), as the deposited insulating film, a lamination film made of a silicon nitride film 430 with a thickness of 5 to 30 nm and a silicon nitride oxide film 431 with a thickness of 1 to 10 nm is continuously formed by a plasma CVD method, and it is appropriate that an active layer is thermally oxidized so that a thermal oxidation film is formed at the interface between the active layer and the silicon nitride film. Incidentally, in the case where the thermal oxidation step can not be carried out because of heat resistance of the substrate, it is appropriate that a silicon oxide film, a silicon nitride film, and a silicon nitride oxide film are continuously formed by a plasma CVD method.

After the lamination film is obtained, similarly to the foregoing respective embodiments, an interlayer insulating film, a source electrode, and a drain electrode are formed, and a hydrogenating step is finally carried out, so that a TFT is completed.

[Embodiment 22]

Figure 28A:
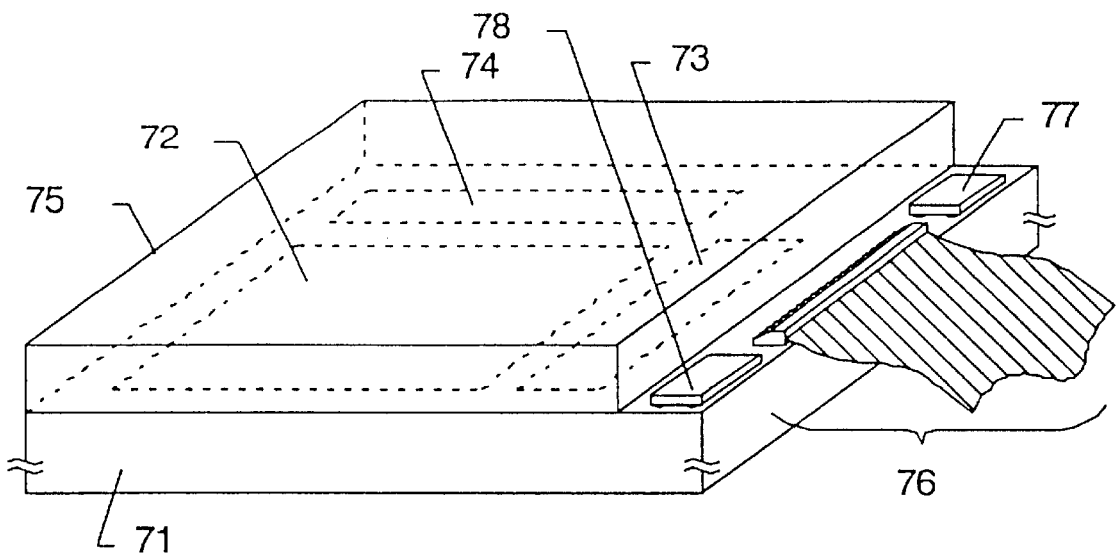
FIGS. 28A and 28B are view showing the structure of an AMLCD.

In this embodiment, an example in which an AMLCD is formed by using an active matrix substrate (component formation side substrate) including the structure shown in the foregoing embodiments, will be described. FIG. 28A shows the outer appearance of the AMLCD of this embodiment.

In FIG. 28A, reference numeral 71 denotes an active matrix substrate, and a pixel matrix circuit 72, a source side driving circuit 73, and a gate side driving circuit 74 are formed. It is preferable that the driving circuit is constituted by a CMOS circuit in which an N-type TFT and a P-type TFT are complementarily combined. Reference numeral 75 denotes an opposite substrate.

In the AMLCD shown in FIG. 28A, the active matrix substrate 71 and the opposite substrate 75 are bonded to each other in such a manner that the end faces of the substrates are flush with each other. However, only one portion of the opposite substrate 75 is removed and an FPC (Flexible Print Circuit) 76 is connected to the exposed active matrix substrate. An external signal is transmitted to the inside of the circuit by this FPC 76.

IC chips 77 and 78 are attached by using the surface to which the FPC 76 is attached. These IC chips are constituted by forming various circuits, such as a processing circuit of video signals, a timing pulse generating circuit, a γ correction circuit, a memory circuit, and an arithmetic circuit, on a silicon substrate. In FIG. 28A, although two IC chips are attached, only one chip may be attached or plural chips may be attached.

Figure 28B:
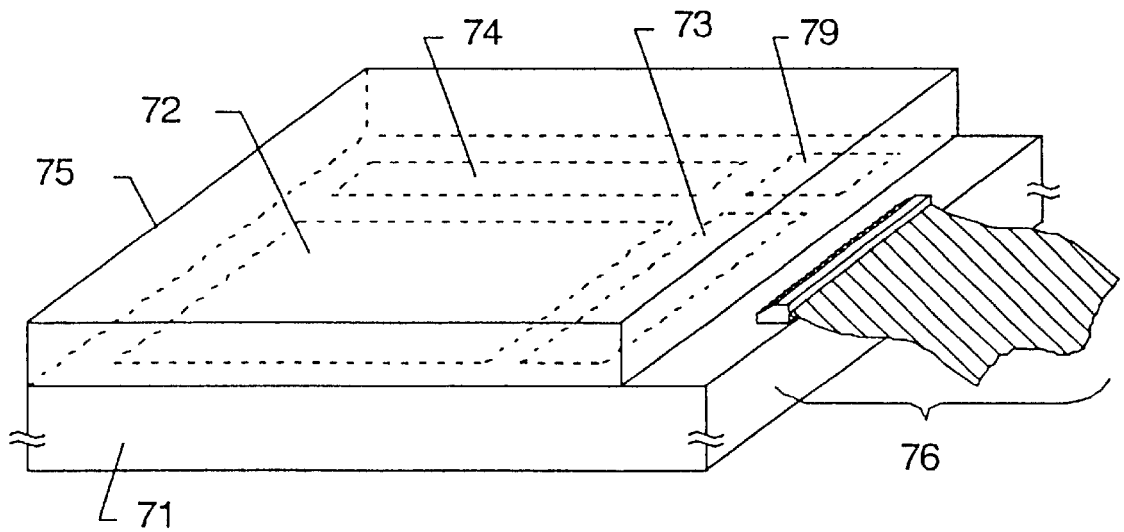

Moreover, the structure as shown in FIG. 28B may be adopted. In FIG. 28B, same parts as those of FIG. 28A are designated by the same reference characters. Here, an example in which signal processing performed by the IC chips in FIG. 28A is carried out by a logic circuit 79 formed by TFTs on the same substrate, is illustrated. In this case, the logic circuit 79 is also constituted by a CMOS circuit as a basic circuit similarly to the driving circuits 73 and 74.

Although the AMLCD of this embodiment adopts such a structure that a black mask is provided on the active matrix substrate (BM on TFT), it is also possible to make such a structure that a black mask is provided on the opposite side in addition to the active matrix substrate.

Color display may be made by using a color filter, or a structure without using a color filter may be adopted by driving a liquid crystal through an ECB (Electric field Control Birefringence) mode, a GH (Guest Host) mode, or the like.

It is also possible to adopt a structure of using a microlens array like a technique disclosed in Japanese Patent Unexamined Publication No. Hei. 8-15686. An entire disclosure of No. Hei. 8-15686 is incorporated herein by reference.

[Embodiment 23]

The structure of the present invention can be applied to various electro-optical devices or semiconductor circuits other than the AMLCD.

As the electro-optical devices other than the AMLCD, an EL (Electroluminescence) display device, an image sensor, and the like can be enumerated.

As the semiconductor circuits, an arithmetic processing circuit such as a microprocessor constituted by an IC chip, and a high frequency module (MMIC, etc.) which processes input/output signals of a portable equipment can be enumerated.

Like this, the present invention can be applied to any semiconductor device functioning with a circuit constituted by insulated gate TFT or transistors.

[Embodiment 24]

The AMLCD shown in the embodiment 22 can be used as a display for various electronic equipments. Incidentally, the electronic equipment in this embodiment is defined as an active matrix type liquid crystal display device or a product incorporating a semiconductor circuit or a display device.

As such electronic equipments, a video camera, a still camera, a projector, a projection TV, a head mount display, a car navigation system, a personal computer (including a note-sized computer), a portable information terminal (mobile computer, portable telephone, etc.) and the like are enumerated. An example of those equipments will be shown in FIGS. 29A to 29F.

Figure 29A:
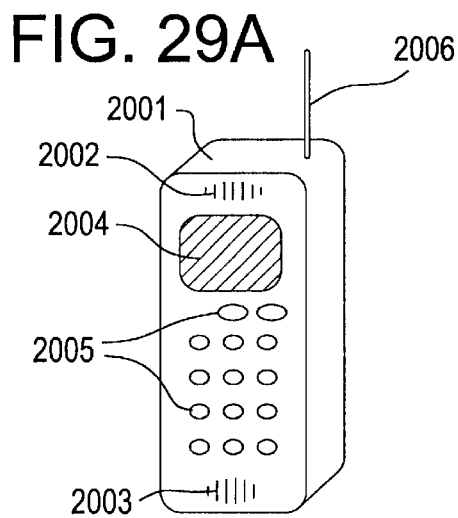
FIGS. 29A to 29F are views showing structures of electronic equipments.

FIG. 29A shows a portable telephone which is constituted by a main body 2001, an audio output portion 2002, an audio input portion 2003, a display device 2004, an operation switch 2005, and an antenna 2006. The present invention can be applied to the audio output portion 2002, the audio input portion 2003, the display device 2004, and the like.

Figure 29B:
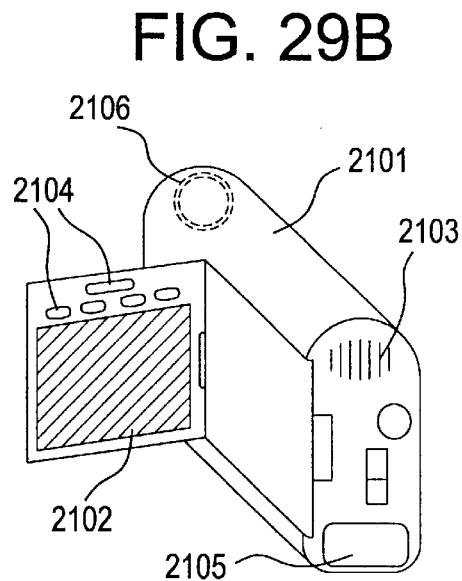

FIG. 29B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and the image receiving portion 2106.

Figure 29C:
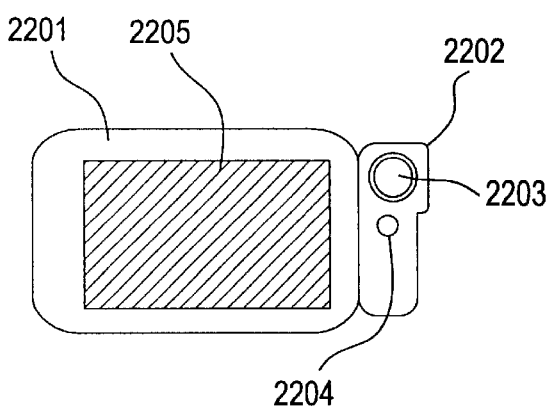

FIG. 29C shows a mobile computer which is constituted by a main body 2201, a camera portion 2202, an image receiving portion 2203, an operation switch 2204, and a display device 2205. The present invention can be applied to the image receiving portion 2203, the display device 2205, and the like.

Figure 29D:
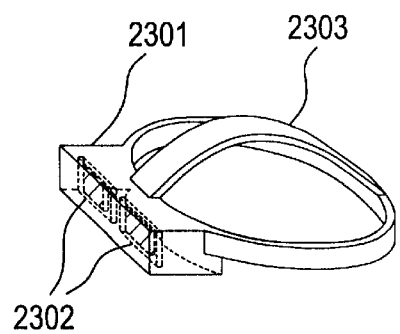

FIG. 29D shows a head mount display which is constituted by a main body 2301, a display device 2302, and a band portion 2303. The present invention can be applied to the display device 2302.

Figure 29E:
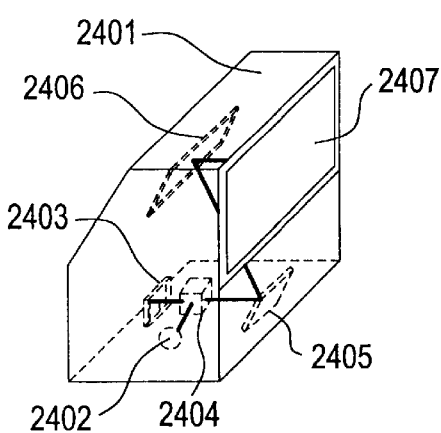

FIG. 29E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 29F:
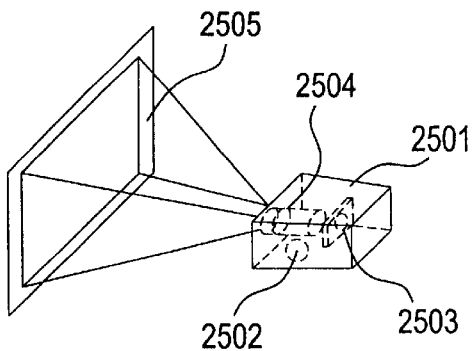
Figure 30:
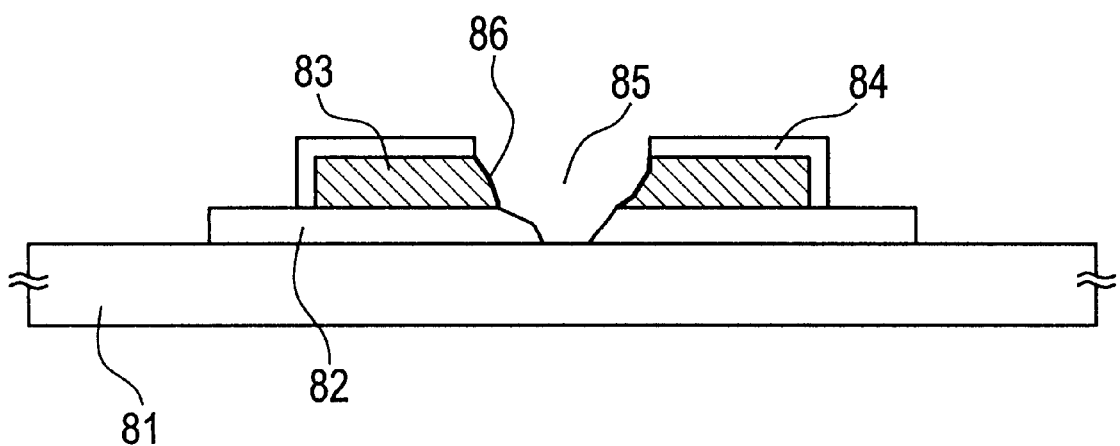
FIG. 30 is a view showing the state of poor contact.

FIG. 29F shows a front type projector which is constituted by a main body 2501, a light source 2502, a display device 2503, an optical system 2504, and a screen 2505. The present invention can be applied to the display device 2503.

As described above, the scope of application of the present invention is very wide, and the present invention can be applied to electronic equipments of any field. Moreover, the present invention can also be effectively applied to a video-billboard, a display for promo, and the like.

[Embodiment 25]

The structure of the present invention can be applied to an electro-optical device, such as an active matrix type liquid crystal display device in which a pixel matrix circuit and a driver circuit are integrally formed on a substrate having an insulating surface, an EL (Electroluminescence) display device, and an image sensor.

Particularly, a driver circuit often has such a structure that a drain wiring line of a TFT is connected to a gate wiring line of another TFT, so that the number of contact portions where the gate wiring lines are connected to lead wiring lines becomes very large.

The present invention is a technique suitable for such a portion, and excellent ohmic contact can be realized by a simple step, and further, improvements in the manufacturing cost, in the manufacturing yield, and in the reliability can be achieved.

Incidentally, since the electro-optical device shown in this embodiment functions by means of TFTs, it is assumed that the electro-optical device is included in the category of a semiconductor device.

[Embodiment 26]

The present invention can be applied to not only a display device as shown in the embodiment 25 but also a thin film integrated circuit (or a semiconductor circuit) in which functional circuits are integrated. For example, the present invention may be applied to an arithmetic circuit of a microprocessor, etc., or a high frequency circuit (MMIC: Microwave Module IC) for a portable equipment, and the like.

Moreover, even in the case where TFTs and MOSFETs are combined to constitute a three-dimensional structure semiconductor circuit, and a VLSI circuit integrated at an extremely high density is constituted, the contact structure of the present invention is very effective.

Incidentally, since the thin film integrated circuit as shown in this embodiment is constituted by TFTs, it is assumed that the circuit is included in the category of a semiconductor device.

By using the present invention, even in a TFT in which aluminum or a material containing aluminum as its main ingredient is used for a gate electrode, defects such as a short circuit occurring between the gate electrode and an active layer can be prevented. Thus, since it becomes possible to use a step of making silicide, the resistance of the gate electrode can be lowered, and the sheet resistance of the source/drain regions can be lowered. Particularly, diffusion of aluminum atoms from the gate electrode is prevented and lowering of the TFT characteristics is suppressed.

Moreover, since an LDD region or an offset region can be formed without giving superfluous damage to a gate insulating film, long term reliability of a TFT is also improved.

Moreover, it is possible to obtain a manufacturing method of a TFT in which after a wiring line using aluminum material is formed, a heat treatment at a temperature (about 600° C.), which is high so that sufficient gettering can be made, is carried out, and a material in a crystalline silicon film can be gettered without receiving the restriction of a processing time. At the same time, it is possible to activate a dopant and to repair damage of crystal structure. The uniformity of characteristics of a component is improved by this heat treatment.

Moreover, since nickel elements are fixed in a source region and a drain region which has no influence on the operation of the TFT, high characteristics can be stably obtained. Even in the case where a number of TFTs are manufactured at the same time, it is possible to reduce the dispersion of characteristics.

Moreover, by practicing the present invention, when a contact hole is formed in an aluminum film protected by an alumina film, it becomes unnecessary to use an etchant containing heavy metal chromium. Thus, it is possible to make a safe manufacturing process in industry.

Moreover, since the above contact hole is formed by using buffered hydrofluoric acid, which can be easily obtained and is easily managed, as an etchant, the present invention is very useful from the economical viewpoint as well.

Moreover, since there is an etching stopper at the formation of the contact hole, it is possible to prevent poor contact or the like due to overetching.

In a heat treatment (typically 450 to 700° C.) after doping in the structure of the present invention, 1) a gettering process to lower a material concentration in a channel formation region and a high resistance region,
2) an activation process of impurities in the source and drain regions, and
3) an annealing process to repair damage of crystal structure generated at ion implantation are simultaneously carried out.

As a result, it is possible to obtain effects, such as great simplification of steps, improvement in withstand voltage and leak current characteristics, improvement in reliability, and lowering of dispersion of each component.

Like this, according to the present invention, TFTs with high reliability can be manufactured at a high yield factor, and it is possible to improve a yield factor of electro-optical devices functioning with semiconductor circuits constituted by such TFTs, and electronic equipments incorporating such semiconductor circuits or electro-optical devices.

What is claimed is:

1. A semiconductor device comprising a plurality of TFTs formed on a substrate, each of said TFTs comprising:
    an active layer comprising at least a channel forming region, and source and drain regions;
    a gate insulating film adjacent to said active layer; and
    a gate electrode comprising a lamination of a tantalum layer and a conductive layer comprising aluminum or aluminum as its main ingredient,
    wherein a tantalum oxide layer adjacent to the tantalum layer is formed adjacent to the gate insulating film and an end portion of said tantalum oxide layer is aligned with an end portion of said gate insulating film.

2. A device according to claim 1, wherein the tantalum layer has a thickness of 5 to 200 nm.

3. A semiconductor device comprising a plurality of TFTs formed on a substrate, each of said TFTs comprising:
    an active layer comprising at least a channel forming region, and source and drain regions;
    a gate insulating film adjacent to said active layer; and
    a gate electrode comprising a lamination of a tantalum layer and a conductive layer comprising aluminum or aluminum as its main ingredient,
    wherein a tantalum oxide layer is adjacent to the tantalum layer at a region where the tantalum layer does not overlap with the conductive layer comprising aluminum or aluminum as its main ingredient.

4. A semiconductor device comprising a plurality of TFTs formed on a substrate, each of said TFTs comprising:
    an active layer comprising at least a channel forming region, and source and drain regions;
    a gate insulating film adjacent to said active layer; and
    a gate electrode comprising a lamination of a tantalum layer and a conductive layer comprising aluminum or aluminum as its main ingredient,
    wherein an end portion of the tantalum layer protrudes outside of the conductive layer comprising aluminum or aluminum as its main ingredient, and
    wherein a tantalum oxide layer adjacent to the tantalum layer is formed adjacent to the gate insulating film and an end portion of said tantalum oxide layer is aligned with an end portion of said gate insulating film.

5. A device according to claim 3 or 4, wherein the tantalum oxide layer is a layer obtained by anodic oxidation of a part of the tantalum layer.

6. A device according to claim 3 or 4, wherein the tantalum oxide layer has a thickness 2 to 4 times that of the tantalum layer.

7. A semiconductor device comprising a plurality of TFTs formed on a substrate, each of said TFTs comprising:
    an active layer comprising at least a channel forming region, and source and drain regions;
    a gate insulating film formed on said active layer; and
    a gate electrode comprising a lamination of a tantalum layer and a conductive layer comprising aluminum or aluminum as its main ingredient,
    wherein an end portion of the tantalum layer protrudes outside of the conductive layer comprising aluminum or aluminum as its main ingredient, and
    wherein a tantalum oxide layer adjacent to the tantalum layer is formed on the gate insulating film and an end portion of said tantalum oxide layer is aligned with an end portion of said gate insulating film.

8. A device according to any one of claims 1, 3, 4, or 7, further comprising a nonporous alumina layer disposed on a surface of the conductive layer comprising aluminum or aluminum as its main ingredient.

9. A device according to any one of claims 1, 3, 4, or 7, wherein the active layer further comprises an LDD region, and the tantalum oxide layer is located over the LDD region.

10. A device according to claim 9, wherein the tantalum oxide layer has a thickness 2 to 4 times that of the tantalum layer.

11. A semiconductor device having a plurality of TFTs formed on a substrate, each of the TFTs comprising:
    an active layer comprising at least a channel forming region, and source and drain regions;
    a gate insulating film adjacent to said active layer; and
    a gate electrode comprising a lamination of a valve metal layer and a conductive layer,
    wherein an oxide layer of the valve metal layer is adjacent to said gate insulating film and end portion of said oxide layer of the valve metal layer is aligned with an end portion of the gate insulating film.

12. A device according to claim 11, wherein the valve metal layer has a thickness of 5 to 200 nm.

13. A device according to claim 11, wherein the valve metal layer is selected from the group consisting of Ta, Nb, Hf, Ti, Cr, alloys of those metal elements, and an alloy of Mo and Ta.

14. A semiconductor device having a plurality of TFTs formed on the same substrate, each of the TFTs comprising:

an active layer comprising at least a channel forming region, and source and drain regions;

a gate insulating film adjacent to said active layer; and a gate electrode comprising a lamination of a valve metal layer and a conductive layer, wherein an oxide layer of the valve metal layer is located at a region where the valve metal layer does not overlap with the conductive layer, and wherein end portion of said oxide layer of the valve metal layer is aligned with an end portion of the gate insulating film.

15. A device according to claim 14, wherein the valve metal is selected from the group consisting of Ta, Nb, Hf, Ti, Cr, alloys of those metal elements, and an alloy of Mo and Ta.

16. A device according to claim 14, wherein the oxide layer of the valve metal layer is a layer obtained by anodic oxidation of a part of the valve metal layer.

17. A device according to claim 14, wherein the oxide layer of the valve metal layer has a thickness 2 to 4 times that of the valve metal layer.

18. A device according to claim 14, further comprising an oxide layer of the conductive layer located on a surface of the conductive layer.

19. A device according to claim 14, wherein the active layer further comprises an LDD region, and the oxide layer of the valve metal layer is located over the LDD region.

20. A semiconductor device having a plurality of TFTs formed on a substrate, each of the TFTs comprising:

an active layer comprising at least a channel forming region, and source and drain regions;

a gate insulating film adjacent to said active layer; and a gate electrode comprising a lamination of a valve metal layer and a conductive layer comprising aluminum or aluminum as its main ingredient, wherein an end portion of the valve metal layer protrudes outside of the conductive layer comprising aluminum or aluminum as its main ingredient, and an oxide layer of the valve metal layer is formed adjacent to said gate insulating film, and wherein end portion of said oxide layer of the valve metal layer is aligned with an end portion of the gate insulating film.

21. A device according to claim 20, wherein the valve metal layer is selected from the group consisting of Ta, Nb, Hf, Ti, Cr, alloys of those metal elements, and an alloy of Mo and Ta.

22. A device according to claim 20, wherein the oxide layer of the valve metal layer is a layer obtained by anodic oxidation of a part of the valve metal layer.

23. A device according to claim 20, wherein the oxide layer of the valve metal layer has a thickness 2 to 4 times that of the valve metal layer.

24. A device according to claim 20, further comprising a nonporous alumina layer disposed on a surface of the conductive layer comprising aluminum or aluminum as its main ingredient.

25. A device according to claim 20, wherein the active layer further comprises an LDD region, and the oxide layer of the valve metal layer is located over the LDD region.

26. A semiconductor device having a plurality of TFTs formed on a substrate, each of the TFTs comprising:

an active layer comprising at least a channel forming region, and source and drain regions;

a gate insulating film formed on said active layer; and a gate electrode comprising a lamination of a valve metal layer and a conductive layer, wherein an end portion of the valve metal layer protrudes outside of the conductive layer, and wherein an oxide layer of the valve metal layer is located on said gate electrode; and wherein end portion of said oxide layer of the valve metal layer is aligned with an end portion of the gate insulating film.

27. A device according to claim 26, wherein the valve metal layer is selected from the group consisting of Ta, Nb, Hf, Ti, Cr, alloys of those metal elements, and an alloy of Mo and Ta.

28. A device according to claim 26, further comprising an oxide layer of the conductive layer located on a surface of the conductive layer.

29. A device according to claim 26, wherein the active layer further comprises an LDD region, and the oxide layer of the valve metal layer is located over the LDD region.

30. A device according to claim 26, wherein the oxide layer of the valve metal layer has a thickness 2 to 4 times that of the valve metal layer.

31. A device according to claim 1, wherein the tantalum layer has an enough thickness to function as a blocking layer which prevents a constituent element of the conductive layer comprising aluminum or aluminum as its main ingredient from intruding into the gate insulating film.

32. A device according to claim 11, wherein the conductive layer comprises aluminum.

33. A device according to claim 14, wherein the conductive layer comprises aluminum.

34. A device according to claim 26, wherein the conductive layer comprises aluminum.

* * * * *